(12) United States Patent
Wada et al.

(10) Patent No.: US 8,759,162 B2
(45) Date of Patent: Jun. 24, 2014

(54) NONVOLATILE SEMICONDUCTOR MEMORY DEVICE AND METHOD OF MANUFACTURING THE SAME

(75) Inventors: Makoto Wada, Yokohama (JP);
Kazuyuki Higashi, Yokohama (JP);
Naofumi Nakamura, Setagaya-ku (JP);
Tsuneo Uenaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 547 days.

(21) Appl. No.: 13/172,330

(22) Filed: Jun. 29, 2011

(65) Prior Publication Data

US 2011/0256672 A1 Oct. 20, 2011

Related U.S. Application Data

(62) Division of application No. 12/615,598, filed on Nov. 10, 2009, now Pat. No. 7,989,880.

(30) Foreign Application Priority Data

Feb. 25, 2009 (JP) ................................. 2009-042748

(51) Int. Cl.
*H01L 21/8239* (2006.01)
(52) U.S. Cl.
USPC ........... 438/128; 438/257; 438/270; 438/287; 438/584

(58) Field of Classification Search
USPC .......................... 438/128, 257, 270, 287, 584
See application file for complete search history.

(56) References Cited

FOREIGN PATENT DOCUMENTS

JP 2007-266143 10/2007

OTHER PUBLICATIONS

Japanese Office Action issued Mar. 26, 2013 in Patent Application No. 2009-042748 with English Translation.

*Primary Examiner* — Long Pham
(74) *Attorney, Agent, or Firm* — Oblon, Spivak, McClelland, Maier & Neustadt, L.L.P.

(57) ABSTRACT

A nonvolatile semiconductor memory device comprises a memory string, and a wiring. The memory string comprises a semiconductor layer, a charge storage layer, and a plurality of first conductive layers. The plurality of first conductive layers comprises a stepped portion formed in a stepped shape such that positions of ends of the plurality of first conductive layers differ from one another. The wiring comprises a plurality of second conductive layers extending upwardly from an upper surface of the first conductive layers comprising the stepped portion. The plurality of second conductive layers are formed such that upper ends thereof are aligned with a surface parallel to the substrate, and such that a diameter thereof decreases from the upper end thereof to a lower end thereof. The plurality of second conductive layers are formed such that the greater a length thereof in the perpendicular direction, the larger a diameter of the upper end thereof.

7 Claims, 43 Drawing Sheets

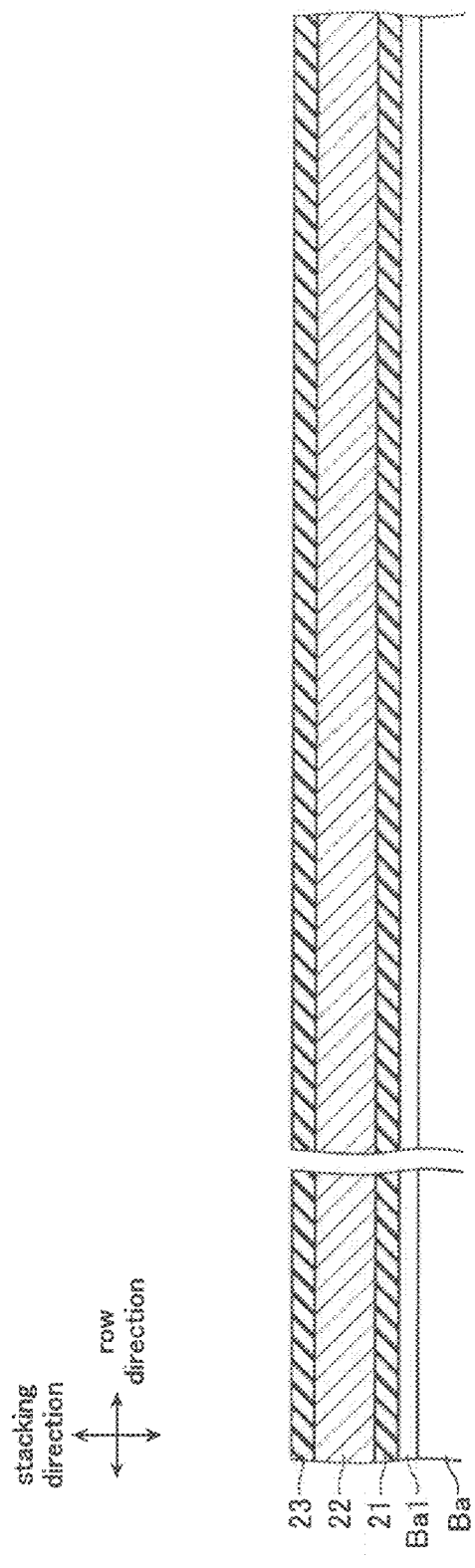

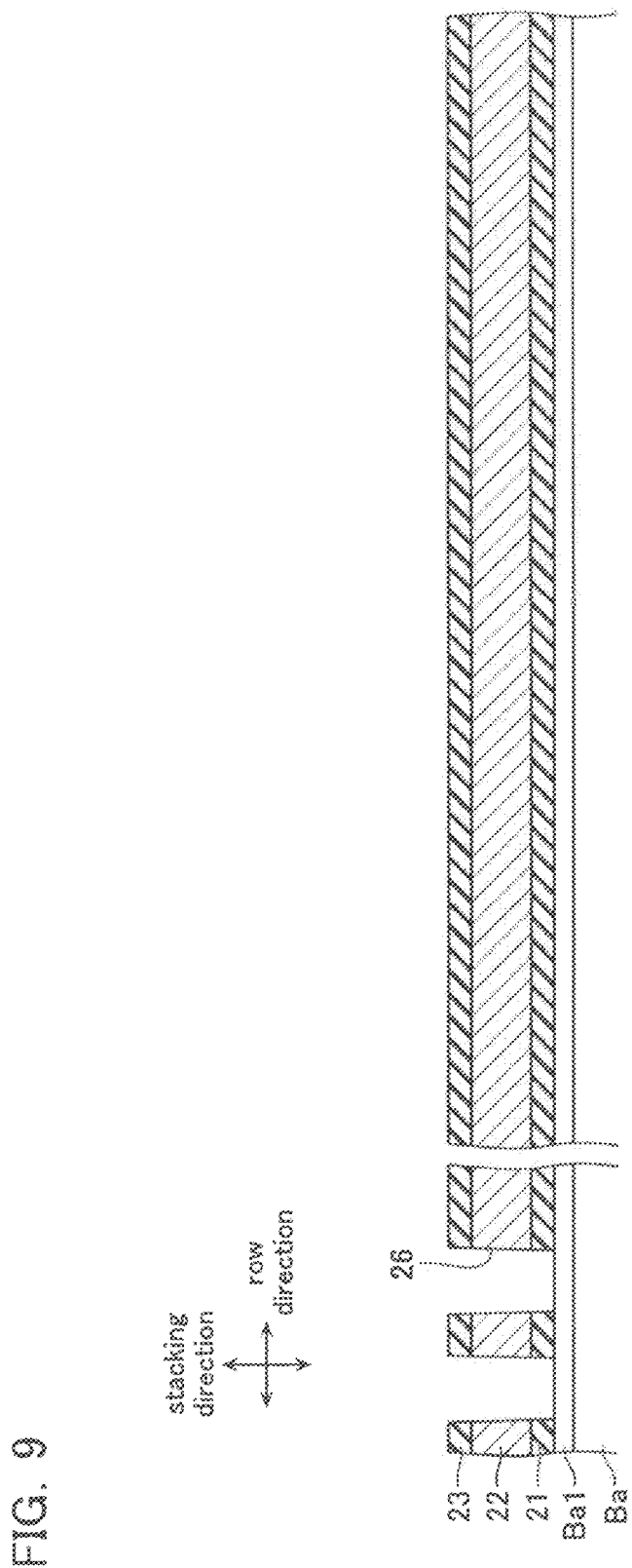

NONVOLATILE SEMICONDUCTOR MEMORY DEVICE AND METHOD OF MANUFACTURING THE SAME

CROSS REFERENCE TO RELATED APPLICATIONS

This application is a divisional of U.S. application Ser. No. 12/615,598 filed Nov. 10, 2009, and is based upon and claims the benefit of priority from prior Japanese Patent Application No. 2009-42748, filed on Feb. 25, 2009, the entire contents of each of which are incorporated herein by reference.

BACKGROUND

In recent years, there are proposed many semiconductor memory devices in which memory cells are disposed three-dimensionally in order to increase a degree of integration of memory.

One conventional semiconductor memory device in which memory cells are disposed three-dimensionally uses a transistor with a cylindrical column type structure (refer to J.P. 2007-266143). The semiconductor memory device using the transistor with a cylindrical column type structure is provided with a stacked conductive layer stacked in multiple layers and configured to form a gate electrode, and a pillar-shaped columnar semiconductor. The columnar semiconductor functions as a channel (body) portion of the transistor. A vicinity of the columnar semiconductor is provided with a memory gate insulating layer capable of storing a charge. A configuration including these stacked conductive layers, the columnar semiconductor, and the memory gate insulating layer is called a memory string.

To achieve conduction with a peripheral circuit in a semiconductor memory device having the above-described memory string, a contact plug is formed extending in a stacking direction (direction perpendicular to a substrate) from the stacked conductive layer. Generally, the contact plug is formed by the following process. That is, first, an interlayer insulating layer is formed so as to cover the stacked conductive layer. Subsequently, the interlayer insulating layer is penetrated so as to reach an upper surface of the respective stacked conductive layers, thereby forming a hole. Then, a conductive layer is deposited so as to fill the hole, thereby forming the contact plug.

However, the above-described manufacturing process causes the contact plug to be formed in a tapered shape in which a diameter of the contact plug becomes smaller from an upper end to a lower end thereof. Accordingly, the lower the layer in which the contact plug has its lower end, the more difficult it becomes, during manufacture, to fill the hole with the conductive layer. In addition, the lower the layer in which the contact plug has its lower end, the more difficult it becomes, during manufacture, to form the hole completely penetrating the interlayer insulating layer. Moreover, the lower the layer in which the contact plug has its lower end, the smaller becomes a contact area with the stacked conductive layer. It is difficult to manufacture a nonvolatile semiconductor memory device having a high reliability using the above-described manufacturing process.

SUMMARY

In accordance with an aspect of the present invention, a nonvolatile semiconductor memory device comprises: a memory string having a plurality of electrically rewritable memory cells connected in series; and a wiring connected to a control electrode of the memory cells, the memory string comprising: a semiconductor layer including a columnar portion extending in a perpendicular direction with respect to a substrate; a charge storage layer formed on a side surface of the columnar portion; and a plurality of first conductive layers formed on the charge storage layer, and configured to function as a control electrode of the memory cells, the plurality of first conductive layers comprising a stepped portion formed in a stepped shape such that positions of an ends of the plurality of first conductive layers differ from one another, and the wiring comprising a plurality of second conductive layers extending upwardly from an upper surface of the first conductive layers comprising the stepped portion, the plurality of second conductive layers being formed such that upper ends thereof are aligned with a surface parallel to the substrate, and such that a diameter thereof decreases from the upper end thereof to a lower end thereof, and the plurality of second conductive layers being formed such that the greater a length thereof in the perpendicular direction, the larger a diameter of the upper end thereof.

In accordance with an of the present invention, a nonvolatile semiconductor memory device comprises: a memory string having a plurality of electrically rewritable memory cells connected in series; and a wiring connected to a control electrode of the memory cells, the memory string comprising: a semiconductor layer including a columnar portion extending in a perpendicular direction with respect to a substrate; a charge storage layer formed on a side surface of the columnar portion; and a plurality of first conductive layers formed on the charge storage layer, and configured to function as a control electrode of the memory cells, the plurality of first conductive layers comprising a stepped portion formed in a stepped shape such that positions of an ends of the plurality of first conductive layers differ from one another, and the wiring comprising a plurality of second conductive layers extending upwardly from an upper surface of the first conductive layers comprising the stepped portion, the plurality of second conductive layers being formed such that an upper ends thereof are aligned with a surface parallel to the substrate, and a ratio of a height of the second conductive layer and a diameter of a lower end of the second conductive layer being constant among the plurality of second conductive layers.

In accordance with an aspect of the present invention, a method of manufacturing a nonvolatile semiconductor memory device, the nonvolatile semiconductor memory device including a plurality of memory strings each having a plurality of electrically rewritable memory cells connected in series, comprises: depositing a plurality of first conductive layers on a substrate; penetrating the plurality of first conductive layers to form a penetration hole; forming a charge storage layer on a side surface facing the penetration hole; forming a semiconductor layer so as to fill the penetration hole; configuring a stepped portion formed in a stepped shape in the plurality of first conductive layers such that a position of an end of the plurality of first conductive layers differs; and forming a plurality of second conductive layers extending upwardly from an upper surface of the first conductive layers configuring the stepped portion, the plurality of second conductive layers being formed such that an upper end thereof is aligned with a surface parallel to the substrate, and such that a diameter thereof decreases from the upper end thereof to a lower end thereof, and being formed such that the greater a length thereof in the perpendicular direction, the larger a diameter of the upper end thereof.

BRIEF DESCRIPTION OF THE DRAWINGS

FIG. 7A is a top view showing a first contact plug layer 54 and a second contact plug layer 55a.

FIGS. 8-28 are cross-sectional views showing a manufacturing process of the nonvolatile semiconductor memory device 100 in accordance with the first embodiment.

DETAILED DESCRIPTION

Embodiments of a nonvolatile semiconductor memory device in accordance with the present invention are described below with reference to the drawings.

First Embodiment (Configuration of a Nonvolatile Semiconductor Memory Device 100)

Figure 1:
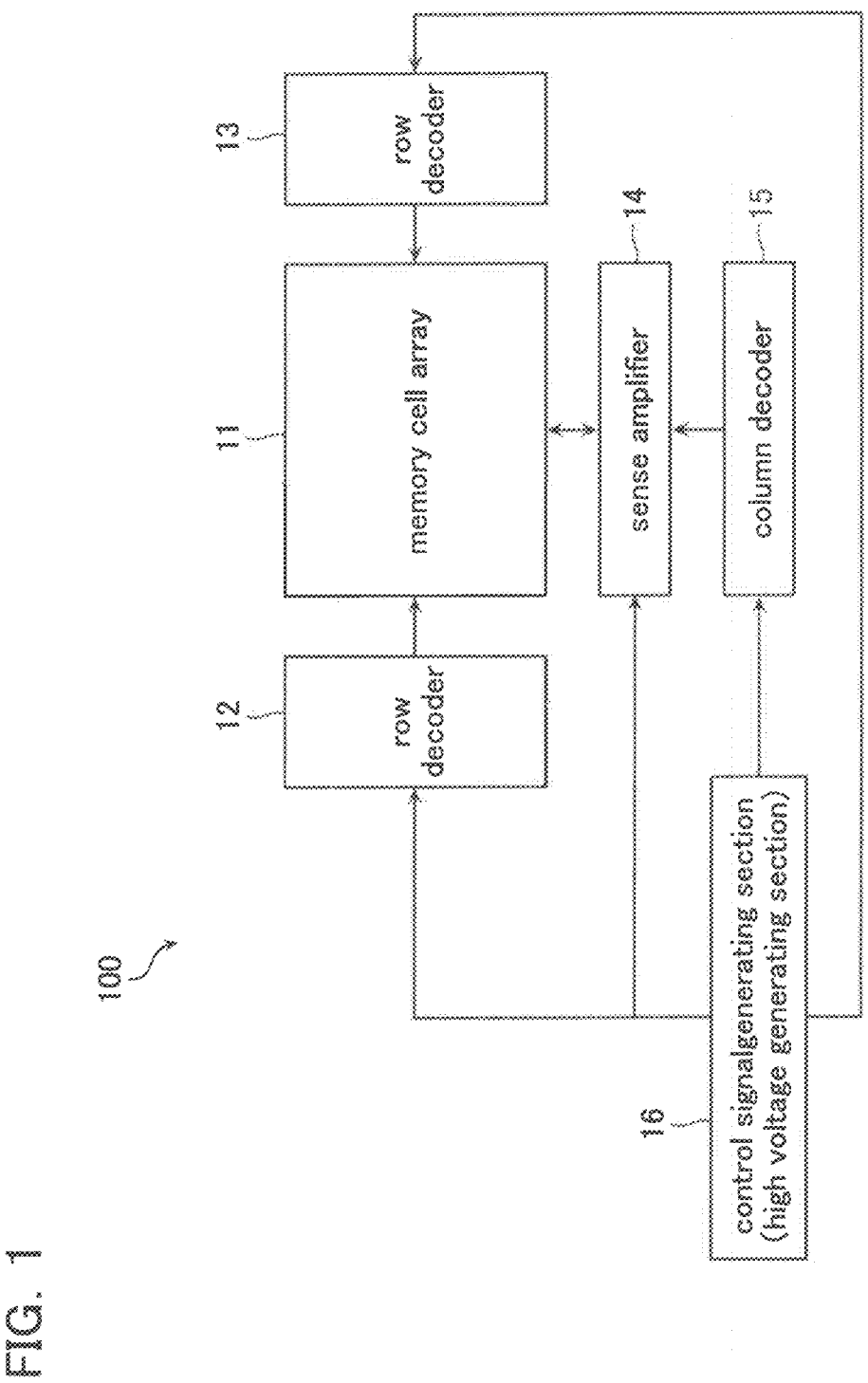
FIG. 1 is a block diagram of a nonvolatile semiconductor memory device 100 in accordance with a first embodiment.

First, a configuration of a nonvolatile semiconductor memory device 100 in accordance with a first embodiment is described with reference to FIG. 1. FIG. 1 is a block diagram of the nonvolatile semiconductor memory device 100 in accordance with the first embodiment.

As shown in FIG. 1, the nonvolatile semiconductor memory device 100 in accordance with the first embodiment comprises a memory cell array 11, row decoders 12 and 13, a sense amplifier 14, a column decoder 15, and a control signal generating section (high voltage generating section) 16.

The memory cell array 11 includes memory transistors MTr1-MTr4 configured to store data electrically. The row decoders 12 and 13 decode a block address signal and so on downloaded thereto and control the memory cell array 11. The sense amplifier 14 reads data from the memory cell array 11. The column decoder 15 decodes a column address signal and controls the sense amplifier 14. The control signal generating section 16 generates a high voltage required during write and erase by boosting a power supply voltage, and, in addition, generates a control signal and controls the row decoders 12 and 13, the sense amplifier 14, and the column decoder 15.

Figure 2:
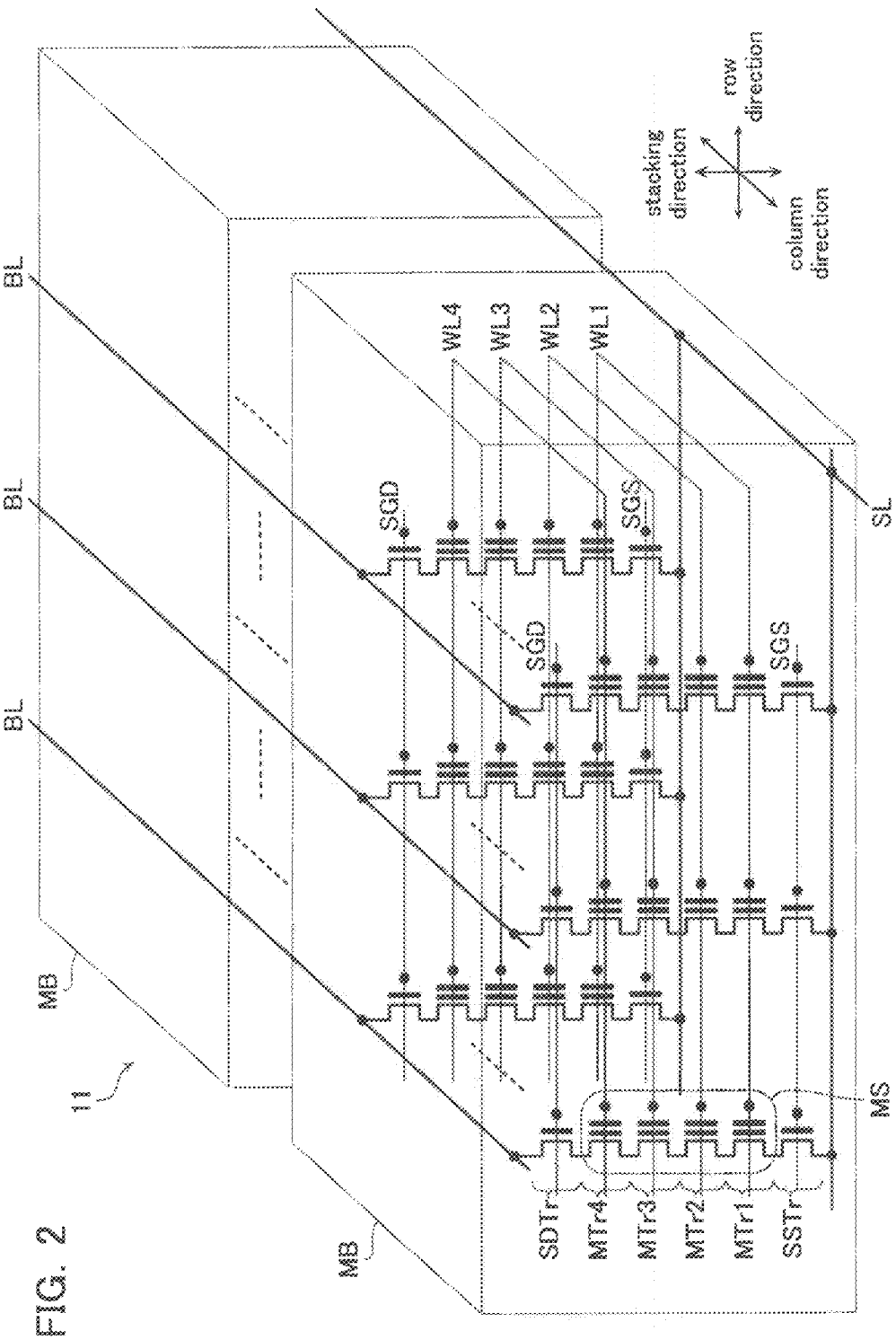
FIG. 2 is a circuit diagram of a memory cell array 11.

Next, a circuit configuration of the memory cell array 11 is described with reference to FIG. 2. FIG. 2 is a circuit diagram of the memory cell array 11. As shown in FIG. 2, the memory cell array 11 includes a plurality of memory blocks MB. The memory blocks MB are arranged in a column direction on a semiconductor substrate Ba (not shown). In other words, the memory blocks MB are formed in certain regions on the semiconductor substrate Ba.

As shown in FIG. 2, the memory block MB comprises a plurality of memory strings MS, source side select transistors SSTr, and drain side select transistors SDTr. The memory string MS is configured by memory transistors MTr1-MTr4 connected in series. The drain side select transistor SDTr is connected to one end of the memory string MS (memory transistor MTr4). The source side select transistor SSTr is connected to the other end of the memory string MS (memory transistor MTr1). For example, each individual memory block MB has the memory strings MS provided in a matrix formation over a plurality of rows and columns. Note that each of the memory string MS may be configured by more than four memory transistors.

As shown in FIG. 2, in the memory block MB, a control gate of the memory transistors MTr1 arranged in the matrix formation is commonly connected to the word line WL1. Similarly, a control gate of the memory transistors MTr2 is commonly connected to the word line WL2; a control gate of the memory transistors MTr3 is commonly connected to the word line WL3; and a control gate of the memory transistors MTr4 is commonly connected to the word line WL4.

As shown in FIG. 2, in the memory block MB, a control gate of each of the drain side select transistors SDTr arranged in a line in a row direction is commonly connected to a drain side select gate line SGD. The drain side select gate line SGD is formed so as to extend in the row direction. In one memory block MB, a plurality of drain side select gate lines SGD are provided with a certain pitch in the column direction. In addition, another end of the drain side select transistor SDTr arranged in a line in the column direction is commonly connected to a bit line BL. The bit line BL is formed so as to extend in the column direction. A plurality of bit lines BL is provided in the row direction.

As shown in FIG. 2, a control gate of all the source side select transistors SSTr in one memory block MB is commonly connected to a source side select gate line SGS. In addition, another end of the source side select transistor SSTr arranged in the column direction is commonly connected to a source line SL.

Figure 3:
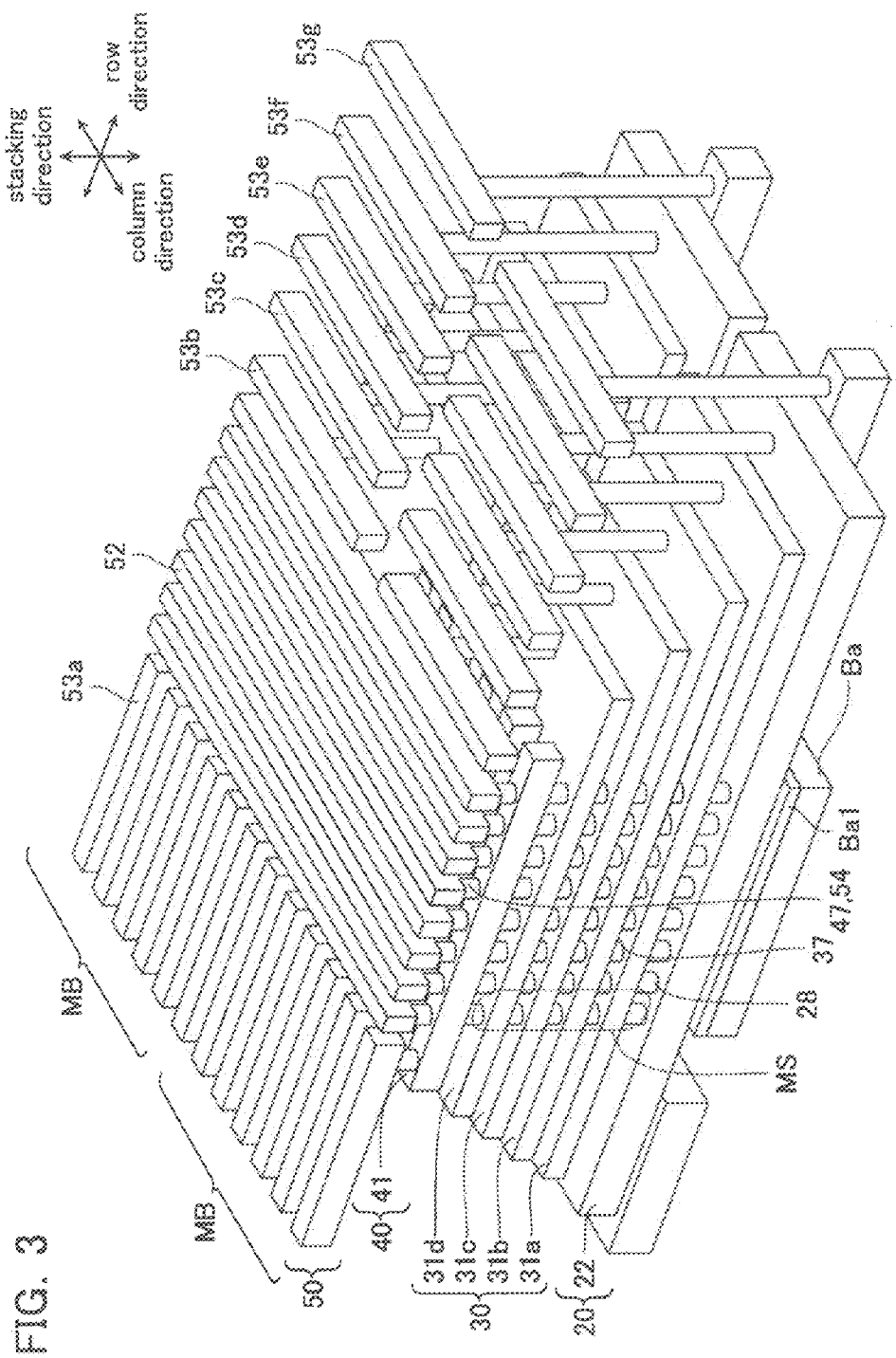
FIG. 3 is a schematic perspective view of the memory cell array 11.
Figure 4:
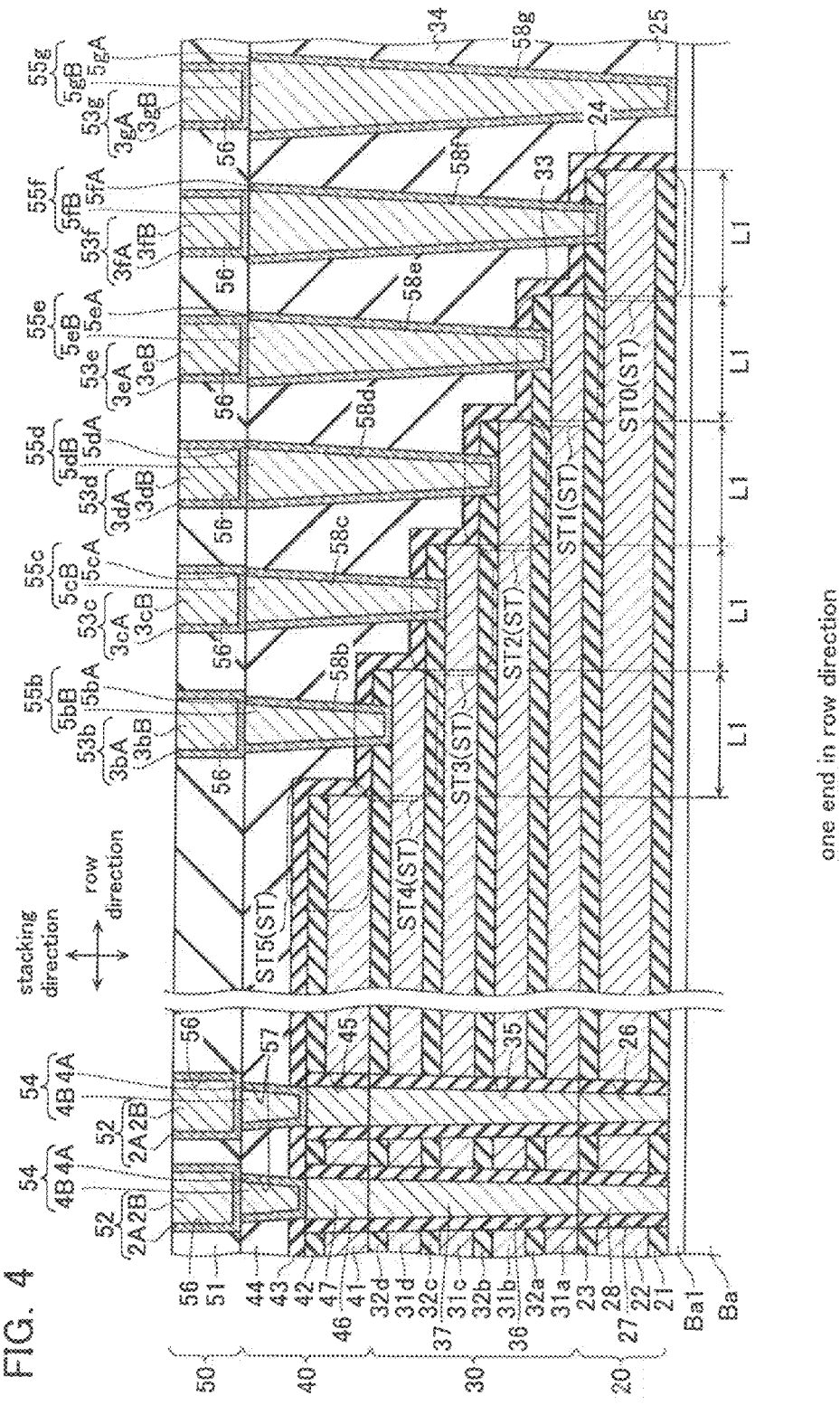
FIG. 4 is a cross-sectional view showing one end in a row direction of FIG. 3.
Figure 5:
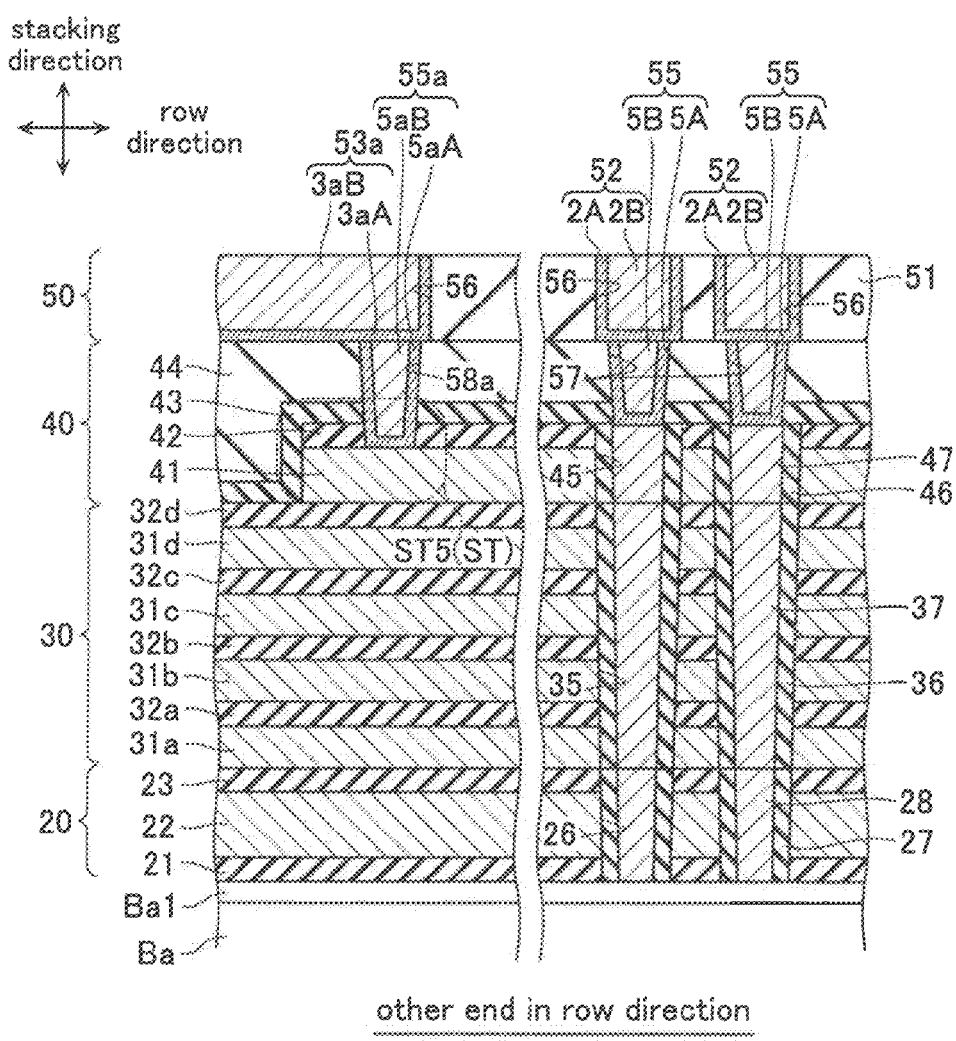
FIG. 5 is a cross-sectional view showing the other end in the row direction of FIG. 3.

The above-described circuit configuration of the memory cell array 11 is realized by a stacking structure shown in FIGS. 3-5. FIG. 3 is a schematic perspective view of the memory cell array 11. FIG. 4 is a cross-sectional view showing one end in the row direction of FIG. 3. FIG. 5 is a cross-sectional view showing the other end in the row direction of FIG. 3.

The memory cell array 11 includes, for each of the memory blocks MB, a source side select transistor layer 20, a memory transistor layer 30, a drain side select transistor layer 40, and a wiring layer 50, stacked sequentially on the semiconductor substrate Ba, as shown in FIGS. 3-5.

The source side select transistor layer 20 is a layer which functions as the source side select transistor SSTr. The memory transistor layer 30 is a layer which functions as the memory string MS (memory transistors MTr1-MTr4). The drain side select transistor layer 40 is a layer which functions as the drain side select transistor SDTr. The wiring layer 50 is a layer which functions as various wirings.

The semiconductor substrate Ba includes on an upper surface thereof a diffusion layer Ba1, as shown in FIGS. 3-5. The diffusion layer Ba1 functions as the source line SL.

The source side select transistor layer 20 includes a source side first insulating layer 21, a source side conductive layer 22, a source side second insulating layer 23, a protective insulating layer 24, and an interlayer insulating layer 25, as shown in FIGS. 3-5. The source side conductive layer 22 functions as the source side select gate line SGS. In addition, the source side conductive layer 22 functions as a control electrode of the source side select transistor SSTr.

The source side first insulating layer 21, the source side conductive layer 22, and the source side second insulating layer 23 are formed sequentially on the semiconductor substrate Ba, as shown in FIGS. 3-5. The source side conductive layer 22 is formed so as to extend two-dimensionally in the row direction and the column direction (in a plate-like shape) along the memory block MB.

The source side first insulating layer 21, the source side conductive layer 22, and the source side second insulating layer 23 have an end thereof in the row direction formed protruding further in the row direction than an end of a word line conductive layer 31a described hereafter by an amount of a certain width L1, as shown in FIG. 4. In other words, the end of the source side first insulating layer 21, the source side conductive layer 22, and the source side second insulating layer 23 configures a stepped portion ST (step ST0) having a stepped shape, similarly to word line conductive layers 31a-31d described hereafter. Moreover, the step ST0 has the certain width L1 in the row direction.

The protective insulating layer 24 is formed so as to cover the source side first insulating layer 21, the source side conductive layer 22, and the source side second insulating layer 23 (step ST0), as shown in FIG. 4. The interlayer insulating layer 25 is formed so as to bury the source side first insulating layer 21, the source side conductive layer 22, the source side second insulating layer 23, and the protective insulating layer 24. An upper surface of the interlayer insulating layer 25 is formed parallel to the semiconductor substrate Ba.

The source side first insulating layer 21, the source side second insulating layer 23, and the interlayer insulating layer 25 are constituted by, for example, silicon oxide ($SiO_2$). The source side conductive layer 22 is constituted by, for example, polysilicon (p-Si). The protective insulating layer 24 is constituted by, for example, silicon nitride (SiN).

Moreover, as shown in FIGS. 4 and 5, the source side select transistor layer 20 includes a source side hole 26 formed so as to penetrate the source side first insulating layer 21, the source side conductive layer 22, and the source side second insulating layer 23. The source side hole 26 is formed in a matrix in the row direction and the column direction. The source side hole 26 is formed at a position aligning with the diffusion region Ba1.

Additionally, as shown in FIGS. 4 and 5, the source side select transistor layer 20 includes a source side gate insulating layer 27 and a source side columnar semiconductor layer 28 formed sequentially on a side wall of the source side hole 26. The source side gate insulating layer 27 is formed with a certain thickness on the side wall of the source side hole 26. The source side columnar semiconductor layer 28 is formed so as to fill the source side hole 26. The source side columnar semiconductor layer 28 is formed in a column shape extending in a stacking direction. An upper surface of the source side columnar semiconductor layer 28 is formed so as to be in contact with a lower surface of a memory columnar semiconductor layer 37 described hereafter.

The source side gate insulating layer 27 is constituted by, for example, silicon oxide ($SiO_2$). The source side columnar semiconductor layer 28 is constituted by, for example, polysilicon (p-Si).

The memory transistor layer 30 includes the word line conductive layers 31a-31d and inter-word line insulating layers 32a-32d, a protective insulating layer 33, and an interlayer insulating layer 34, stacked sequentially on the source side select transistor layer 20, as shown in FIGS. 4 and 5. The word line conductive layers 31a-31d function as word lines WL1-WL4. In addition, the word line conductive layers 31a-31d function as a control electrode of the memory transistors MTr1-MTr4.

The word line conductive layers 31a-31d and the inter-word line insulating layers 32a-32d are formed so as to extend two-dimensionally in the row direction and the column direction (in a plate-like shape). The word line conductive layers 31a-31d and the inter-word line insulating layers 32a-32d are stacked alternately and divided into memory blocks MB. The protective insulating layer 33 is formed so as to cover the word line conductive layers 31a-31d and the inter-word line insulating layers 32a-32d, and to be continuous in an integrated manner with the protective insulating layer 24. The interlayer insulating layer 34 is formed so as to bury the word line conductive layers 31a-31d, the inter-word line insulating layers 32a-32d, and the protective insulating layer 33, and to be continuous in an integrated manner with the interlayer insulating layer 25.

As shown in FIGS. 3 and 4, the word line conductive layers 31a-31d and the inter-word line insulating layers 32a-32d are formed in a stepped shape such that positions of ends thereof in the row direction differ from one another. That is, the ends in the row direction of the word line conductive layers 31a-31d and the inter-word line insulating layers 32a-32d configure a stepped portion ST with the ends formed in a stepped shape. The stepped portion ST is formed so as to descend in the row direction towards an end of the memory block MB. The stepped portion ST includes steps ST1-ST4 arranged in a line in the row direction. Besides, each of the sides of the steps ST1-ST4 faces the row direction.

The steps ST1-ST4 are provided adjacently in the row direction proceeding from an end vicinity of the memory block MB towards the center of the memory block MB, as shown in FIGS. 3 and 4. The step ST1 is provided above the step ST0; the step ST2 is provided above the step ST1; the step ST3 is provided above the step ST2; and the step ST4 is provided above the step ST3.

The steps ST1-ST4 are each configured by a stacked structure of one conductive layer and one insulating layer, as shown in FIG. 4. That is, the step ST1 is configured by an end of the word line conductive layer 31a and an end of the inter-word line insulating layer 32a; the step ST2 is configured by an end of the word line conductive layer 31b and an end of the inter-word line insulating layer 32b; the step ST3 is configured by an end of the word line conductive layer 31c and an end of the inter-word line insulating layer 32c; and the step ST4 is configured by an end of the word line conductive layer 31d and an end of the inter-word line insulating layer 32d. As shown in FIG. 4, the steps ST1-ST4 are formed with a certain width L1 in the row direction. The protective insulating layer 33 is formed so as to cover the steps ST1-ST4. An upper surface of the interlayer insulating layer 34 is formed parallel to the semiconductor substrate Ba.

The word line conductive layers 31a-31d are constituted by, for example, polysilicon (p-Si). The inter-word line insulating layers 32a-32d and the interlayer insulating layer 34 are constituted by, for example, silicon oxide ($SiO_2$). The protective insulating layer 33 is constituted by, for example, silicon nitride (SiN).

Moreover, as shown in FIGS. 4 and 5, the memory transistor layer 30 includes a memory hole 35 formed so as to penetrate the word line conductive layers 31a-31d and the inter-word line insulating layers 32a-32d. The memory hole 35 is formed in a matrix in the row direction and the column direction. The memory hole 35 is formed at a position aligning with the source side hole 26.

Figure 6:
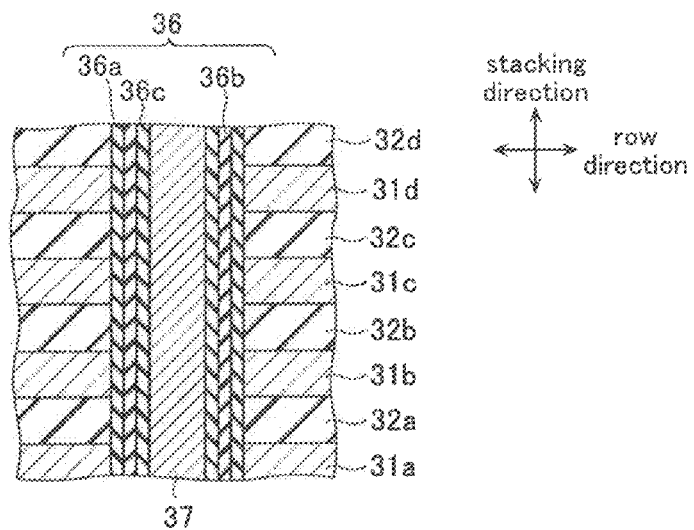
FIG. 6 is an enlarged view of FIG. 4.

Additionally, as shown in FIGS. 4 and 5, the memory transistor layer 30 includes a memory gate insulating layer 36 and a memory columnar semiconductor layer 37, stacked sequentially on a side wall of the memory hole 35. FIG. 6 here is an enlarged view of FIG. 4.

As shown in FIG. 6, the memory gate insulating layer 36 is configured by a block insulating layer 36a, a charge storage layer 36b, and a tunnel insulating layer 36c. The block insulating layer 36a is formed with a certain thickness on the side wall of the memory hole 35, as shown in FIG. 6. The charge storage layer 36b is formed with a certain thickness on a side wall of the block insulating layer 36a. The tunnel insulating layer 36c is formed with a certain thickness on a side wall of the charge storage layer 36b. The memory columnar semiconductor layer 37 is formed so as to fill the memory hole 35. The memory columnar semiconductor layer 37 is formed in a column shape extending in the stacking direction. The lower surface of the memory columnar semiconductor layer 37 is formed so as to be in contact with the upper surface of the source side columnar semiconductor layer 28. Moreover, an upper surface of the memory columnar semiconductor layer 37 is formed so as to be in contact with a lower surface of a drain side columnar semiconductor layer 47 described hereafter.

The block insulating layer 36a and the tunnel insulating layer 36c are constituted by, for example, silicon oxide ($SiO_2$). The charge storage layer 36b is constituted by, for example, silicon nitride (SiN). The memory columnar semiconductor layer 37 is constituted by, for example, polysilicon (p-Si).

The drain side select transistor layer 40 includes a drain side conductive layer 41, a drain side insulating layer 42, a protective insulating layer 43, and an interlayer insulating layer 44, stacked on the memory transistor layer 30, as shown in FIGS. 4 and 5. The drain side conductive layer 41 functions as the drain side select gate line SGD. In addition, the drain side conductive layer 41 functions as a control gate of the drain side select transistor SDTr.

As shown in FIGS. 4 and 5, the drain side conductive layer 41 and the drain side insulating layer 42 are formed directly above the memory columnar semiconductor layer 37. The drain side conductive layer 41 and the drain side insulating layer 42 are formed in stripes extending in the row direction and having a certain pitch in the column direction. The drain side conductive layer 41 and the drain side insulating layer 42 are formed shorter in the row direction than the word line conductive layer 31d. In other words, an end of the drain side conductive layer 41 and the drain side insulating layer 42 in the row direction configures a stepped portion ST (step ST5) having a stepped shape, similarly to the word line conductive layers 31a-31d. The step ST5 is positioned upwardly of the step ST4. The protective insulating layer 43 is formed so as to cover the step ST5. An upper surface of the interlayer insulating layer 44 is formed parallel to the semiconductor substrate Ba.

As shown in FIGS. 4 and 5, the drain side insulating layer 42 is formed on an upper surface of the drain side conductive layer 41. The protective insulating layer 43 is formed so as to cover the drain side conductive layer 41 and the drain side insulating layer 42, and to be continuous in an integrated manner with the protective insulating layer 33. The interlayer insulating layer 44 is formed to a certain height so as to bury the drain side conductive layer 41, the drain side insulating layer 42, and the protective insulating layer 43, and to be continuous in an integrated manner with the interlayer insulating layer 34.

The drain side conductive layer 41 is constituted by, for example, polysilicon (p-Si). The drain side insulating layer 42 and the interlayer insulating layer 44 are constituted by, for example, silicon oxide ($SiO_2$). The protective insulating layer 43 is constituted by, for example, silicon nitride (SiN).

Moreover, as shown in FIGS. 4 and 5, the drain side select transistor layer 40 includes a drain side hole 45 formed so as to penetrate the drain side conductive layer 41 and the drain side insulating layer 42. The drain side hole 45 is formed in a matrix in the row direction and the column direction. The drain side hole 45 is formed at a position aligning with the memory hole 35.

Additionally, as shown in FIGS. 4 and 5, the drain side select transistor layer 40 includes a drain side gate insulating layer 46 and a drain side columnar semiconductor layer 47 formed sequentially on a side wall of the drain side hole 45. The drain side gate insulating layer 46 is formed with a certain thickness on the side wall of the drain side hole 45. The drain side columnar semiconductor layer 47 is formed so as to fill the drain side hole 45. The drain side columnar semiconductor layer 47 is formed in a column shape extending in the stacking direction. The lower surface of the drain side columnar semiconductor layer 47 is formed so as to be in contact with the upper surface of the memory columnar semiconductor layer 37.

The drain side gate insulating layer 46 is constituted by, for example, silicon oxide ($SiO_2$). The drain side columnar semiconductor layer 47 is constituted by, for example, polysilicon (p-Si).

The wiring layer 50 includes an interlayer insulating layer 51, a first wiring layer 52, second wiring layers 53a-53g, a first contact plug layer 54, and second contact plug layers 55a-55g, as shown in FIGS. 4 and 5. The first wiring layer 52 functions as the bit line BL.

The interlayer insulating layer 51 is formed on an upper layer of the interlayer insulating layer 44, as shown in FIGS. 4 and 5.

The first wiring layer 52 and the second wiring layers 53a-53g are formed so as to fill a trench 56, as shown in FIGS. 4 and 5. The trench 56 is formed so as to penetrate the interlayer insulating layer 51.

The first wiring layer 52 includes a barrier metal layer 2A and a metal layer 2B. The barrier metal layer 2A is provided to prevent diffusion of the metal layer 2B. The barrier metal layer 2A is formed with a certain thickness on a side surface facing the trench 56. The metal layer 2B is formed so as to be in contact with the barrier metal layer 2A and to fill the trench 56.

The second wiring layers 53a-53g include barrier metal layers 3aA-3gA and metal layers 3aB-3gB. The barrier metal layers 3aA-3gA are provided to prevent diffusion of the metal layers 3aB-3gB. The barrier metal layers 3aA-3gA are formed with a certain thickness on the side surface facing the trench 56. The metal layers 3aB-3gB are formed so as to be in contact with the barrier metal layers 3aA-3gA and to fill the trench 56.

The barrier metal layers 2A and 3aA-3gA are constituted from a metal such as tantalum (Ta), titanium (Ti), tungsten (W), ruthenium (Ru), or manganese (Mn), or from a metal compound thereof. The metal layers 2B and 3aB-3gB are constituted by any of tungsten (W), copper (Cu), and aluminum (Al).

The first contact plug layer 54 is formed so as to fill a hole 57, as shown in FIGS. 4 and 5. The hole 57 is formed so as to extend from the upper surface of the interlayer insulating layer 44 as far as an upper surface of the drain side columnar semiconductor layer 47. The first contact plug layer 54 is formed at a position aligning with the drain side columnar semiconductor layer 47. The first contact plug layer 54 is formed in a column shape so as to be in contact with the upper surface of the drain side columnar semiconductor layer 47 and a lower surface of the first wiring layer 52. An upper surface of the first contact plug layer 54 is formed in alignment with a surface of the interlayer insulating layer 44.

The second contact plug layer 55a is formed so as to fill a hole 58a, as shown in FIG. 5. The hole 58a is formed so as to extend from the upper surface of the interlayer insulating layer 44 as far as the upper surface of the drain side conductive layer 41 (step ST5). The second contact plug layer 55a is formed so as to be in contact with the upper surface of the drain side conductive layer 41 (step ST5) and a lower surface of the second wiring layer 53a. The second contact plug layer 55a is formed longer in the stacking direction than the first contact plug layer 54 and has an upper surface thereof formed in alignment with the surface of the interlayer insulating layer 44.

The second contact plug layer 55b is formed so as to fill a hole 58b, as shown in FIG. 4. The hole 58b is formed so as to extend from the upper surface of the interlayer insulating layer 44 as far as an upper surface of the word line conductive layer 31d (step ST4). The second contact plug layer 55b is formed so as to be in contact with the upper surface of the word line conductive layer 31d (step ST4) and a lower surface of the second wiring layer 53b. The second contact plug layer 55b is formed longer in the stacking direction than the second contact plug layer 55a and has an upper surface thereof formed in alignment with the surface of the interlayer insulating layer 44. The second contact plug layer 55c is formed so as to fill a hole 58c, as shown in FIG. 4. The hole 58c is formed so as to extend from the upper surface of the interlayer insulating layer 44 as far as an upper surface of the word line conductive layer 31c (step ST3). The second contact plug layer 55c is formed so as to be in contact with the upper surface of the word line conductive layer 31c (step ST3) and a lower surface of the second wiring layer 53c. The second contact plug layer 55c is formed longer in the stacking direction than the second contact plug layers 55a and 55b and has an upper surface thereof formed in alignment with the surface of the interlayer insulating layer 44.

The second contact plug layer 55d is formed so as to fill a hole 58d, as shown in FIG. 4. The hole 58d is formed so as to extend from the upper surface of the interlayer insulating layer 44 as far as an upper surface of the word line conductive layer 31b (step ST2). The second contact plug layer 55d is formed so as to be in contact with the upper surface of the word line conductive layer 31b (step ST2) and a lower surface of the second wiring layer 53d. The second contact plug layer 55d is formed longer in the stacking direction than the second contact plug layers 55a-55c and has an upper surface thereof formed in alignment with the surface of the interlayer insulating layer 44.

The second contact plug layer 55e is formed so as to fill a hole 58e, as shown in FIG. 4. The hole 58e is formed so as to extend from the upper surface of the interlayer insulating layer 44 as far as an upper surface of the word line conductive layer 31a (step ST1). The second contact plug layer 55e is formed so as to be in contact with the upper surface of the word line conductive layer 31a (step ST1) and a lower surface of the second wiring layer 53e. The second contact plug layer 55e is formed longer in the stacking direction than the second contact plug layers 55a-55d and has an upper surface thereof formed in alignment with the surface of the interlayer insulating layer 44.

The second contact plug layer 55f is formed so as to fill a hole 58f, as shown in FIG. 4. The hole 58f is formed so as to extend from the upper surface of the interlayer insulating layer 44 as far as an upper surface of the source side conductive layer 22 (step ST0). The second contact plug layer 55f is formed so as to be in contact with the upper surface of the source side conductive layer 22 (step ST0) and a lower surface of the second wiring layer 53f. The second contact plug layer 55f is formed longer in the stacking direction than the second contact plug layers 55a-55e and has an upper surface thereof formed in alignment with the surface of the interlayer insulating layer 44.

The second contact plug layer 55g is formed so as to fill a hole 58g, as shown in FIG. 4. The hole 58g is formed so as to extend as far as an upper surface of the diffusion layer Ba1 on the semiconductor substrate Ba. The second contact plug layer 55g is formed so as to be in contact with the upper surface of the diffusion layer Ba1 on the semiconductor substrate Ba and a lower surface of the second wiring layer 53g. The second contact plug layer 55g is formed longer in the stacking direction than the second contact plug layers 55a-55f and has an upper surface thereof formed in alignment with the surface of the interlayer insulating layer 44.

The first contact plug layer 54 includes a barrier metal layer 4A and a metal layer 4B. The barrier metal layer 4A is provided to prevent diffusion of the metal layer 4B. The barrier metal layer 4A is formed with a certain thickness on a side surface of the hole 57. The metal layer 4B is formed so as to be in contact with the barrier metal layer 4A and to fill the hole 57.

The second contact plug layers 55a-55g include barrier metal layers 5aA-5gA and metal layers 5aB-5gB. The barrier metal layers 5aA-5gA are provided to prevent diffusion of the metal layers 5aB-5gB. The barrier metal layers 5aA-5gA are formed with a certain thickness on the side surface of the holes 58a-58g. The metal layers 5aB-5gB are formed so as to be in contact with the barrier metal layers 5aA-5gA and to fill the holes 58a-58g.

The barrier metal layers 4A and 5aA-5gA are constituted from a metal such as tantalum (Ta), titanium (Ti), tungsten (W), ruthenium (Ru), or manganese (Mn), or from a metal compound thereof. The metal layers 4B and 5aB-5gB are constituted by any of tungsten (W), copper (Cu), and aluminum (Al). The interlayer insulating layer 51 is constituted by silicon oxide ($SiO_2$).

Figure 7A:
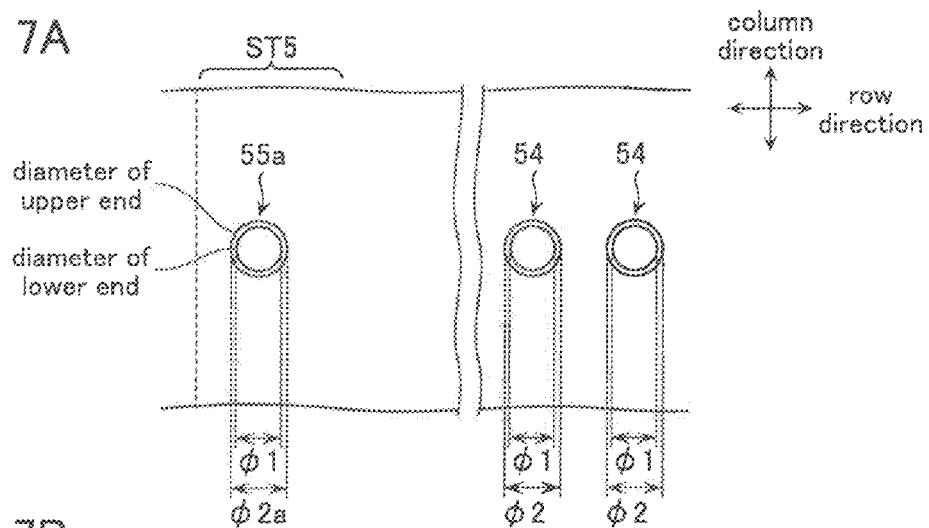

Next, a shape and a position of formation of the first contact plug layer 54 and the second contact plug layers 55a-55g are specifically explained with reference to FIGS. 7A and 7B. FIG. 7A is a top view showing the first contact plug layer 54 and the second contact plug layer 55a, and FIG. 7B is a top view showing the second contact plug layers 55b-55g.

Figure 7B:
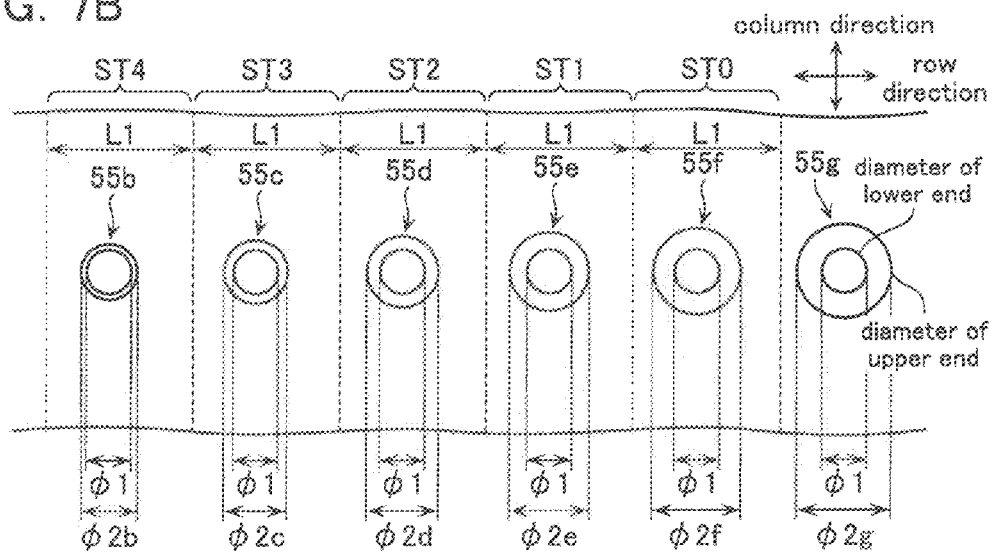
FIG. 7B is a top view showing second contact plug layers 55b-55g.

As shown in FIGS. 7A and 7B, the first contact plug layer 54 and the second contact plug layers 55a-55g are formed in a tapered shape such that a diameter thereof decreases from an upper end thereof to a lower end thereof. Moreover, the upper end of the first contact plug layer 54 and the upper end of the second contact plug layers 55a-55g are formed in alignment with the upper surface of the interlayer insulating layer 44. As shown in FIGS. 7A and 7B, the first contact plug layer 54 and the second contact plug layers 55a-55g have in common that the diameter of the lower end of each thereof is substantially a diameter $\phi 1$. In contrast, the first contact plug layer 54 and the second contact plug layers 55a-55g have a diameter at upper end thereof that differs from one another, i.e., $\phi 2$ and $\phi 2a$ to $\phi 2g$ ($\phi 2 < \phi 2a < \phi 2b < \phi 2c < \phi 2d < \phi 2e < \phi 2f < \phi 2g$).

To express the above-described configuration in other words, the first and second contact plug layers 54 and 55a-55g are formed such that the greater a length thereof in the stacking direction, the larger the diameter of the upper end thereof. The diameter $\phi 2g$ of the upper end of the second contact plug layer 55g is larger than the diameter $\phi 2f$ of the upper end of the second contact plug layer 55f. The diameter $\phi 2f$ of the upper end of the second contact plug layer 55f is larger than the diameter $\phi 2e$ of the upper end of the second contact plug layer 55e. The diameter $\phi 2e$ of the upper end of the second contact plug layer 55e is larger than the diameter $\phi 2d$ of the upper end of the second contact plug layer 55d. The diameter $\phi 2d$ of the upper end of the second contact plug layer 55d is larger than the diameter $\phi 2c$ of the upper end of the second contact plug layer 55c. The diameter $\phi 2c$ of the upper end of the second contact plug layer 55c is larger than the diameter $\phi 2b$ of the upper end of the second contact plug layer 55b. The diameter $\phi 2b$ of the upper end of the second contact plug layer 55b is larger than the diameter $\phi 2a$ of the upper end of the second contact plug layer 55a. The diameter $\phi 2a$ of the upper end of the second contact plug layer 55a is larger than the diameter $\phi 2$ of the upper end of the first contact plug layer 54.

(Method of Manufacturing the Nonvolatile Semiconductor Memory Device 100 in Accordance with the First Embodiment)

Next, a method of manufacturing the nonvolatile semiconductor memory device 100 in accordance with the first embodiment is described with reference to FIGS. 8-28. FIGS. 8-28 are cross-sectional views showing a manufacturing process of the nonvolatile semiconductor memory device 100 in accordance with the first embodiment.

First, silicon oxide ($SiO_2$), polysilicon (p-Si), and silicon oxide ($SiO_2$) are deposited on the upper surface of the semiconductor substrate Ba to form the source side first insulating layer 21, the source side conductive layer 22, and the source side second insulating layer 23, as shown in FIG. 8. Next, the source side hole 26 is formed so as to penetrate the source side first insulating layer 21, the source side conductive layer 22, and the source side second insulating layer 23, as shown in FIG. 9. Then, silicon oxide ($SiO_2$) and polysilicon (p-Si) are deposited on the side wall facing the source side hole 26 to form the source side gate insulating layer 27 and the source side columnar semiconductor layer 28, as shown in FIG. 10.

Through the above-described processes, the source side select transistor layer 20 is formed.

Figure 11:
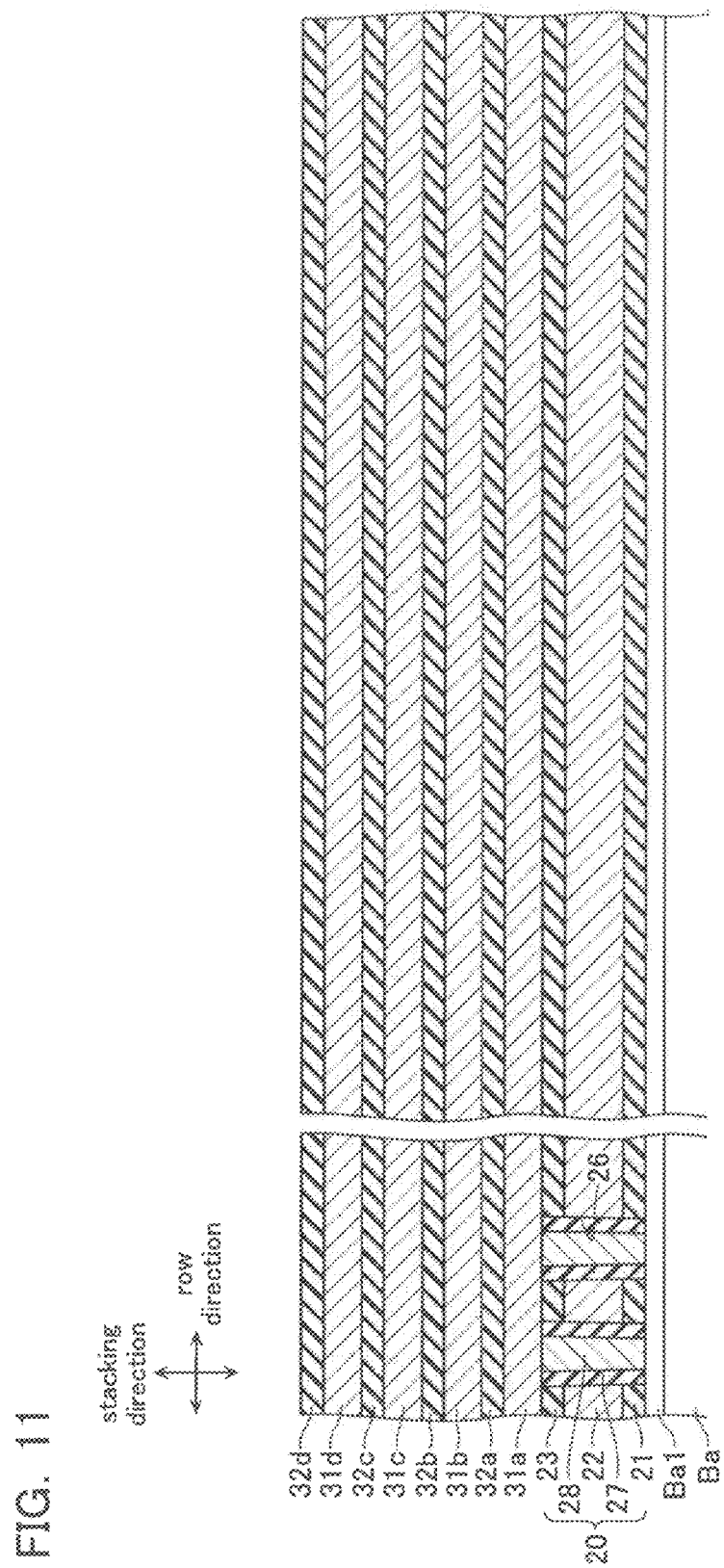
Figure 12:
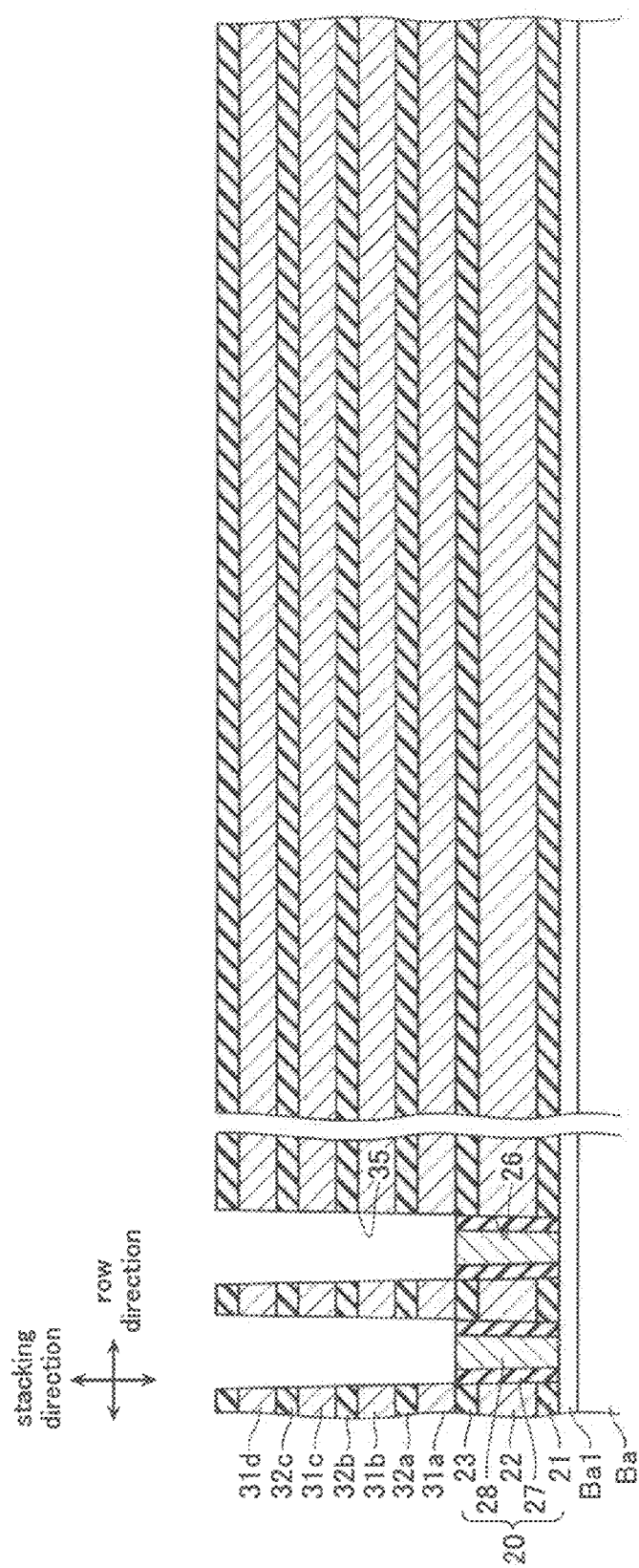
Figure 13:
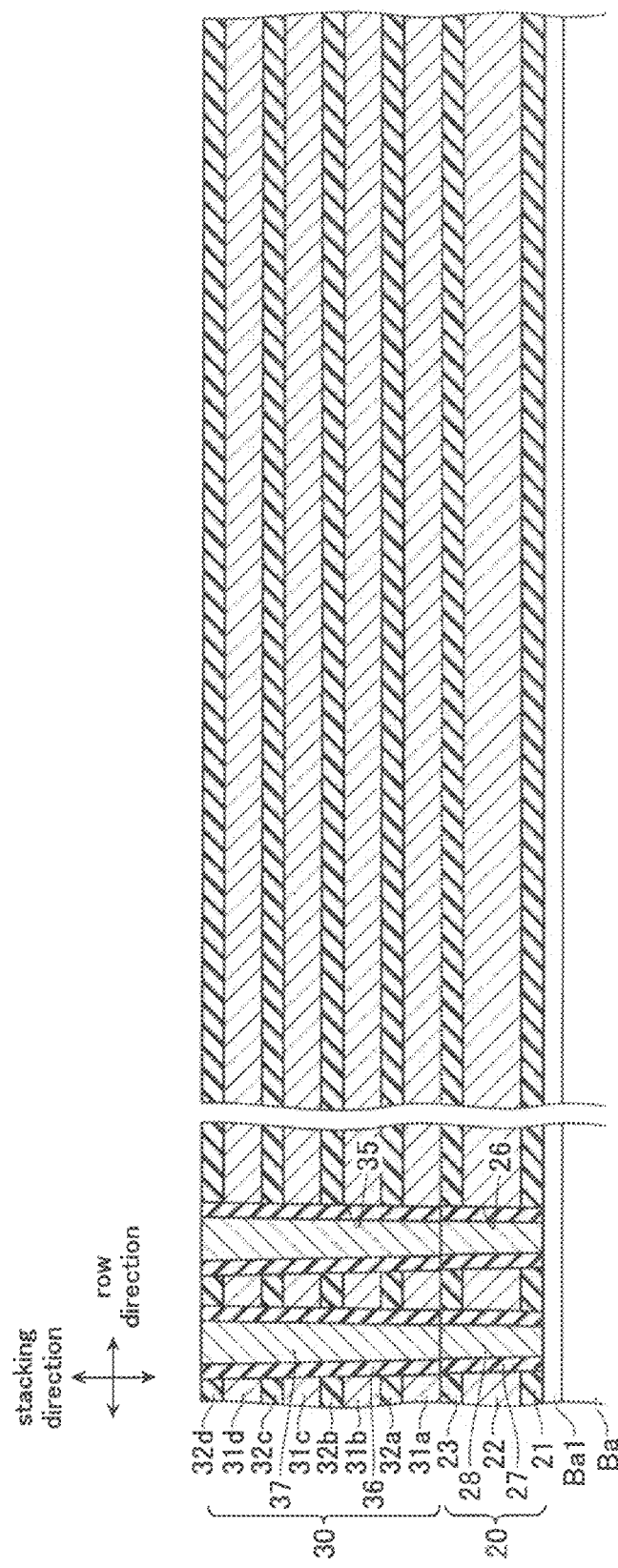

Next, polysilicon (p-Si) and silicon oxide ($SiO_2$) are alternately deposited to form the word line conductive layers 31a-31d and the inter-word line insulating layers 32a-32d, as shown in FIG. 11. Then, the memory hole 35 is formed so as to penetrate the word line conductive layers 31a-31d and the inter-word line insulating layers 32a-32d, as shown in FIG. 12. Next, silicon oxide ($SiO_2$), silicon nitride (SiN), silicon oxide ($SiO_2$), and polysilicon (p-Si) are deposited on the side wall facing the memory hole 35 to form the memory gate insulating layer 36 and the memory columnar semiconductor layer 37, as shown in FIG. 13. Through the above-described processes, the memory transistor layer 30 is formed.

Figure 10:
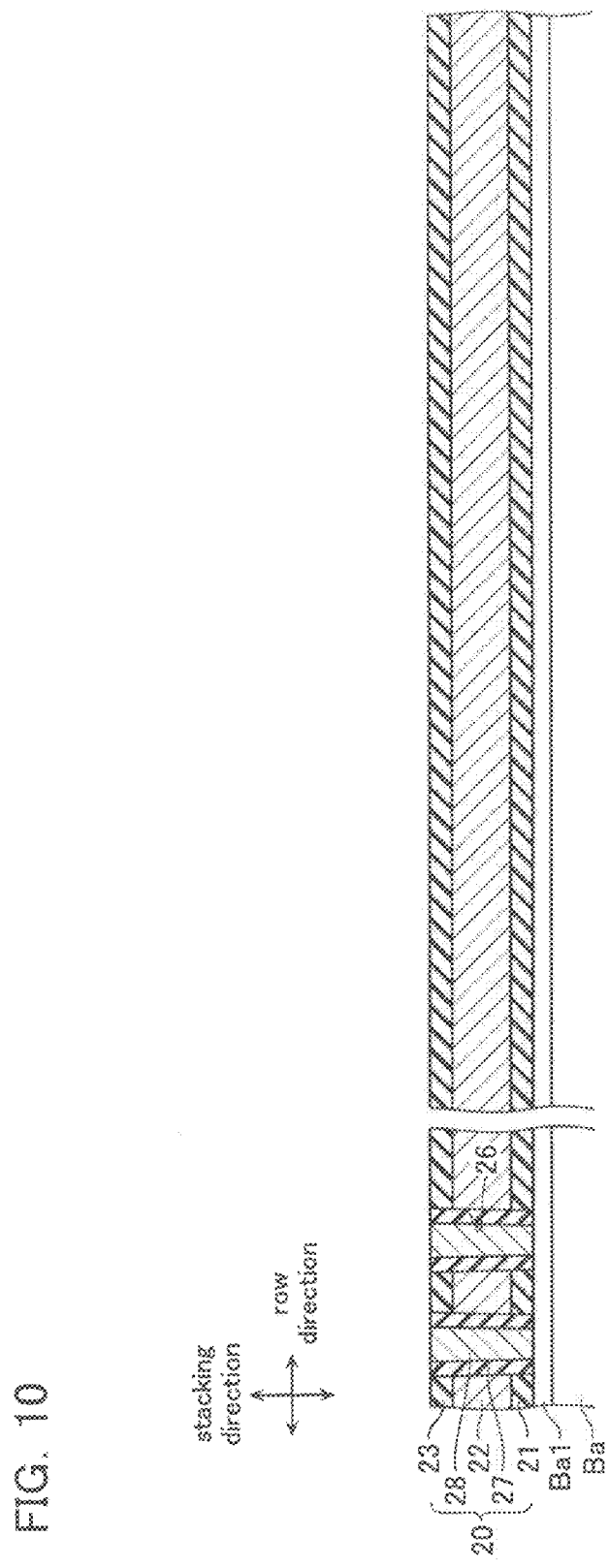
Figure 14:
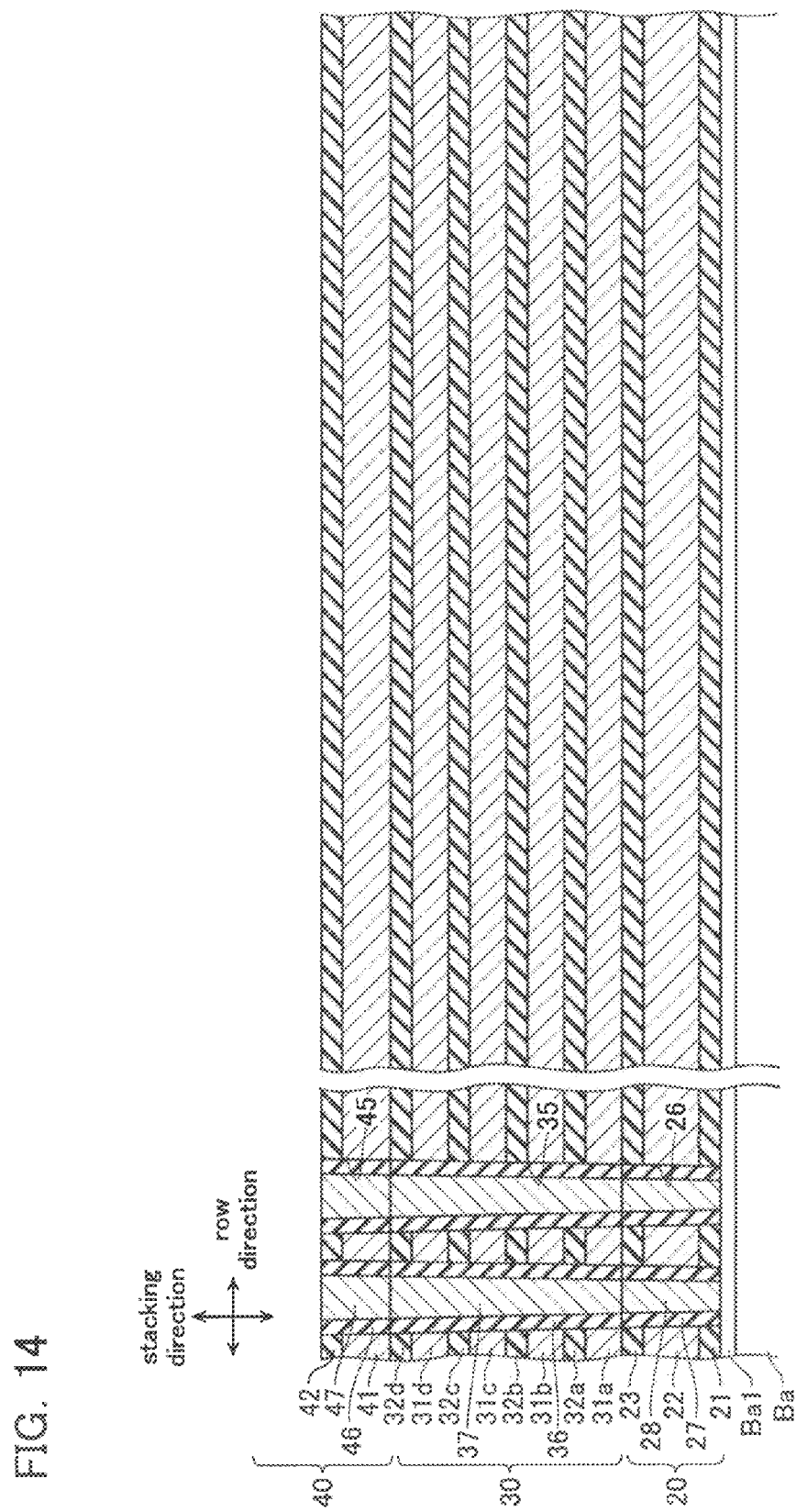

Subsequently, processes similar to those of above-described FIGS. 8-10 are performed, thereby forming the drain side select transistor layer 40, as shown in FIG. 14.

Figure 15:
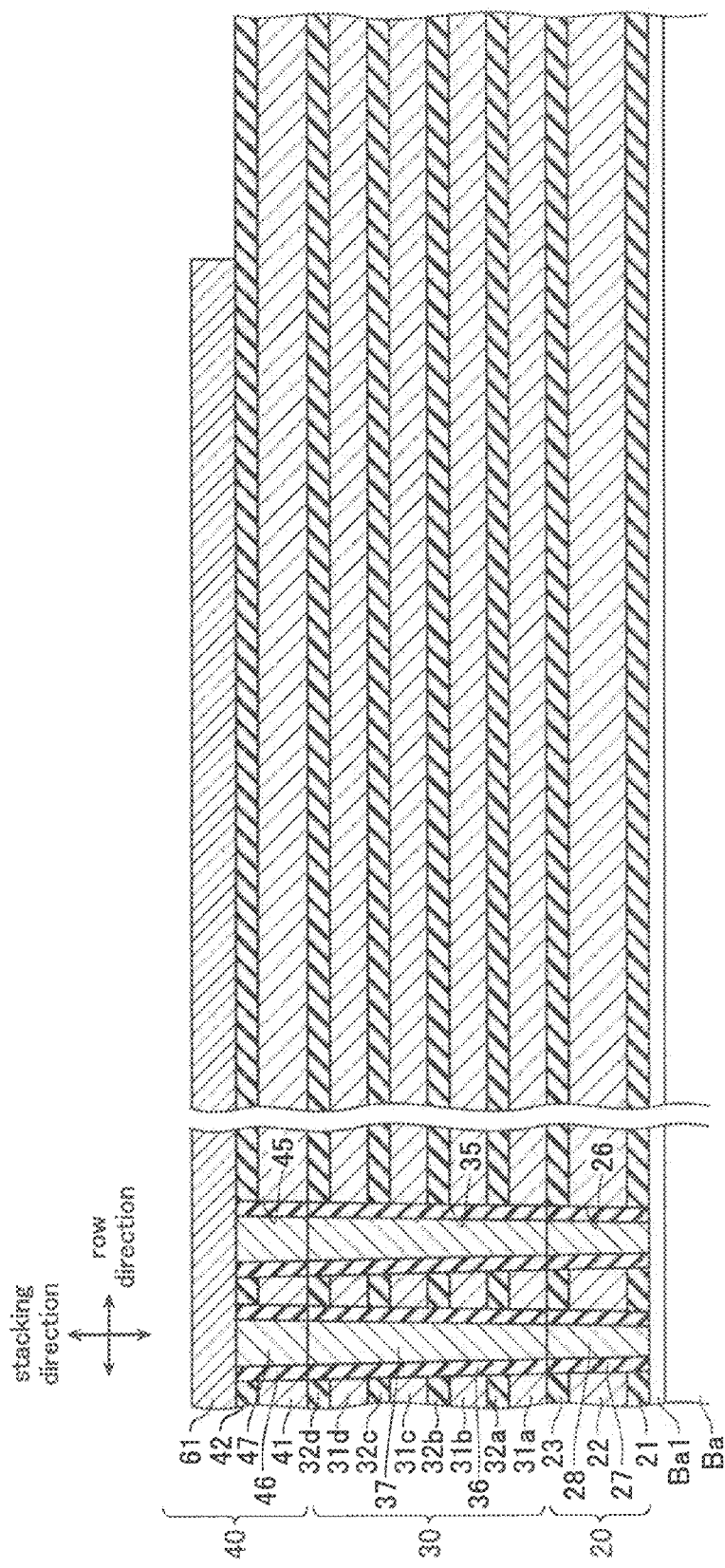
Figure 16:
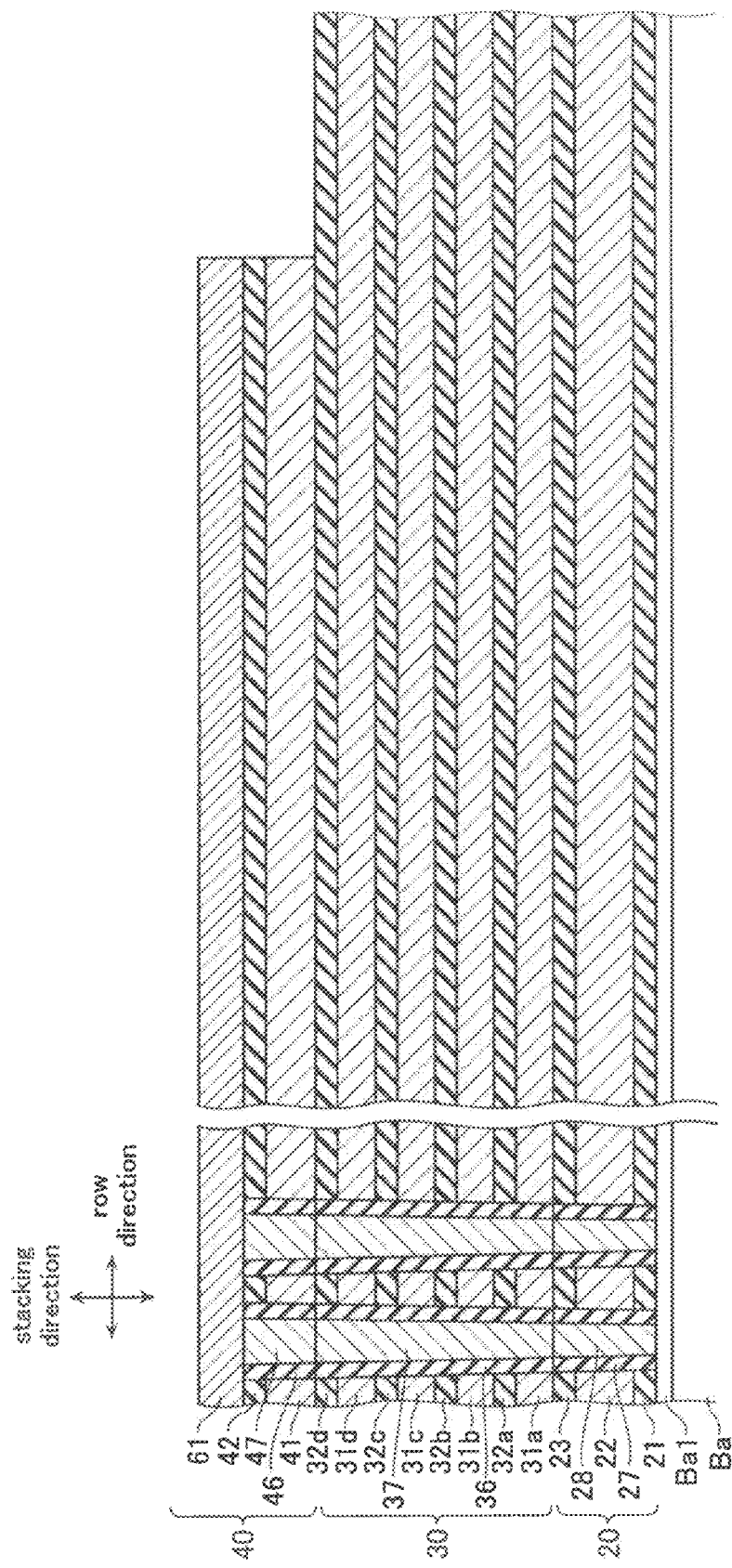
Figure 17:
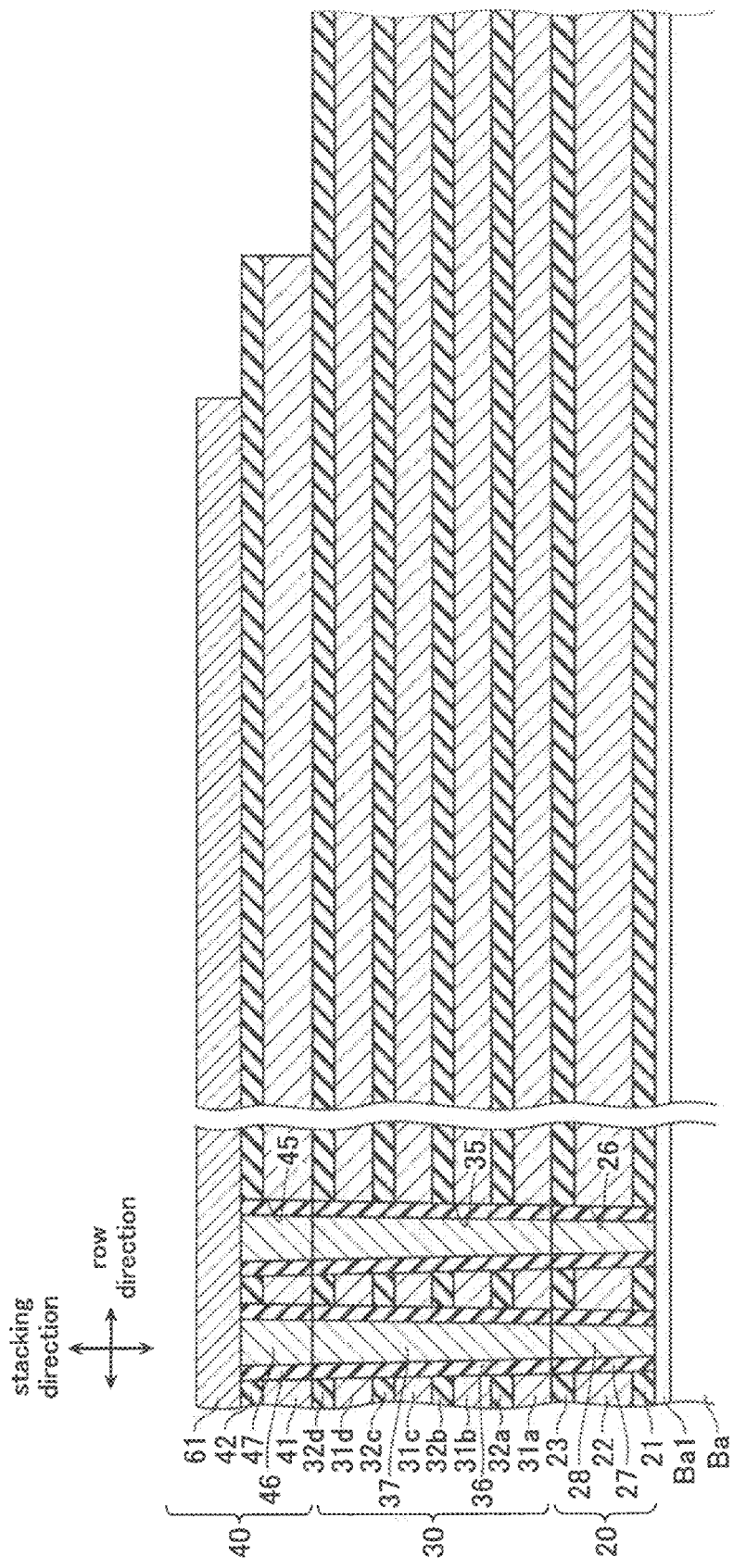
Figure 18:
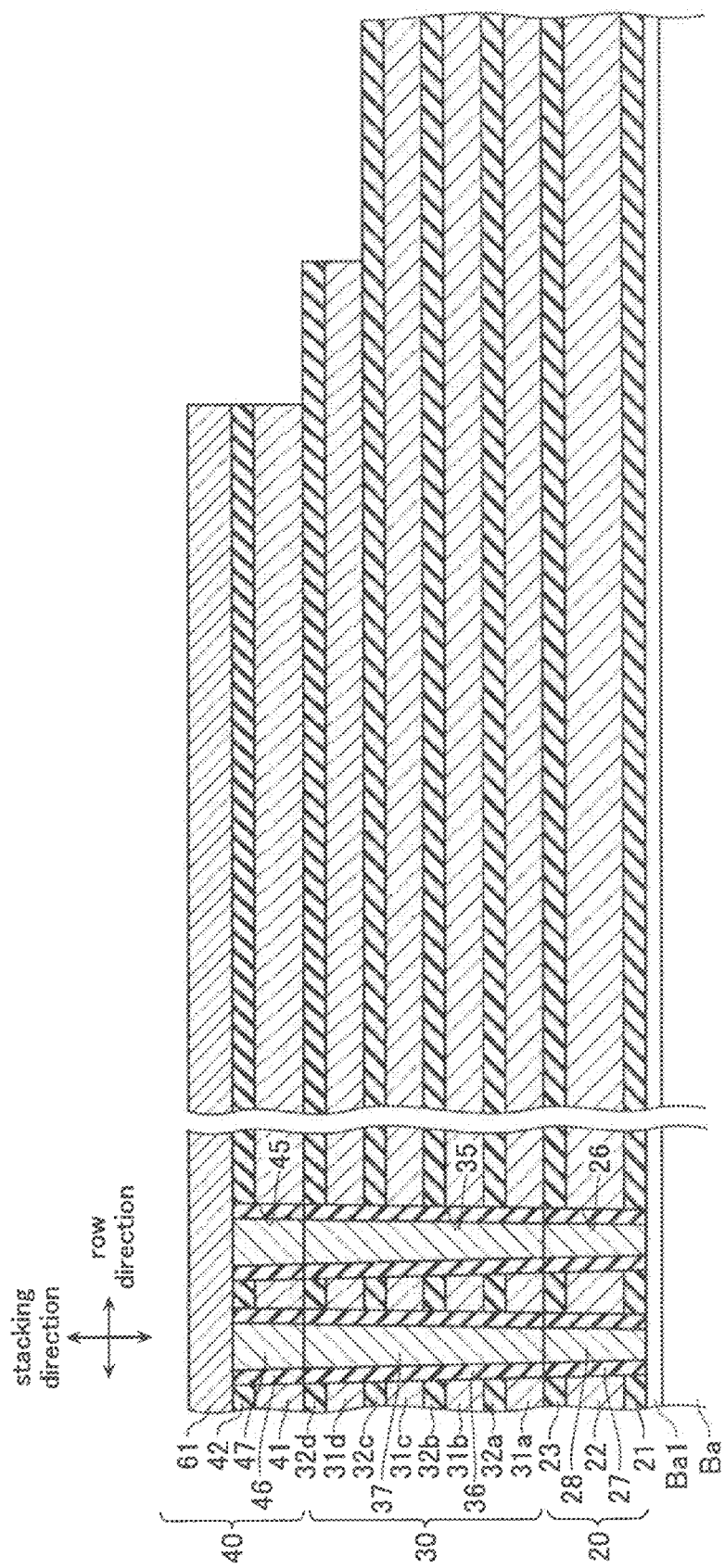
Figure 19:
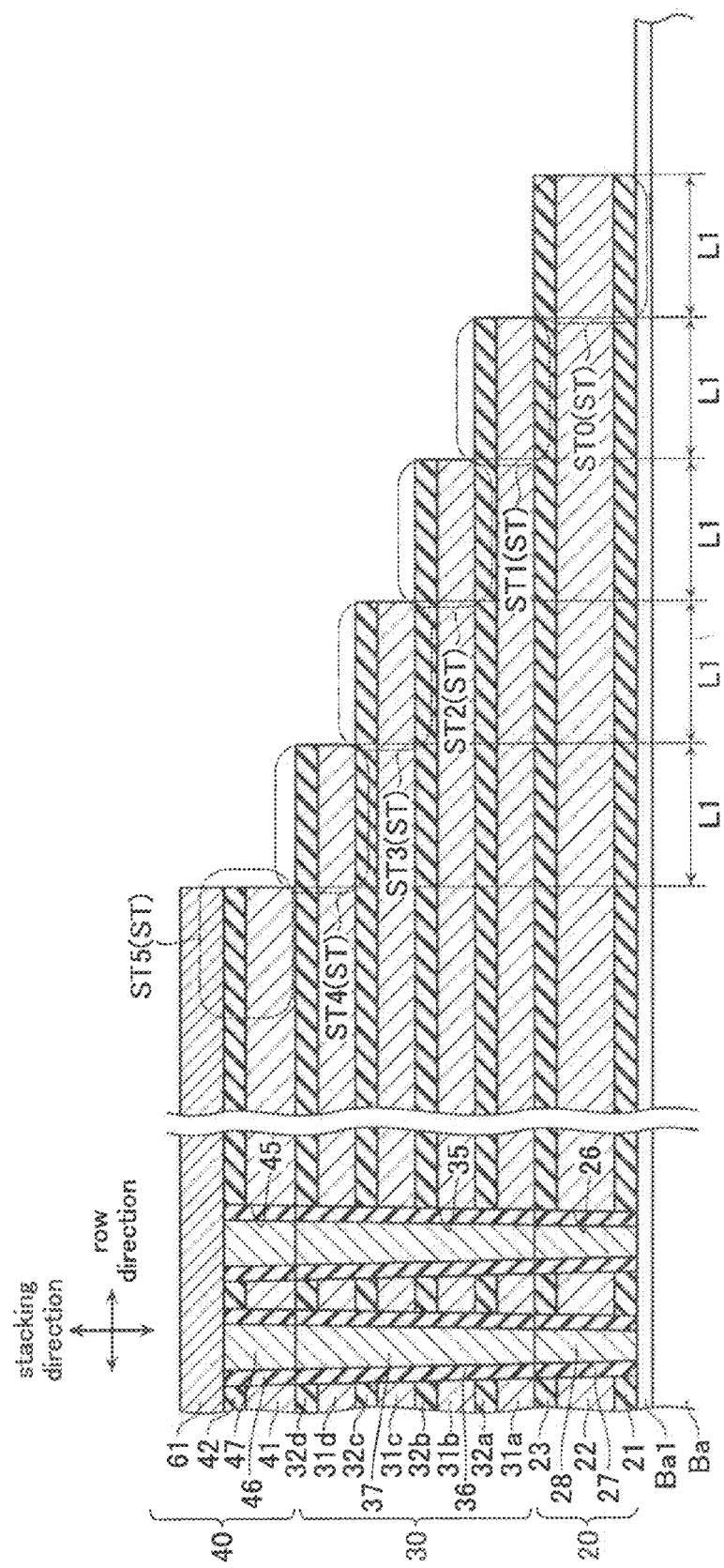

Next, resist 61 is formed on an upper layer of the drain side insulating layer 42, as shown in FIG. 15. The resist 61 is formed so that a portion of the upper surface of the drain side insulating layer 42 is exposed. Then, an etching is performed using the resist 61 as a mask, as shown in FIG. 16. Through this process, the portion of the drain side insulating layer 42 and the drain side conductive layer 41 not covered by the resist 61 is removed. Next, a slimming of the resist 61 in the row direction is performed, as shown in FIG. 17. Subsequently, an etching is performed, thereby removing a portion of the drain side insulating layer 42 and the drain side conductive layer 41 and a portion of the inter-word line insulating layer 32d and the word line conductive layer 31d not covered by the resist 61, as shown in FIG. 18. Then, the processes shown in FIGS. 17 and 18 are repeatedly performed, whereby a stacking structure shown in FIG. 19 configuring the stepped portion ST is formed.

Figure 20:
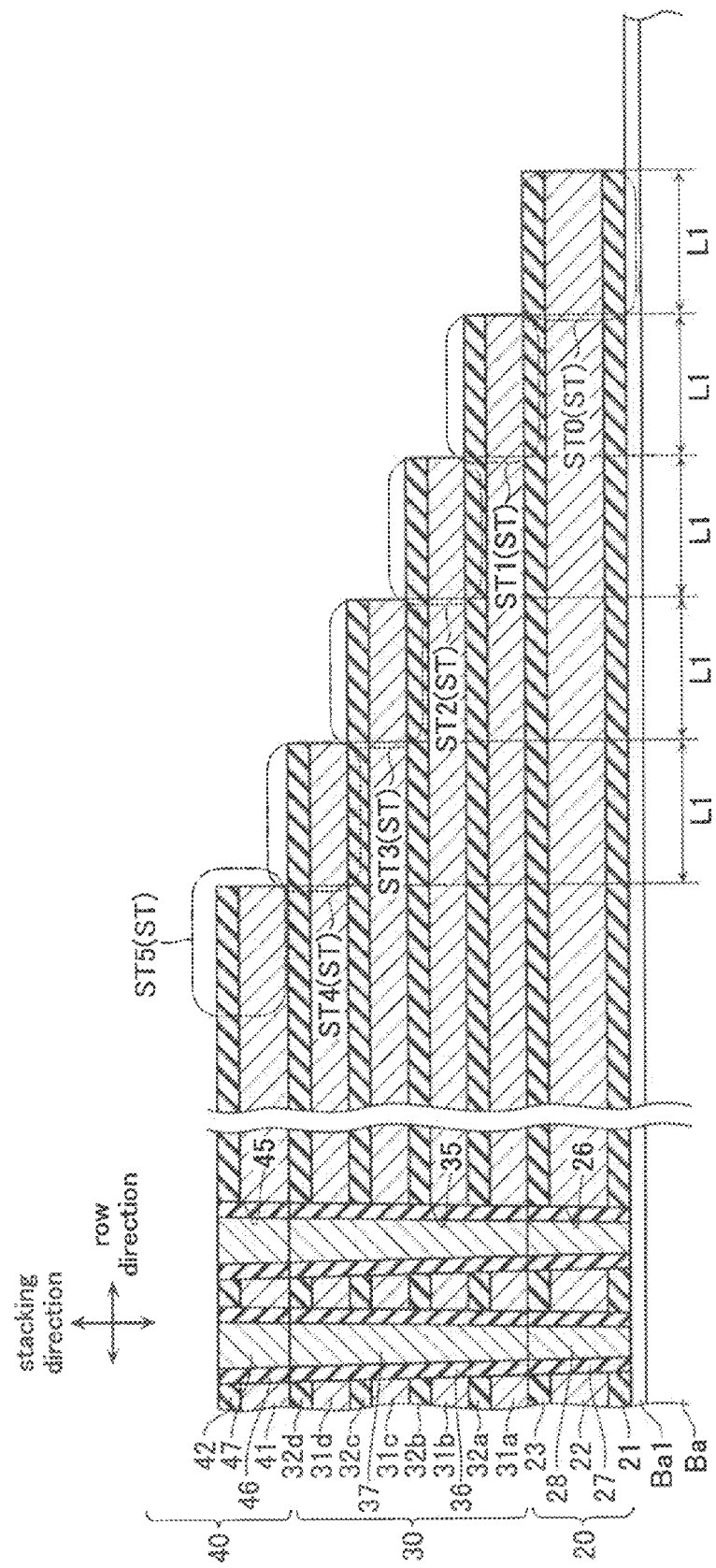
Figure 21:
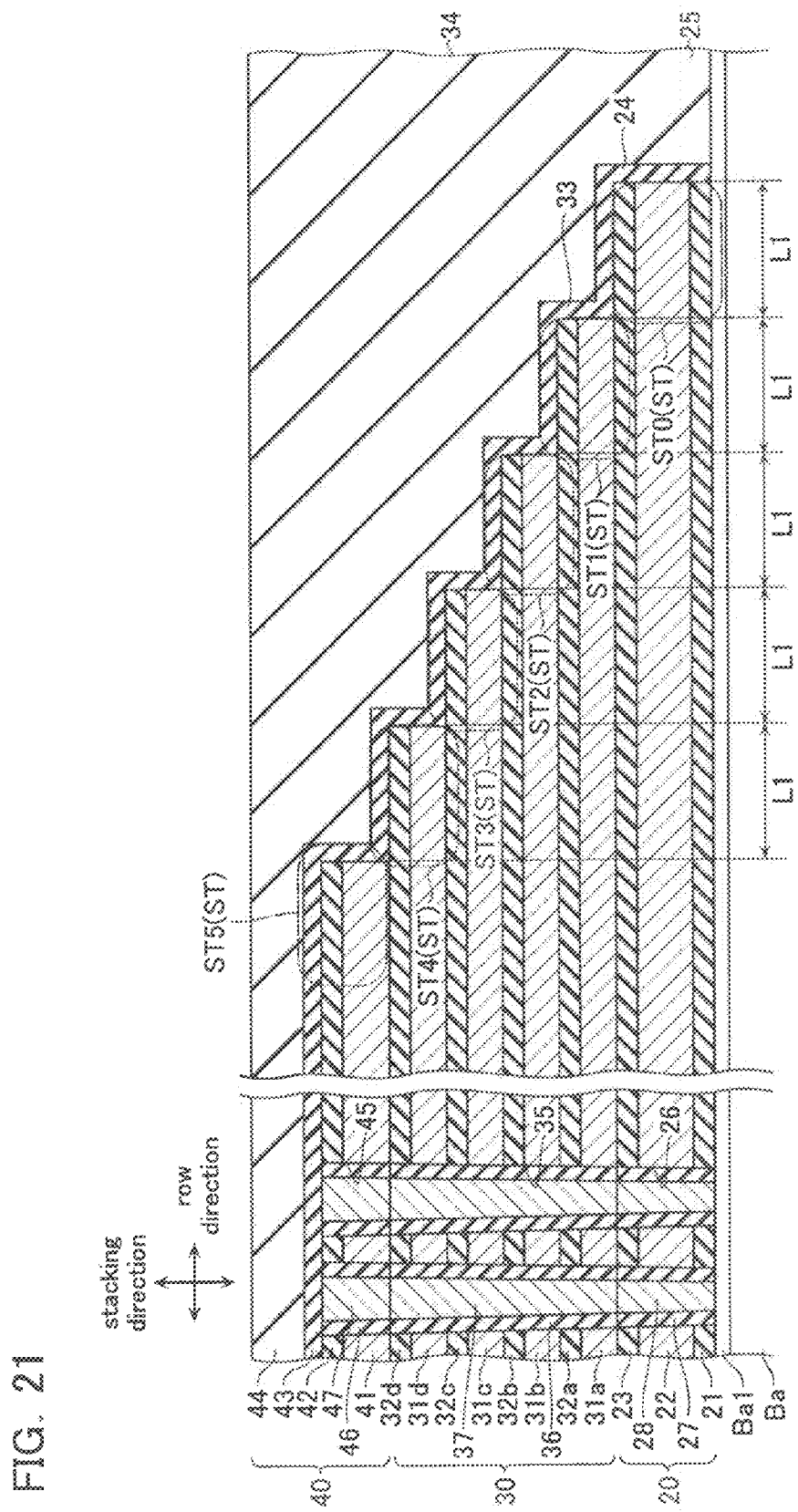

Next, the resist 61 is removed, as shown in FIG. 20. Then, CMP (Chemical Mechanical Polishing) is performed after depositing silicon nitride (SiN) and silicon oxide (SiO2), thereby forming the protective insulating layers 24, 33, and 43, and the interlayer insulating layers 25, 34, and 44, as shown in FIG. 21.

Figure 22:
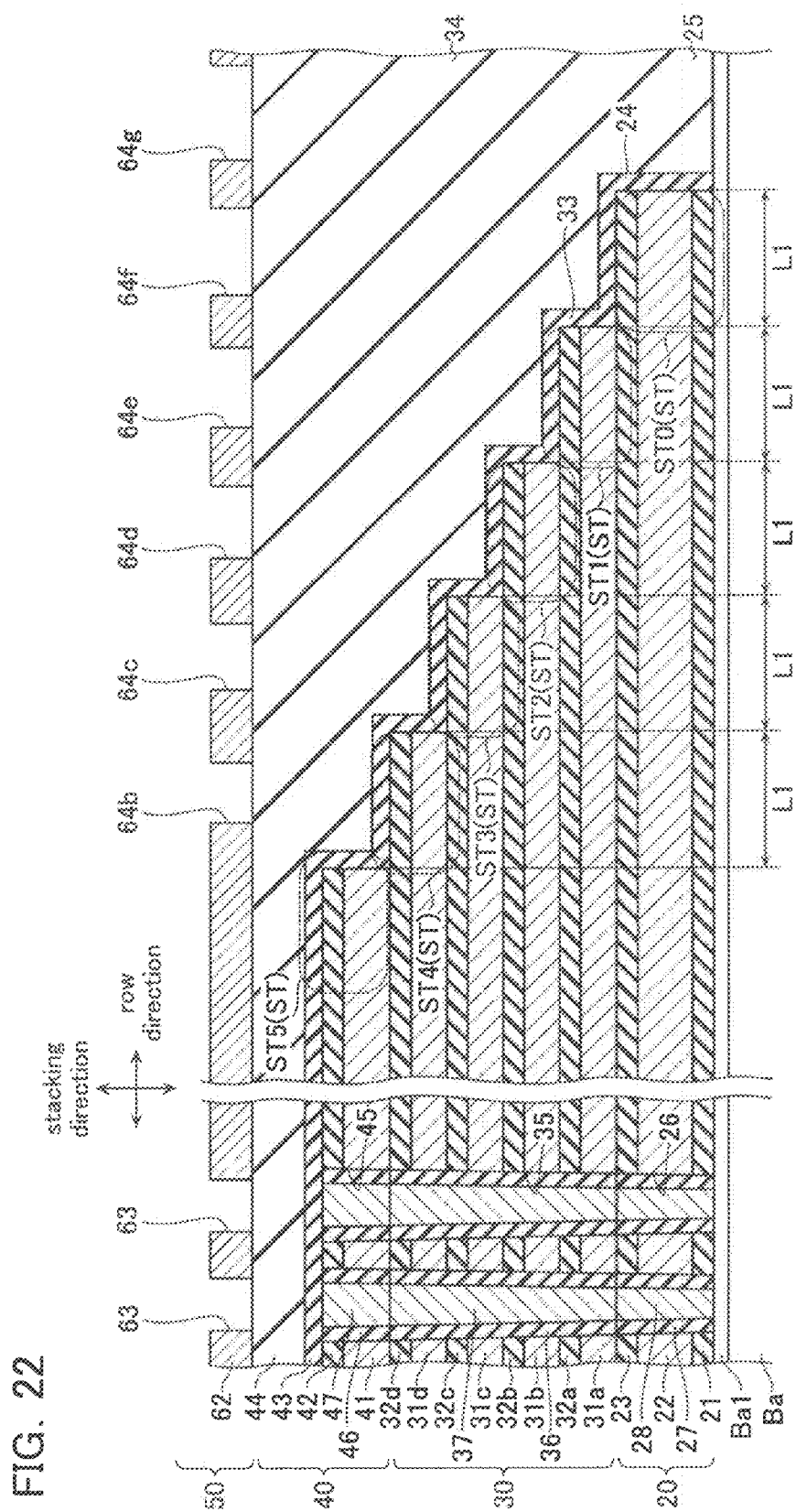

Subsequently, resist 62 is formed on the upper surface of the interlayer insulating layer 44, as shown in FIG. 22. The resist 62 includes holes 63 and 64a-64g. The resist 62 (holes 63 and 64a-64g) is for forming the aforementioned holes 57 and 58a-58g. The hole 63 is positioned directly above the drain side columnar semiconductor layer 47. The hole 64a (not shown) is positioned directly above the step ST5 of the drain side conductive layer 41. The hole 64b is positioned directly above the step ST4 of the word line conductive layer 31d. The hole 64c is positioned directly above the step ST3 of the word line conductive layer 31c. The hole 64d is positioned directly above the step ST2 of the word line conductive layer 31b. The hole 64e is positioned directly above the step ST1 of the word line conductive layer 31a. The hole 64f is positioned directly above the step ST0 of the source side conductive layer 22. The hole 64g is positioned in a region where the layers 20-40 are not formed.

Figure 23:
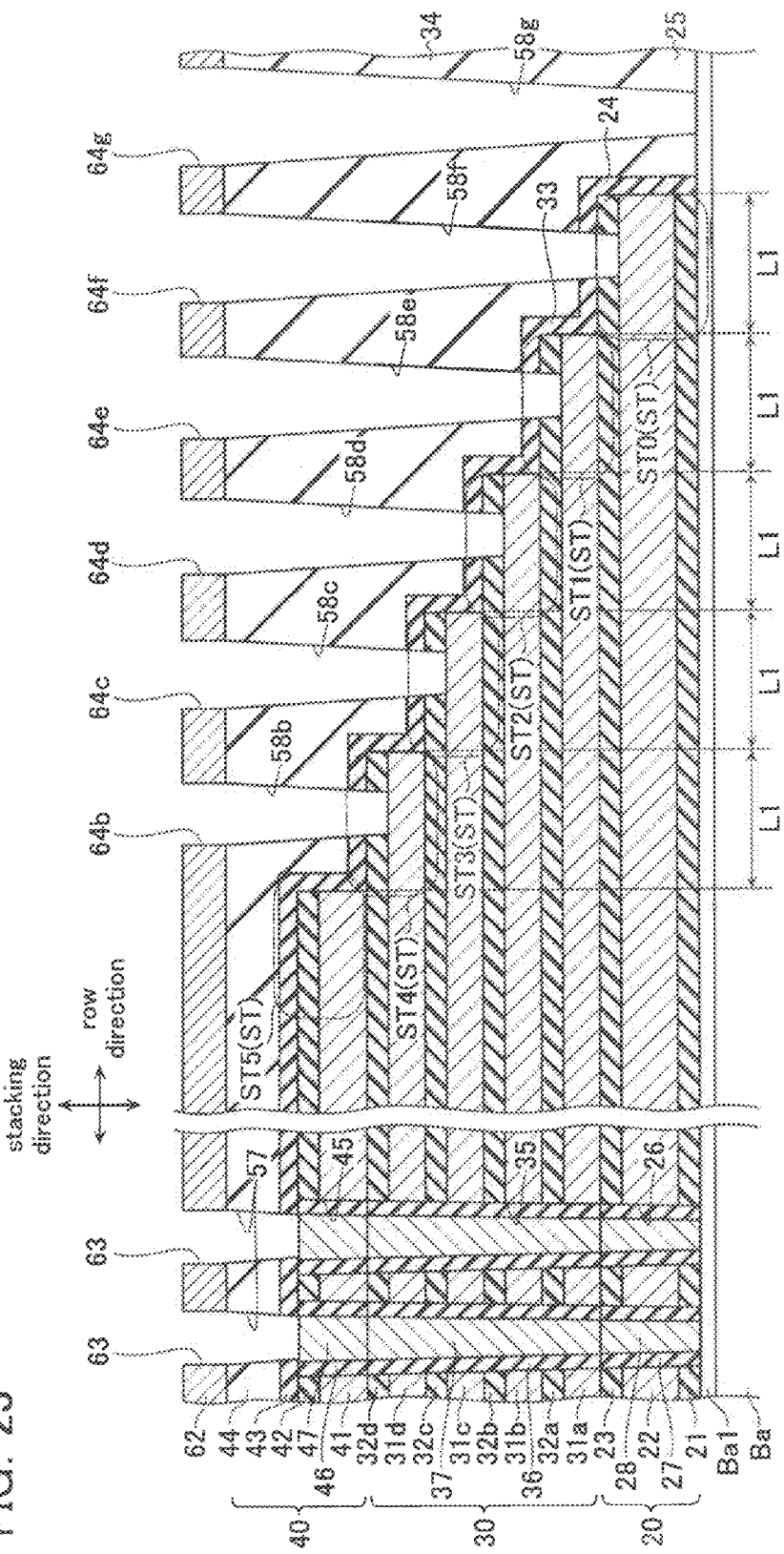

Next, an etching is performed using the resist 62 as a mask, as shown in FIG. 23. Through this process, the holes 57 and 58a-58g (symbol 58a not shown) corresponding to the holes 63 and 64a-64g are formed.

Figure 24:
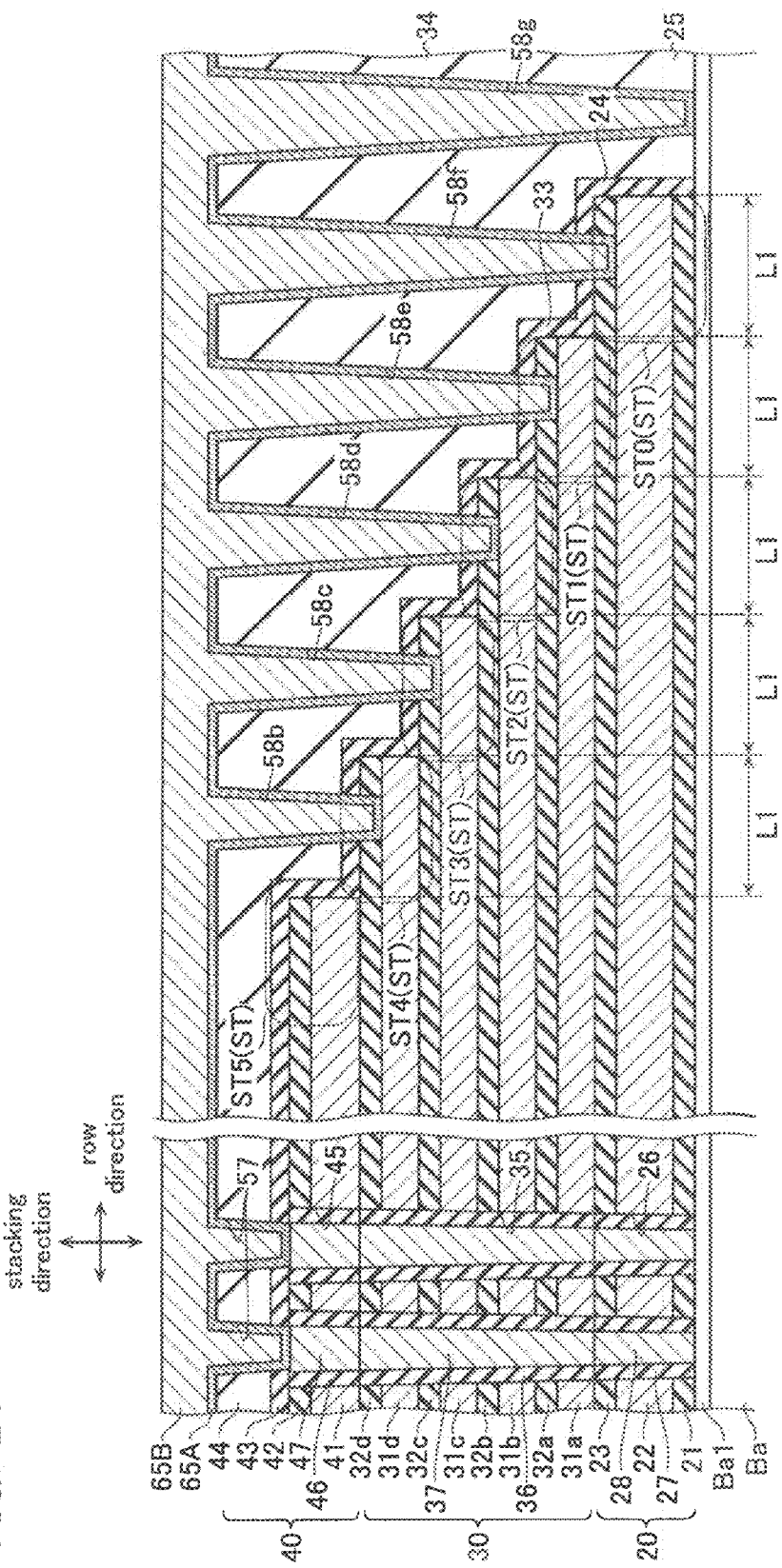

Then, after removing the resist 62, a layer 65A is deposited on a side surface of the holes 57 and 58a-58g, as shown in FIG. 24. The layer 65A is constituted by a metal such as tantalum (Ta), titanium (Ti), tungsten (W), ruthenium (Ru), or manganese (Mn), or from a metal compound thereof. The layer 65A is formed by sputtering or CVD. Additionally as shown in FIG. 24, a layer 65B is deposited on the layer 65A so as to fill the holes 57 and 58a-58g. The layer 65B is constituted by any of tungsten (W), copper (Cu), and aluminum (Al).

Figure 25:
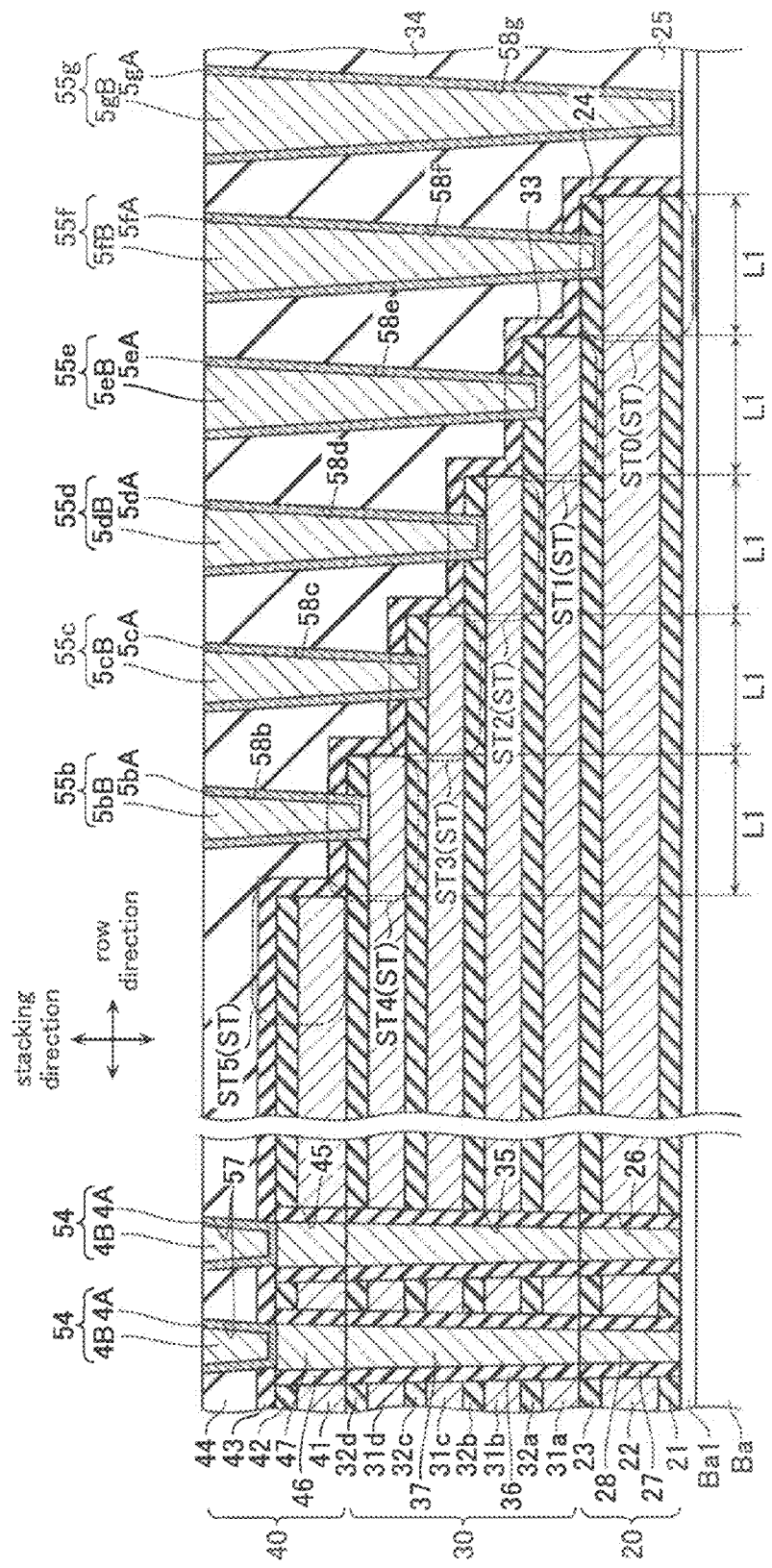

Next, CMP is performed to remove a portion of the layers 65A and 65B formed on the holes 57 and 58a-58g, thereby forming the first contact plug layer 54 and the second contact plug layers 55a-55g, as shown in FIG. 25.

Figure 26:
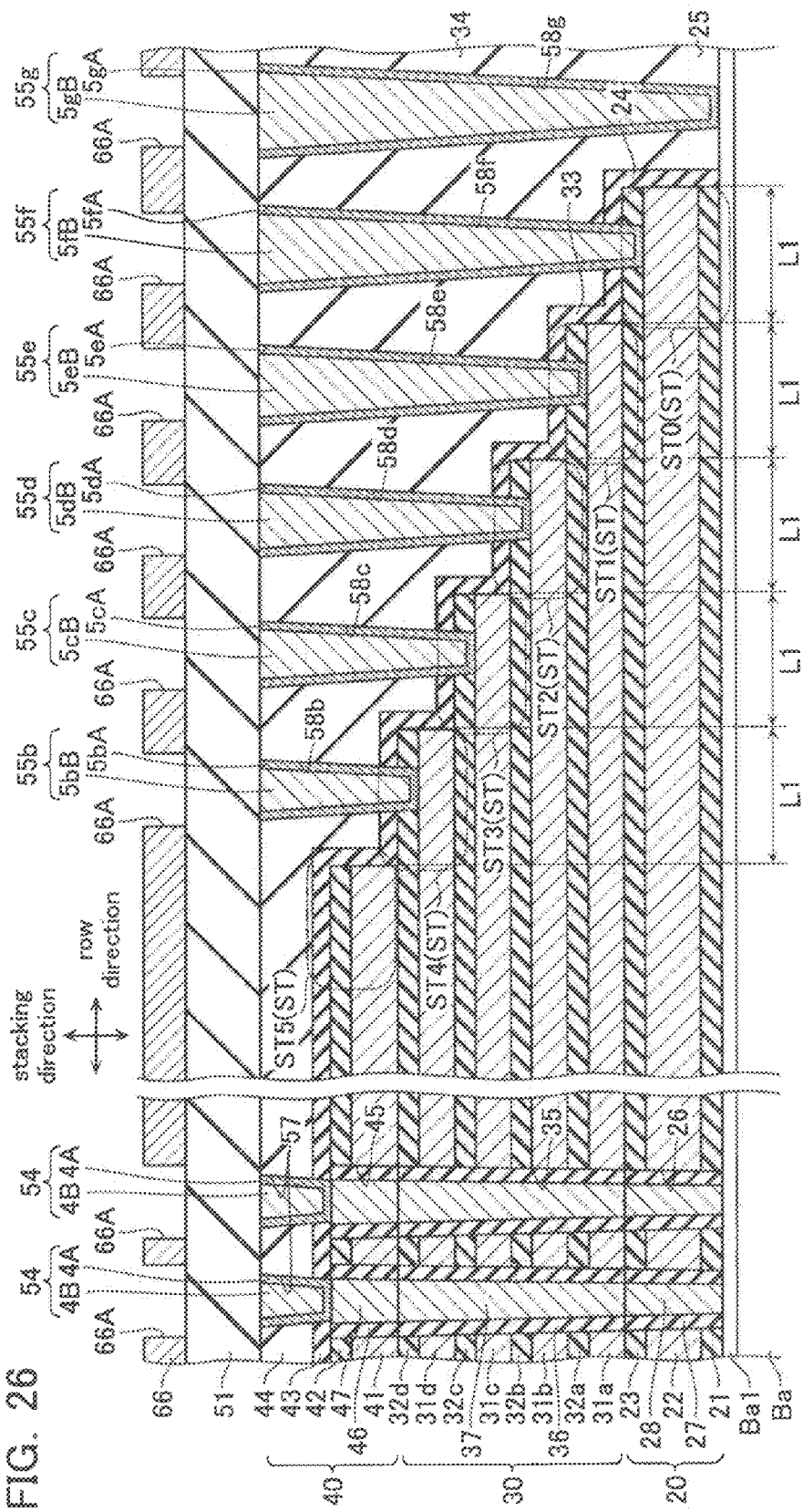

Subsequently, silicon oxide ($SiO_2$) is deposited to form the interlayer insulating layer 51, as shown in FIG. 26. Further as shown in FIG. 26, a resist 66 is formed on an upper surface of the interlayer insulating layer 51. The resist 66 includes a trench 66A. The resist 66 (trench 66A) is for forming the aforementioned trench 56.

Figure 27:
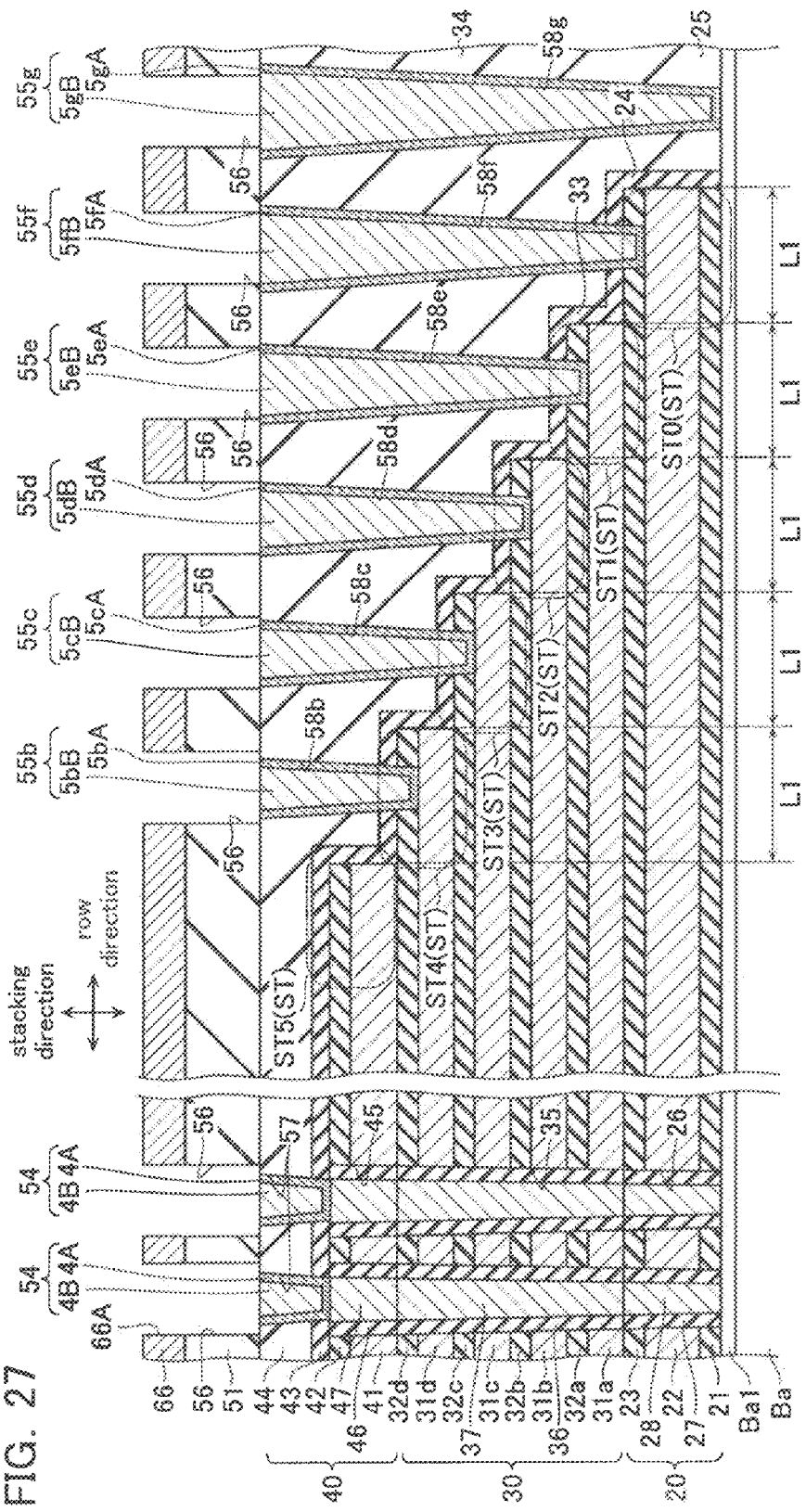
Figure 28:
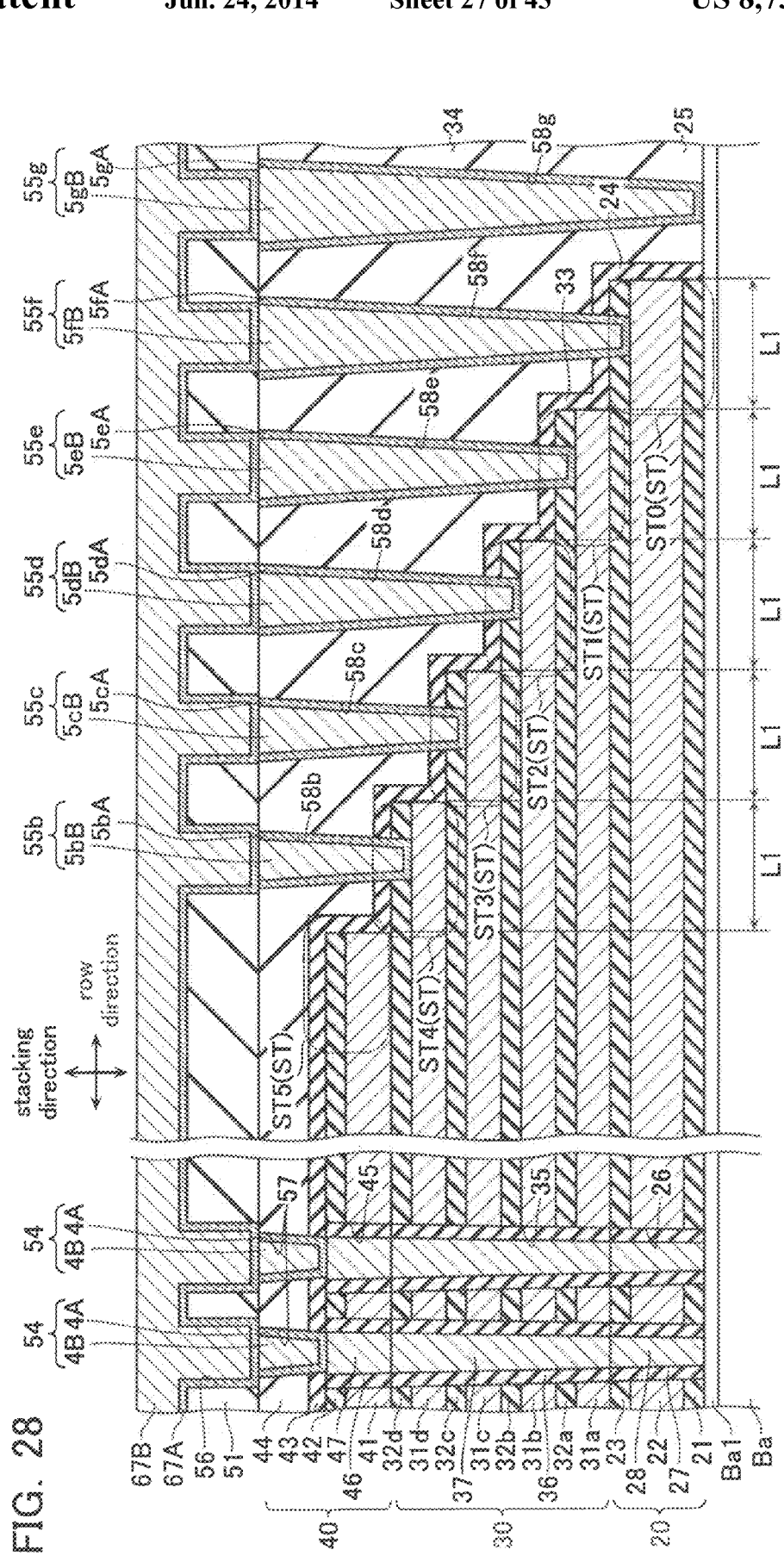

Next, an etching is performed using the resist 66 as a mask, as shown in FIG. 27. Through this process, the trench 56 corresponding to the trench 66A is formed. Then, after removing the resist 66, a layer 67A is deposited on a side surface facing the trench 56, as shown in FIG. 28. The layer 67A is constituted by a metal such as tantalum (Ta), titanium (Ti), tungsten (W), ruthenium (Ru), or manganese (Mn), or from a metal compound thereof. The layer 67A is formed by sputtering or CVD. Additionally as shown in FIG. 28, a layer 67B is deposited on the layer 67A so as to fill the trench 56. The layer 67B is constituted by any of tungsten (W), copper (Cu), and aluminum (Al).

Then, CMP is performed to remove a portion of the layers 67A and 67B formed on the trench 56. Subsequently, the first wiring layer 52 and the second wiring layers 53a-53g are formed, thereby completing formation of the nonvolatile semiconductor memory device 100 in accordance with the first embodiment shown in FIGS. 4 and 5.

(Advantages of the Nonvolatile Semiconductor Memory Device 100 in Accordance with the First Embodiment)

Next, advantages of the nonvolatile semiconductor memory device 100 in accordance with the first embodiment are described. The nonvolatile semiconductor memory device 100 in accordance with the first embodiment is capable of a high degree of integration as shown in the above-described stacking structure.

To describe the advantages of the nonvolatile semiconductor memory device 100 in accordance with the first embodiment, a comparative example is here considered. A nonvolatile semiconductor memory device in accordance with the comparative example includes a first contact plug layer and a plurality of second contact plug layers formed in a tapered shape in which a diameter thereof decreases from an upper end thereof to a lower end thereof. A length in the stacking direction of each of the plurality of second contact plug layers differs from one another. Moreover, all of the first and second contact plug layers has the same diameter at the upper ends thereof, but each have a diameter at the lower end thereof different from one another.

Thus, in the comparative example, a contact resistance of the second contact plug layers is non-uniform, due to difference in diameter of the lower end thereof.

Additionally in the comparative example, an etching speed (processing rate) during manufacture is uniform for all of the holes. Accordingly, in the above-described structure of the comparative example, it is difficult to perform etching of holes having depths equal to desired lengths of the second contact plug layers in the stacking direction.

That is, the holes are sometimes formed penetrating a desired word line conductive layer. Or, the holes sometimes do not reach the desired word line conductive layer.

Moreover, in the comparative example, the longer the second contact plug layer in the stacking direction, the smaller the diameter of the lower end thereof. That is, the longer the second contact plug layer in the stacking direction, the more difficult it becomes, during manufacture, to fill the hole with a conductive layer. Accordingly, voids (empty holes) are formed in the second contact plug layer causing the likes of poor conductivity or a large rise in the contact resistance.

In contrast, the nonvolatile semiconductor memory device 100 in accordance with the first embodiment includes the first contact plug layer 54 and the second contact plug layers 55a-55g formed in a tapered shape in which the diameter thereof decreases from the upper end thereof to the lower end thereof. The first contact plug layer 54 and the second contact plug layers 55a-55g have in common that the diameter of the lower end of each thereof is substantially a diameter $\phi 1$. In contrast, the first contact plug layer 54 and the second contact plug layers 55a-55g have a diameter of the upper end differing from one another, i.e., $\phi 2$ and $\phi 2a$-$\phi 2g$ ($\phi 2 < \phi 2a < \phi 2b < \phi 2c < \phi 2d < \phi 2e < \phi 2f < \phi 2g$).

That is, in the first embodiment, the first contact plug layer 54 and the second contact plug layers 55a-55g are configured having a uniform contact area with each of the diffusion layer Ba1, the source side conductive layer 22, the word line conductive layers 31a-31d, the drain side conductive layer 41, and the drain side columnar semiconductor layer 47. The nonvolatile semiconductor memory device in accordance with the first embodiment thus has a more uniform contact resistance than the above-described comparative example.

Additionally in the first embodiment, a diameter of the upper end of the holes 57 and 58a-58g is set so that it corresponds to the length of the first contact plug layer 54 and the second contact plug layers 55a-55g in the stacking direction. Here, the larger the diameter of the upper end of the holes 57 and 58a-58g, the faster the processing rate (speed) due to a loading effect of RIE. That is, in the first embodiment, the diameter of the upper end of the holes 57 and 58a-58g is used to regulate the processing rate, and, as a result, during manufacture, the holes 57 and 58a-58g can be formed to a desired depth with more certainty than in the above-described comparative example.

Further, in the first embodiment, a diameter of the lower end of the holes 57 and 58a-58g is equal to one another. Accordingly, in the nonvolatile semiconductor memory device in accordance with the first embodiment, filling of the holes 57 and 58a-58g during manufacture can be performed more easily than in the above-described comparative example, thereby enabling suppression of poor conductivity or a large rise in the contact resistance.

As is clear from the above, the nonvolatile semiconductor memory device 100 in accordance with the first embodiment can ensure a higher reliability compared to the comparative example.

Second Embodiment (Configuration of a Nonvolatile Semiconductor Memory Device in Accordance with a Second Embodiment)

Figure 29:
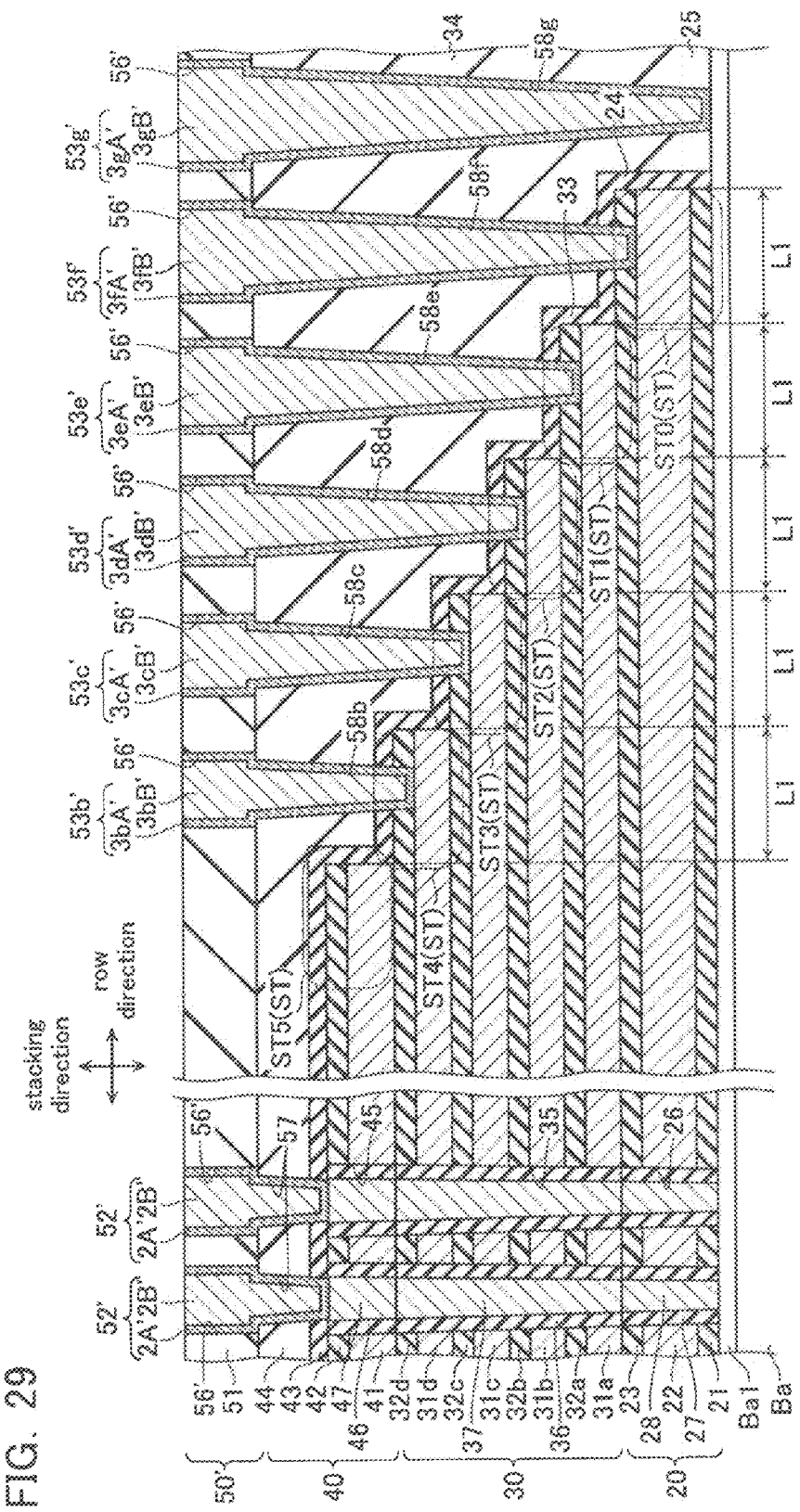
FIG. 29 is a cross-sectional view showing a nonvolatile semiconductor memory device in accordance with a second embodiment.

Next, a configuration of a nonvolatile semiconductor memory device in accordance with a second embodiment is described with reference to FIG. 29. FIG. 29 is a cross-sectional view showing the nonvolatile semiconductor memory device in accordance with the second embodiment. Note that in the second embodiment, identical symbols are assigned to configurations similar to those in the first embodiment and descriptions thereof are omitted.

The nonvolatile semiconductor memory device in accordance with the second embodiment includes a wiring layer 50' which differs from that of the first embodiment. The wiring layer 50' differs from the first embodiment (single-damascene structure) in having a dual-damascene structure. The wiring layer 50' includes a trench 56' which differs from that of the first embodiment. A width of the trench 56' in the row direction is formed larger than a diameter of each of the holes 57 and 58a-58g. Further, the wiring layer 50' includes a layer 52' in place of the first wiring layer and first contact plug layer 54 in the first embodiment. In addition, the wiring layer 50' includes layers 53a'-53g' in place of the second wiring layers 53a-53g and second contact plug layers 55a-55g in the first embodiment.

The layer 52' is formed so as to fill the hole 57 and the trench 56' in a continuous and integrated manner. The layer 52' includes a barrier metal layer 2A' and a metal layer 2B'. The barrier metal layer 2A' is formed in a continuous and integrated manner with a certain thickness on a side surface of the hole 57 and the trench 56'. The metal layer 2B' is formed so as to be in contact with the barrier metal layer 2A' and to fill the hole 57 and the trench 56' in a continuous and integrated manner.

The layers 53a'-53g' are formed so as to fill the holes 58a-58g and the trench 56' in a continuous and integrated manner. The layers 53a'-53g' include barrier metal layers 3aA'-3gA' and metal layers 3aB'-3gB'. The barrier metal layers 3aA'-3gA' are formed in a continuous and integrated manner with a certain thickness on a side surface of the holes 58a-58g and the trench 56'. The metal layers 3aB'-3gB' are formed so as to be in contact with the barrier metal layers 3aA'-3gA' and to fill the holes 58a-58g and the trench 56' in a continuous and integrated manner.

The barrier metal layers 2A' and 3aA'-3gA' are constituted from a metal such as tantalum (Ta), titanium (Ti), tungsten (W), ruthenium (Ru), or manganese (Mn), or from a metal compound thereof. The metal layers 2B' and 3aB'-3gB' are constituted by any of tungsten (W), copper (Cu), and aluminum (Al).

(Method of Manufacturing the Nonvolatile Semiconductor Memory Device in Accordance with the Second Embodiment)

Next, a method of manufacturing the nonvolatile semiconductor memory device in accordance with the second embodiment is described with reference to FIGS. 30-38. FIGS. 30-38 are cross-sectional views showing a manufacturing process of the nonvolatile semiconductor memory device in accordance with the second embodiment.

Figure 30:
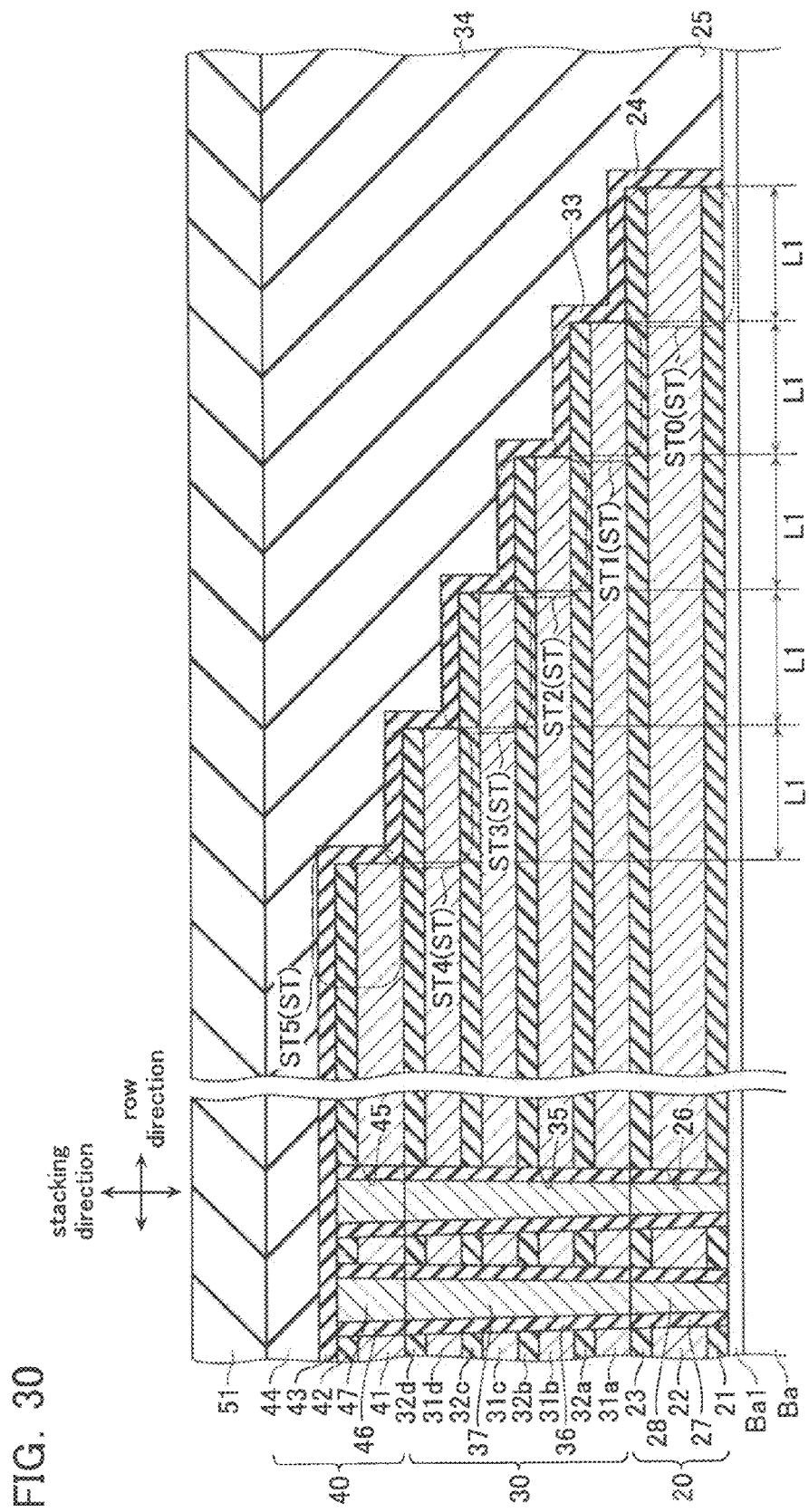
FIGS. 30-38 are cross-sectional views showing a manufacturing process of the nonvolatile semiconductor memory device in accordance with the second embodiment.

First, processes up to the process shown in FIG. 21 of the first embodiment are executed. Then, silicon oxide (SiO$_2$) is deposited on the interlayer insulating layer 44 to form the interlayer insulating layer 51, as shown in FIG. 30.

Figure 31:
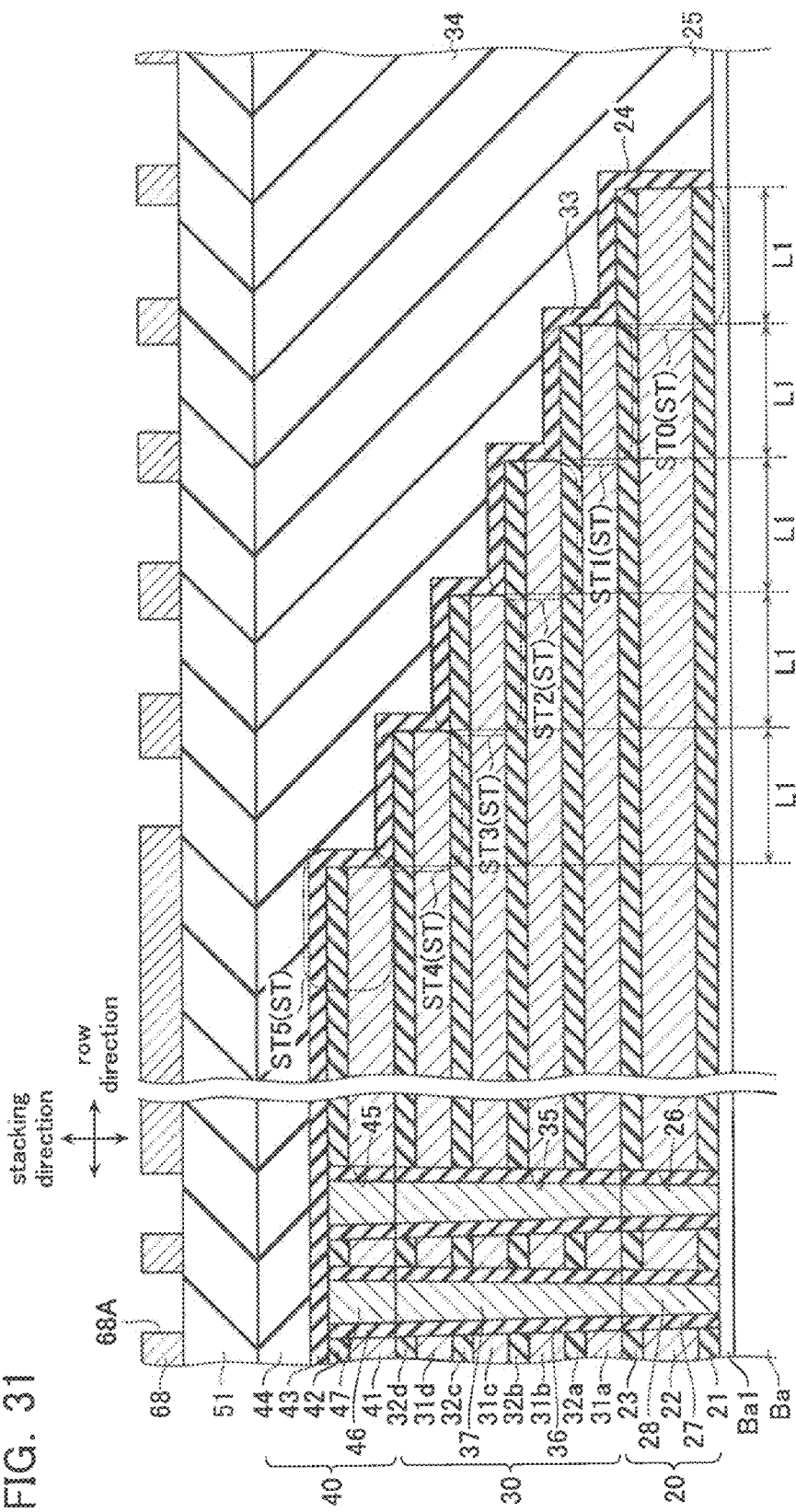

Next, resist 68 is formed on an upper surface of the interlayer insulating layer 51, as shown in FIG. 31. The resist 68 includes a hole 68A. The resist 68 (hole 68A) is for forming the aforementioned holes 57 and 58a-58g.

Figure 32:
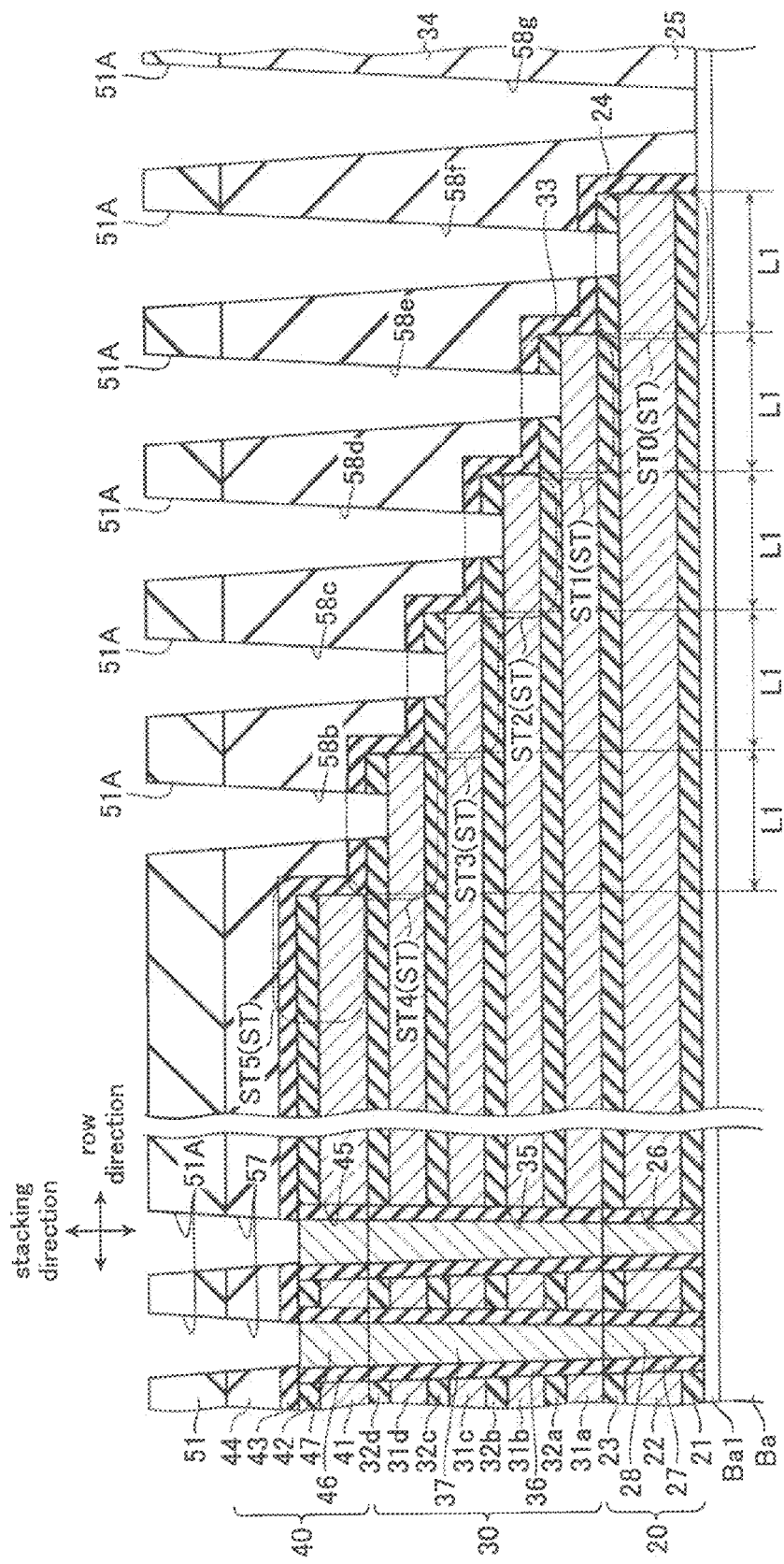

Next, an etching is performed using the resist 68 as a mask, as shown in FIG. 32. Through this process, the holes 57 and 58a-58g (symbol 58a not shown) corresponding to the hole 68A are formed. In addition, a hole 51A is formed so as to penetrate the interlayer insulating layer 51. The hole 51A is formed in a continuous and integrated manner with the hole 57. The hole 51A is formed in a continuous and integrated manner with each of the holes 58a-58g. Note that the resist 68 is removed after the etching.

Figure 33:
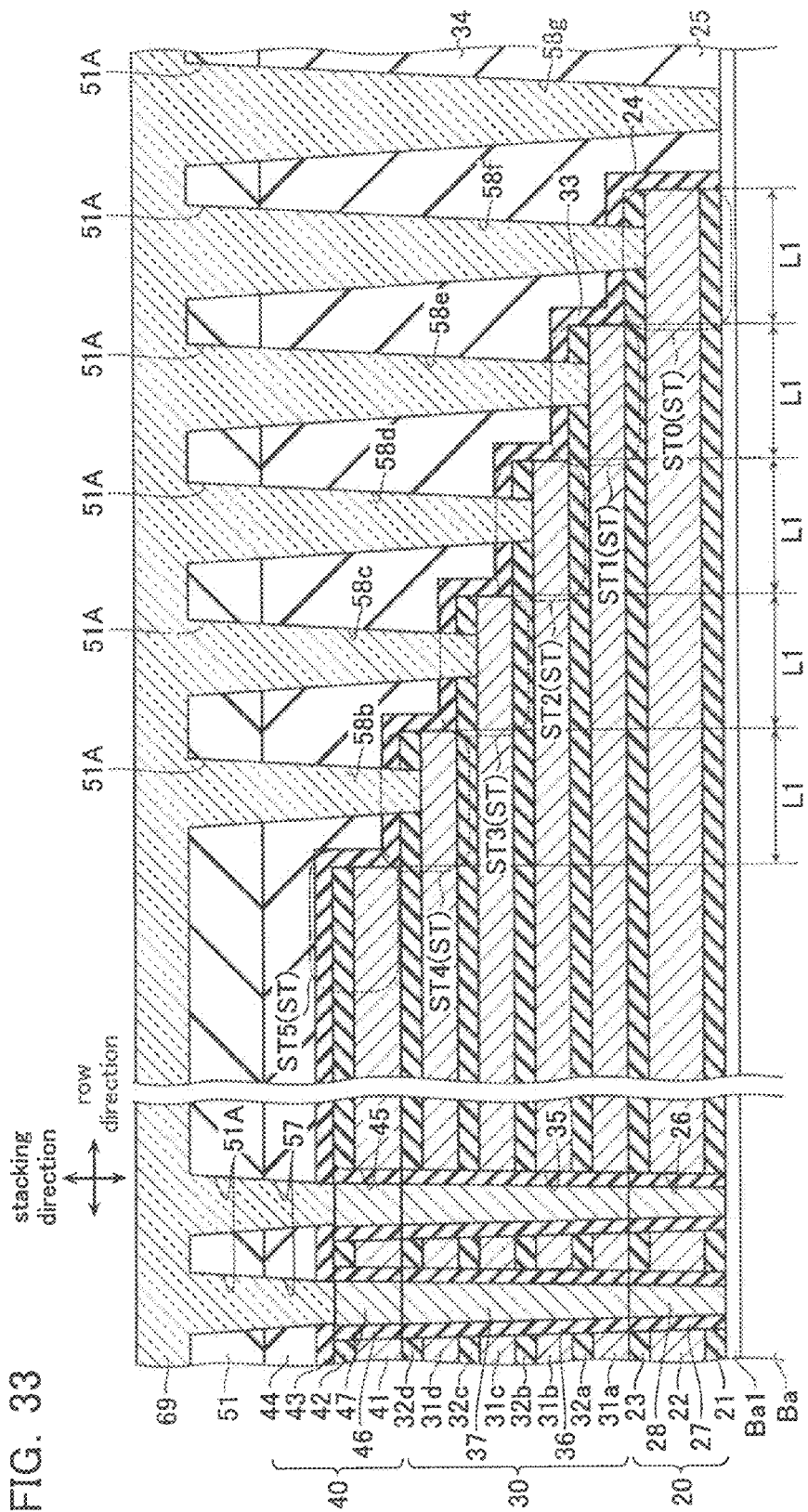
Figure 34:
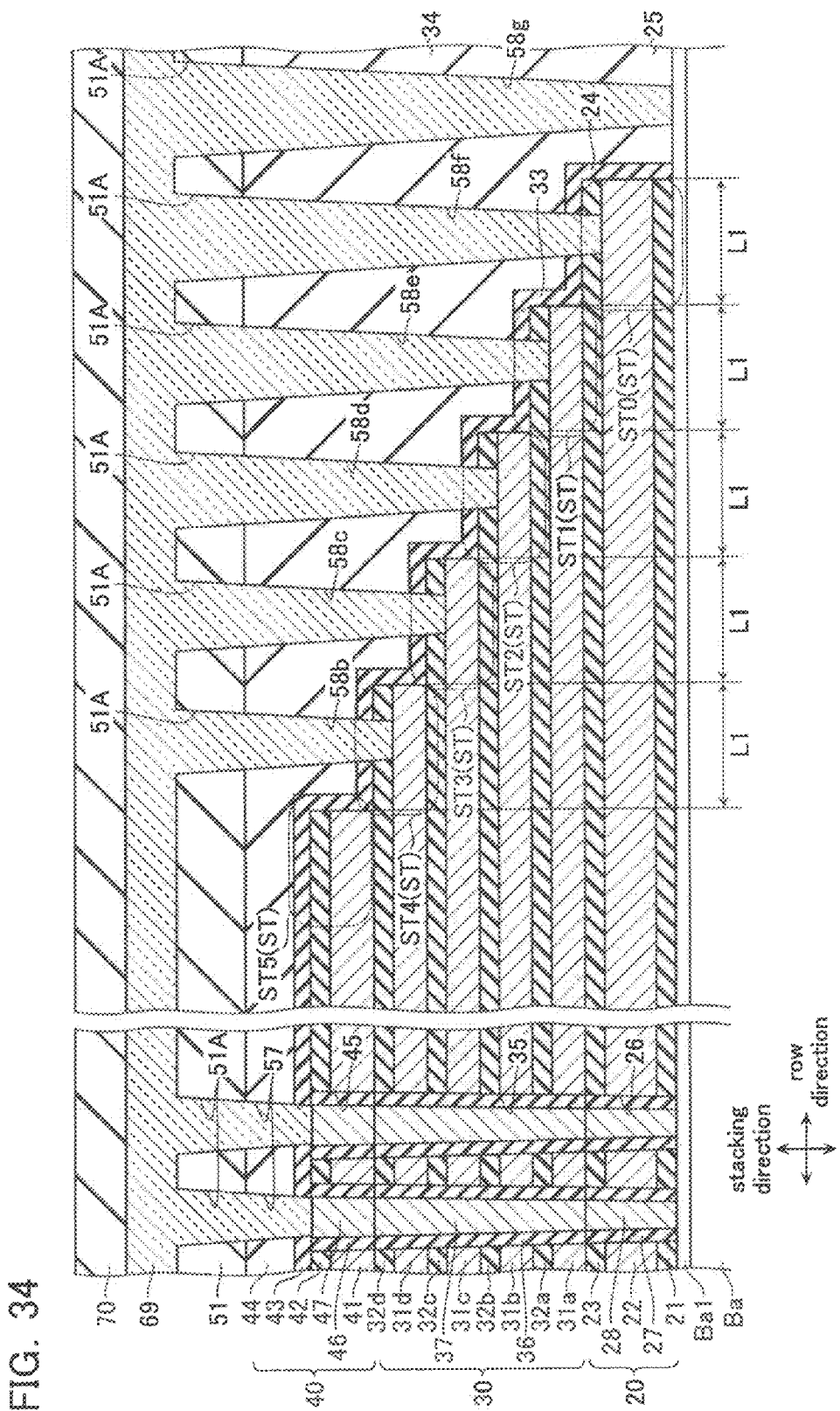

Subsequently, an organic-based material is deposited so as to fill the holes 51A, 57, and 58a-58g, thereby forming a sacrifice layer 69, as shown in FIG. 33. Next, silicon oxide (SiO$_2$) is deposited on the sacrifice layer 69 to form a stacking mask 70, as shown in FIG. 34. The stacking mask 70 is used for lithography and RIE processing of an upper layer wiring.

Figure 35:
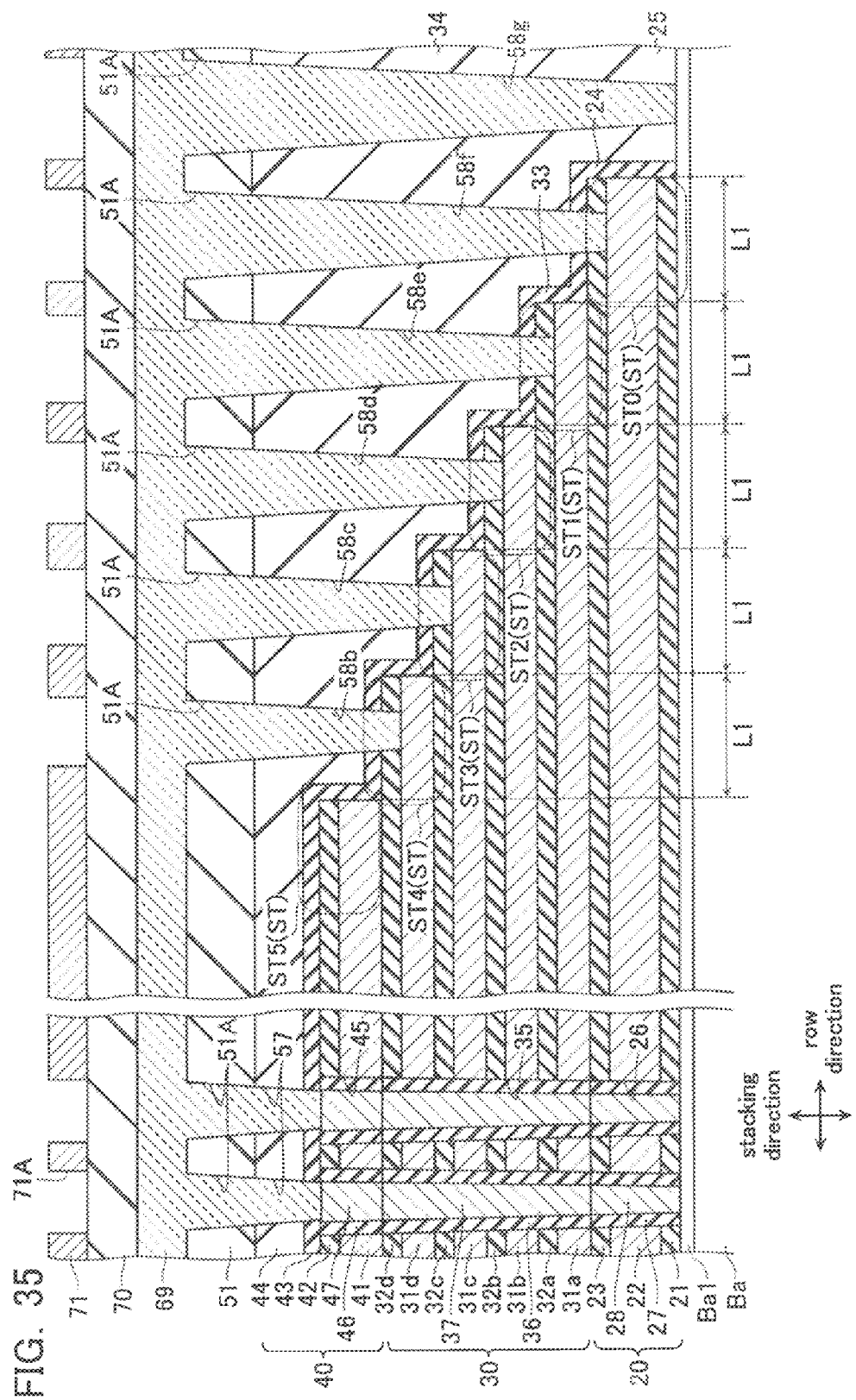

Then, resist 71 is formed on an upper surface of the stacking mask 70, as shown in FIG. 35. The resist 71 includes a trench 71A. The resist 71 (trench 71A) is used to form the aforementioned trench 56'.

Figure 36:
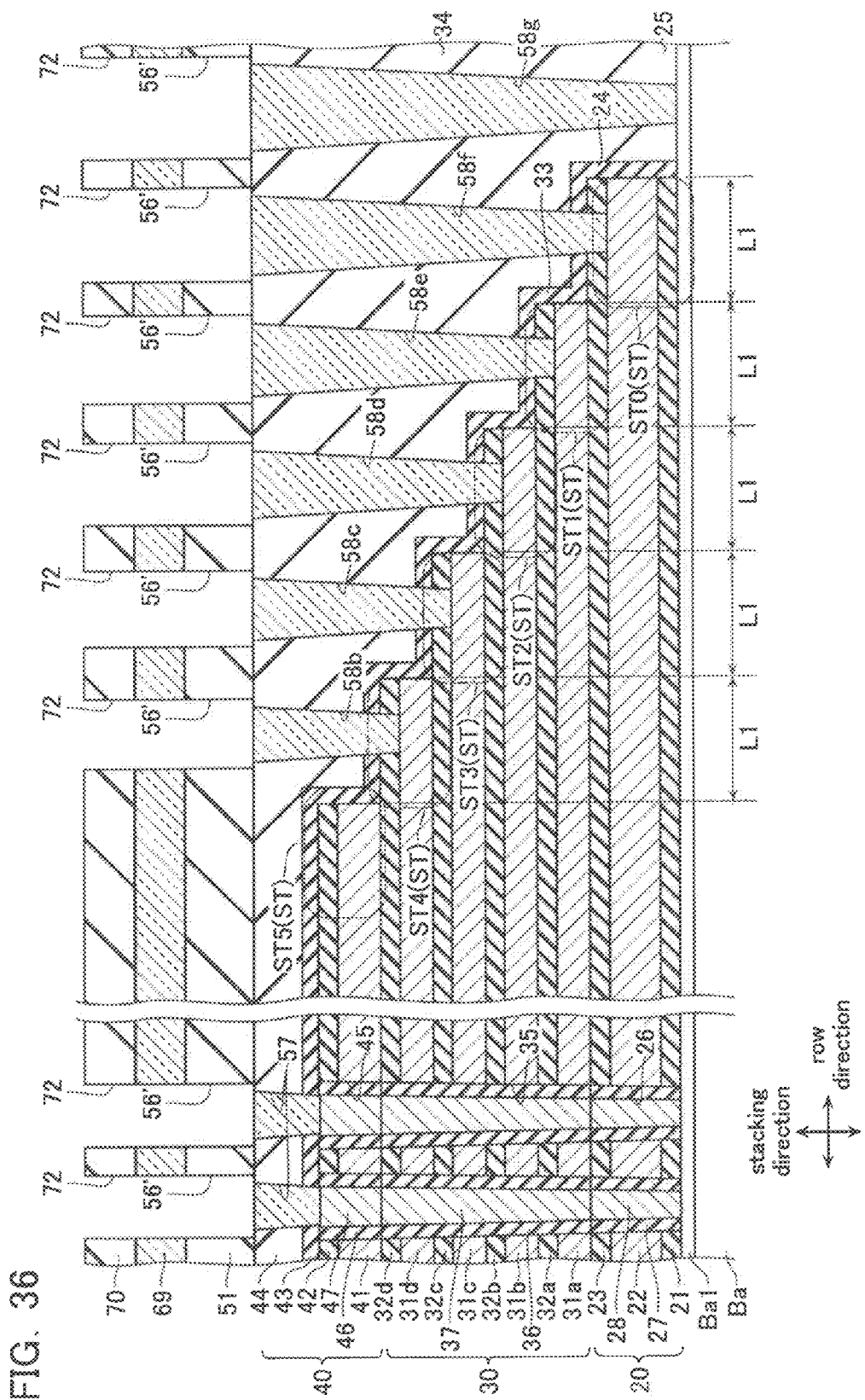

Next, an etching is performed using the resist 71 as a mask, as shown in FIG. 36. Through this process, a trench 56' corresponding to the trench 71A is formed. In addition, a trench 72 is formed so as to penetrate the stacking mask 70 and the sacrifice layer 69 formed therebelow. The trench 72 is formed in a continuous and integrated manner with the trench 56'.

Figure 37:
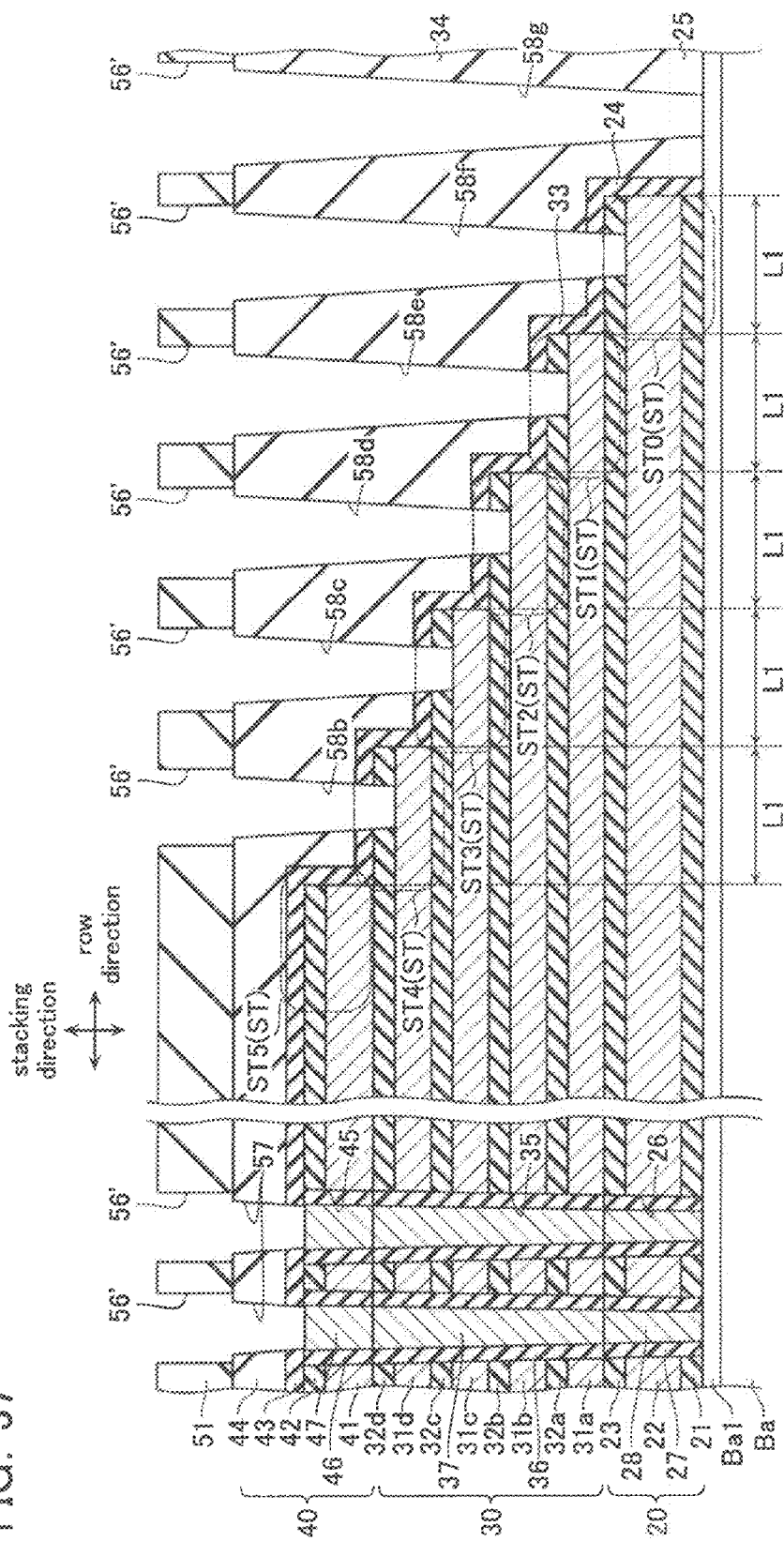
Figure 38:
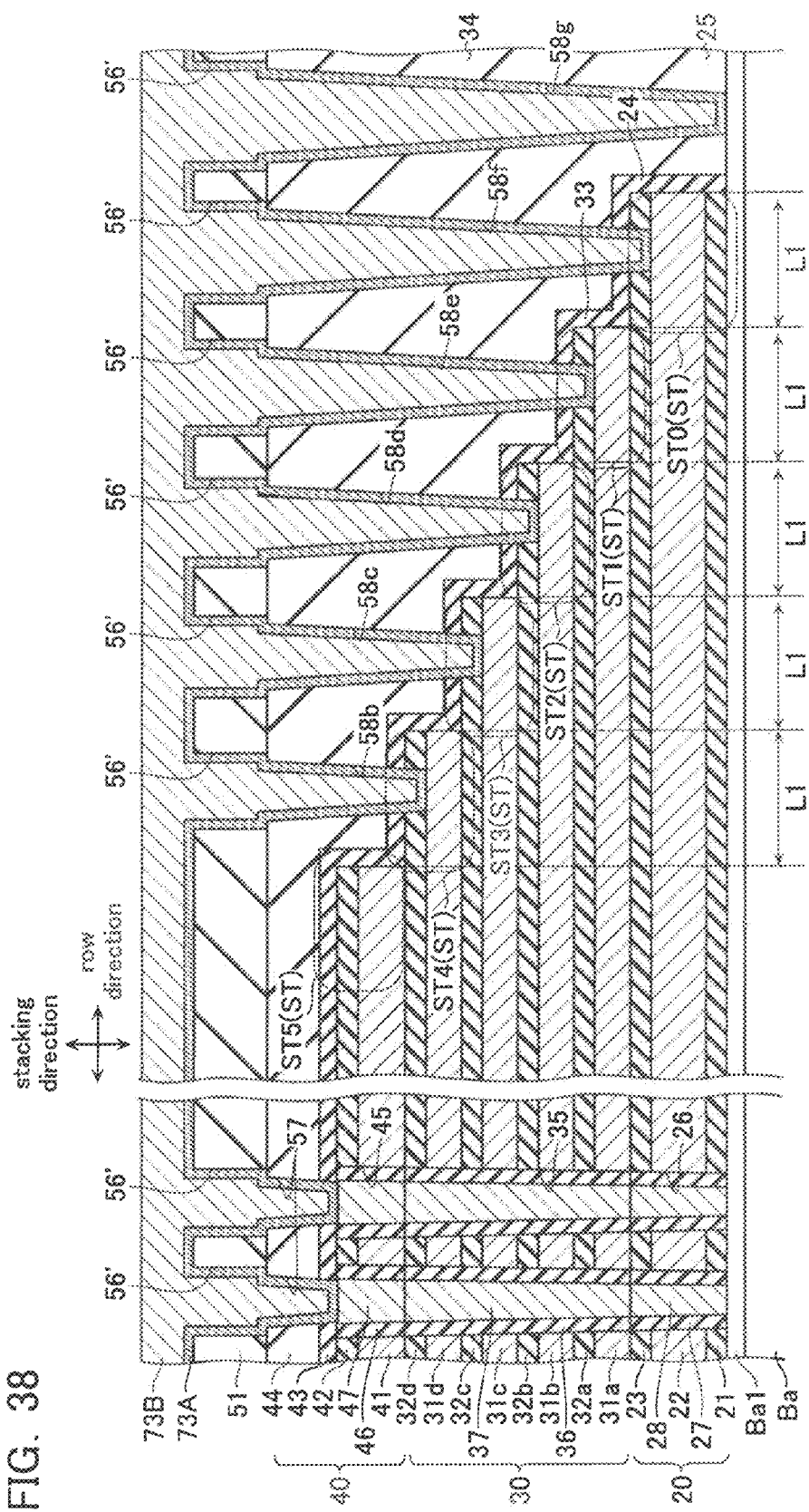

Subsequently, the stacking mask 70 and the sacrifice layer 69 are removed, as shown in FIG. 37. Next, a layer 73A is deposited in a continuous and integrated manner on a side surface of the holes 57 and 58a-58g, and the trench 56', as shown in FIG. 38. The layer 73A is constituted by a metal such as tantalum (Ta), titanium (Ti), tungsten (W), ruthenium (Ru), or manganese (Mn), or from a metal compound thereof. Furthermore, as shown in FIG. 38, a layer 73B is deposited on the layer 73A so as to fill the holes 57 and 58a-58g, and the trench 56'. The layer 73B is constituted by any of tungsten (W), copper (Cu), and aluminum (Al). Then, CMP is performed, similarly to the first embodiment, thereby completing formation of the nonvolatile semiconductor memory device in accordance with the second embodiment shown in FIG. 29.

(Advantages of the Nonvolatile Semiconductor Memory Device in Accordance with the Second Embodiment)

Next, advantages of the nonvolatile semiconductor memory device in accordance with the second embodiment are described. The nonvolatile semiconductor memory device in accordance with the second embodiment includes similar features to the first embodiment, and displays similar advantages to the first embodiment.

The nonvolatile semiconductor memory device in accordance with the first embodiment here includes the first and second contact plug layers 54 and 55a-55g in the holes 57 and 58a-58g, and the first and second wiring layers 52 and 53a-53g in the trench 56.

In contrast, the nonvolatile semiconductor memory device in accordance with the second embodiment includes the layer 52' and the layers 53a'-53g' formed in a continuous and integrated manner with the holes 57 and 58a-58g, and the trench 56'. Accordingly, in the second embodiment, the barrier metal layer is not formed in a bottom of the trench 56'. Thus, the nonvolatile semiconductor memory device in accordance with the second embodiment enables the contact resistance to be lowered more than in the first embodiment.

In addition, the method of manufacturing the nonvolatile semiconductor memory device in accordance with the second embodiment forms the layer 52' and the layers 53a'-53g' in a continuous and integrated manner with the holes 57 and 58a-58g, and the trench 56'. Thus, in the method of manufacturing the nonvolatile semiconductor memory device in accordance with the second embodiment, a number of processes can be reduced and a manufacturing cost thereby lowered more than in the first embodiment.

Note that in the second embodiment a width of the trench 56' is preferably made identical to or greater than the diameter of the upper end of the holes 57 and 58a-58g. This is because, by so doing, the layer 52' and the layers 53a'-53g' can be easily formed in a continuous and integrated manner with the holes 57 and 58a-58g, and the trench 56'.

Third Embodiment (Configuration of a Nonvolatile Semiconductor Memory Device in Accordance with a Third Embodiment)

Figure 39:
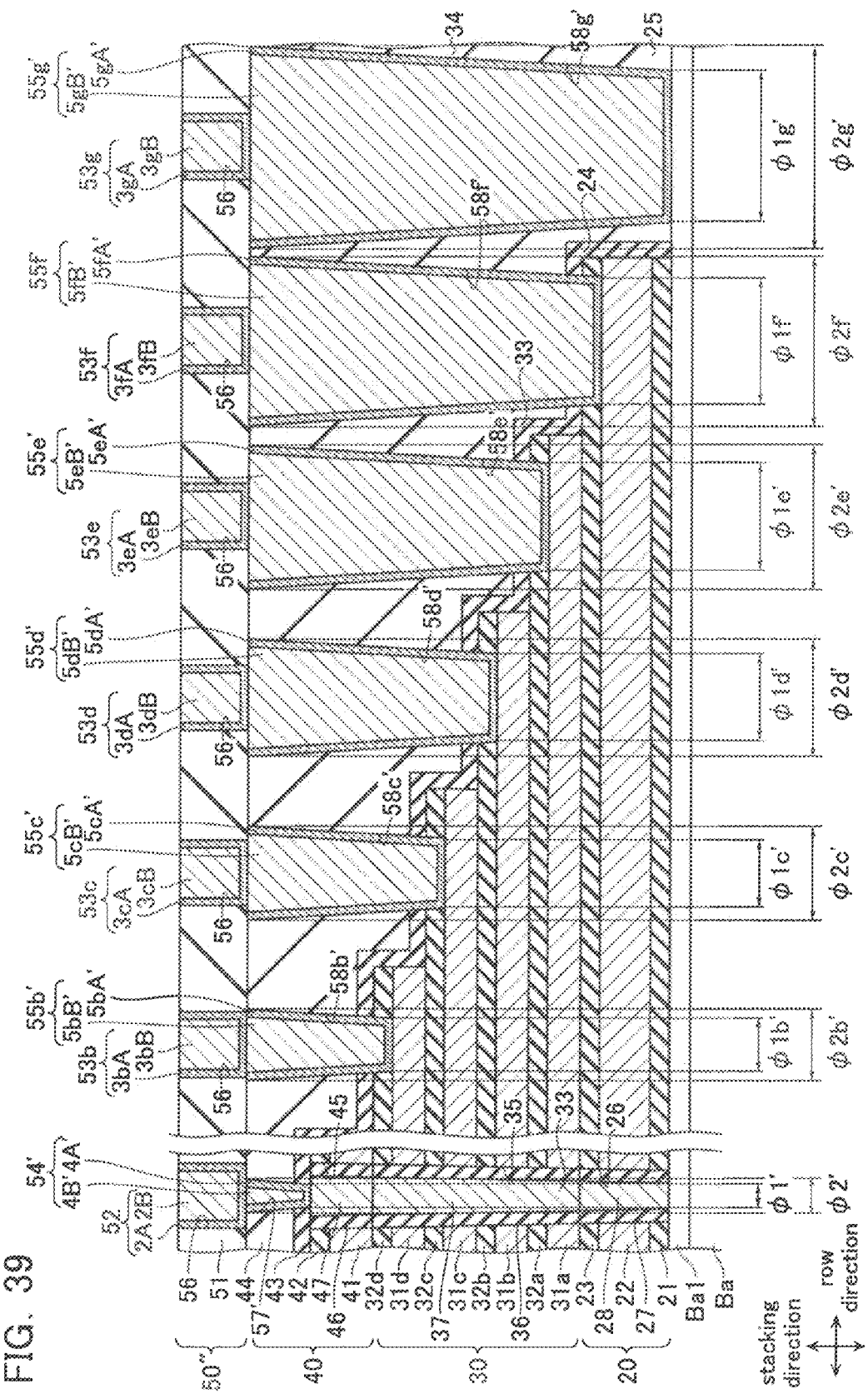
FIG. 39 is a cross-sectional view showing a nonvolatile semiconductor memory device in accordance with a third embodiment.

Next, a configuration of a nonvolatile semiconductor memory device in accordance with a third embodiment is described with reference to FIG. 39. FIG. 39 is a cross-sectional view showing the nonvolatile semiconductor memory device in accordance with the third embodiment. Note that in the third embodiment, identical symbols are assigned to configurations similar to those in the first and second embodiments and descriptions thereof are omitted.

The nonvolatile semiconductor memory device in accordance with the third embodiment includes a wiring layer 50" which differs from those of the first and second embodiments. The wiring layer 50" includes a first contact plug layer 54' and second contact plug layers 55a'-55g' which differ from those of the first embodiment.

The first contact plug layer 54' and the second contact plug layers 55a'-55g' each have a different diameter and are formed such that an aspect ratio (height of layer/diameter of lower end of layer) is constant. That is, a diameter of a lower end of the first contact plug layer 54' and the second contact plug layers 55a'-55g' ($\phi 1' < \phi 1a' < \phi 1b' < \phi 1c' < \phi 1d' < \phi 1e' < \phi 1f' < \phi 1g'$) is determined by the height of the respective layer. In addition, the first contact plug layer 54' and the second contact plug layers 55a'-55g' are formed in a tapered shape having a common inclination angle. Accordingly, a diameter of an upper end of the first contact plug layer 54' and the second contact plug layers 55a'-55g' ($\phi 2' < \phi 2a' < \phi 2b' < \phi 2c' < \phi 2d' < \phi 2e' < \phi 2f' < \phi 2g'$) is determined by the diameter of the respective lower end.

Note that the first contact plug layer 54' and the second contact plug layers 55a'-55g' are formed so as to fill holes 57' and 58a'-58g' which differ from those of the first embodiment. Moreover, the first contact plug layer 54' and the second contact plug layers 55a'-55g' include barrier metal layers 4A' and 5aA'-5gA' and metal layers 4B' and 5aB'-5gB', similarly to the first embodiment.

(Advantages of the Nonvolatile Semiconductor Memory Device in Accordance with the Third Embodiment)

Next, advantages of the nonvolatile semiconductor memory device in accordance with the third embodiment are described. The nonvolatile semiconductor memory device in accordance with the third embodiment includes similar features to the first embodiment, and displays similar advantages to the first embodiment.

In addition, the nonvolatile semiconductor memory device in accordance with the third embodiment includes the first contact plug layer 54' and the second contact plug layers 55a'-55g' formed such that the aspect ratio (height of layer/diameter of lower end of layer) is constant. The first contact plug layer 54' and the second contact plug layers 55a'-55g' here have a resistance which is determined by a length in the stacking direction and a cross-sectional area thereof. Consequently, in the nonvolatile semiconductor memory device in accordance with the third embodiment, a shape resulting from the above-described aspect ratio enables the contact resistance, which includes the resistance of the first contact plug layer 54' and the second contact plug layers 55a'-55g' themselves, to be made uniform.

Fourth Embodiment (Configuration of a Nonvolatile Semiconductor Memory Device in Accordance with a Fourth Embodiment)

Figure 40:
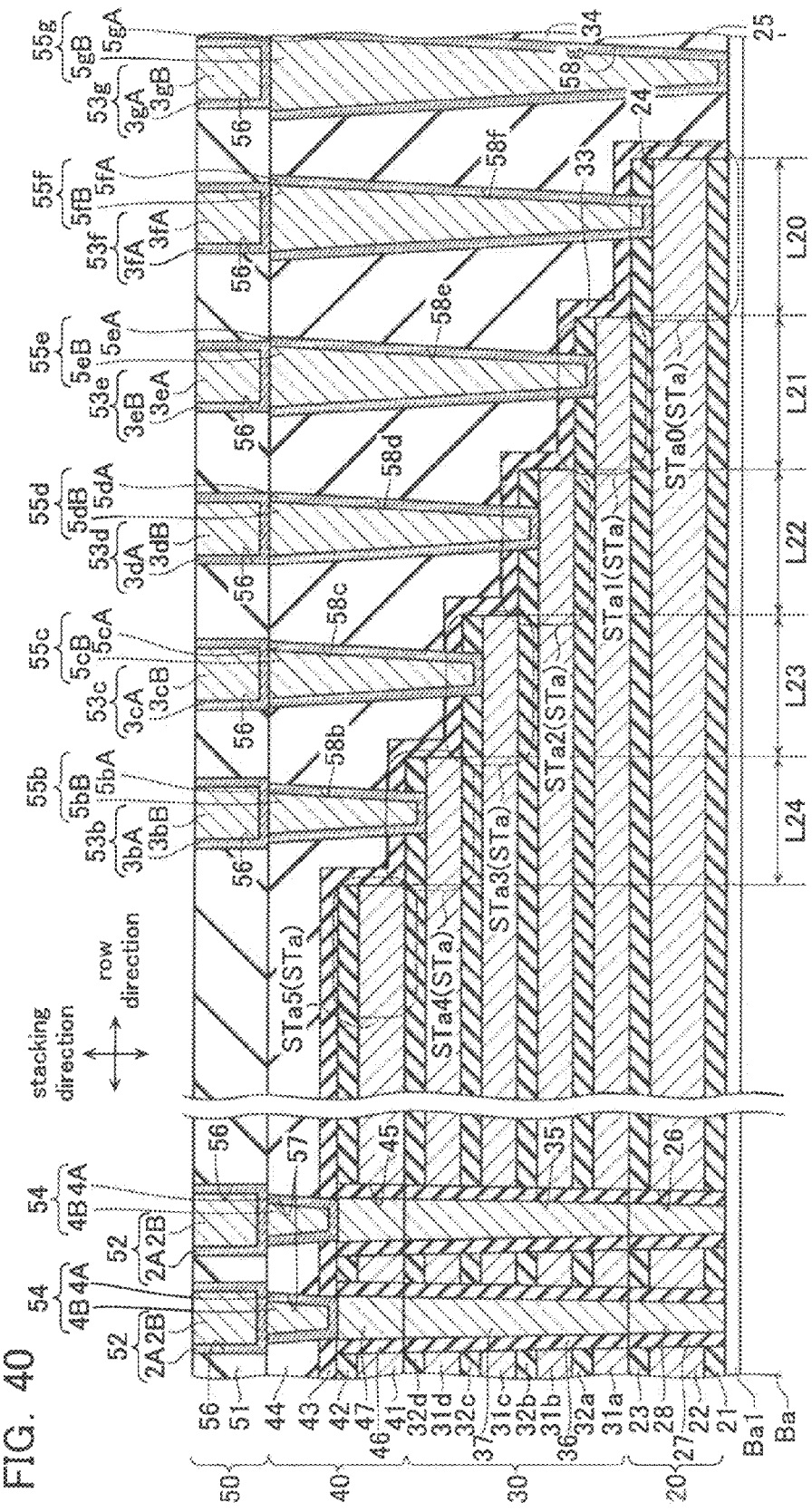
FIG. 40 is a cross-sectional view showing a nonvolatile semiconductor memory device in accordance with a fourth embodiment.

Next, a configuration of a nonvolatile semiconductor memory device in accordance with a fourth embodiment is described with reference to FIG. 40. FIG. 40 is a cross-sectional view showing the nonvolatile semiconductor memory device in accordance with the fourth embodiment. Note that in the fourth embodiment, identical symbols are assigned to configurations similar to those in the first through third embodiments and descriptions thereof are omitted.

The nonvolatile semiconductor memory device in accordance with the fourth embodiment includes a stepped portion STa which differs from that of the first embodiment, as shown in FIG. 40. The stepped portion STa includes steps STa0-STa5 which differ from those of the first embodiment. The step STa0 is configured by the end in the row direction of the source side first insulating layer 21, the source side conductive layer 22, and the source side second insulating layer 23, similarly to the first embodiment. In addition, the steps STa1-STa4 are configured by the end in the row direction of the word line conductive layers 31a-31d and the inter-word line insulating layers 32a-32d. Further, the step STa5 is configured by the end in the row direction of the drain side conductive layer 41 and the drain side insulating layer 42.

The steps STa0-STa4 have a width in the row direction which differs from one another, namely certain widths L20-L24 (L20>L21>L22>L23>L24). That is, the width L20 of the step STa0 is greater than the width L21 of the step STa1 (layer above the step STa0); the width L21 of the step STa1 is greater than the width L22 of the step STa2 (layer above the step STa1); the width L22 of the step STa2 is greater than the width L23 of the step STa3 (layer above the step STa2); and the width L23 of the step STa3 is greater than the width L24 of the step STa4 (layer above the step STa3).

(Advantages of the Nonvolatile Semiconductor Memory Device in Accordance with the Fourth Embodiment)

The nonvolatile semiconductor memory device in accordance with the fourth embodiment includes the steps STa0-STa4 having the certain widths L20-L24 (L20>L21>L22>>L24). Thus, in the nonvolatile semiconductor memory device in accordance with the fourth embodiment, the second contact plug layers 55b-55g can be disposed with a sufficient spacing therebetween, compared with the first embodiment. As a result, a short circuit caused by mutual contact of the second contact plug layers 55b-55g can be curbed in the nonvolatile semiconductor memory device in accordance with the fourth embodiment. That is, the nonvolatile semiconductor memory device in accordance with the fourth embodiment can be made more reliable than the first embodiment.

More specifically, when a number of the steps stacked increases, it may happen that lithography becomes impossible, due to adjacent second contact plug layers overlapping with each other. Moreover, if the second contact plug layers, although not overlapping, are too close to each other, there is a possibility that lithography resolution is reduced and patterning cannot be successfully performed. Furthermore, in the case that the second contact plug layers are too close to each other, it becomes impossible to dispose a dummy auxiliary pattern to improve the lithography resolution, thereby lowering the lithography resolution in this case also. The above problems can be solved by the nonvolatile semiconductor memory device in accordance with the fourth embodiment, since a physical spacing of the second contact plug layers 55b-55g can be set as described above.

Fifth Embodiment (Configuration of a Nonvolatile Semiconductor Memory Device in Accordance with a Fifth Embodiment)

Figure 41:
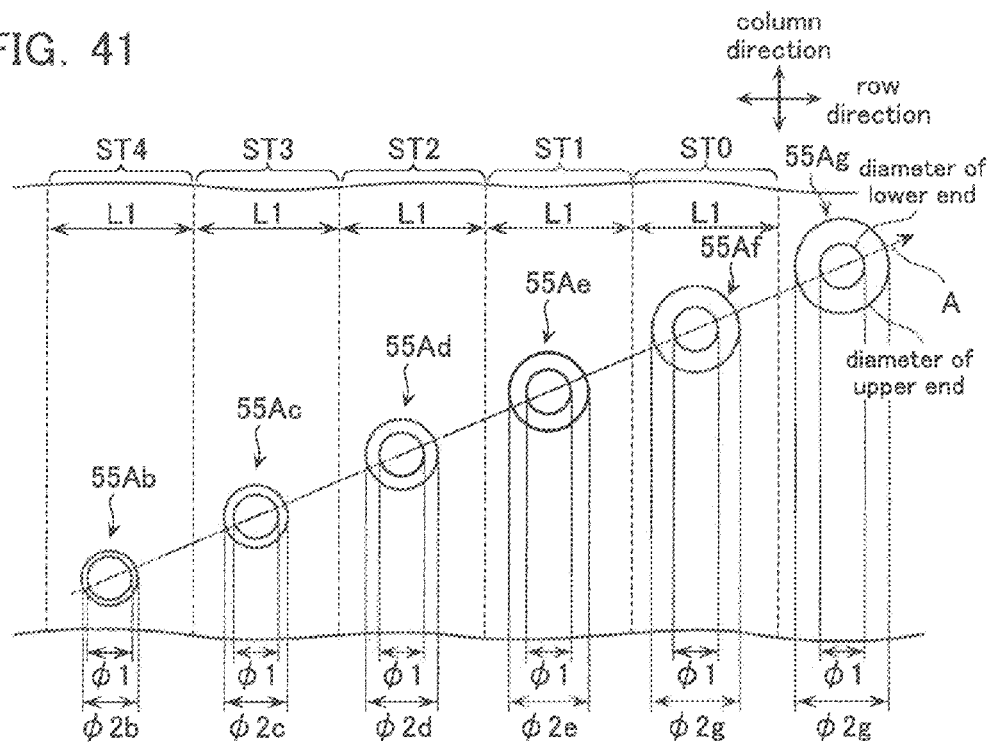
FIG. 41 is a top view showing second contact plug layers 55Ab-55Ag in a nonvolatile semiconductor memory device in accordance with a fifth embodiment.

Next, a configuration of a nonvolatile semiconductor memory device in accordance with a fifth embodiment is described with reference to FIG. 41. FIG. 41 is a top view showing second contact plug layers 55Ab-55Ag in the nonvolatile semiconductor memory device in accordance with the fifth embodiment. Note that in the fifth embodiment, identical symbols are assigned to configurations similar to those in the first through fourth embodiments and descriptions thereof are omitted.

The nonvolatile semiconductor memory device in accordance with the fifth embodiment includes the second contact plug layers 55Ab-55Ag which differ from those of the first and second embodiments, as shown in FIG. 41. The second contact plug layers 55Ab-55Ag are disposed such that an upper end thereof is arranged in a line along a direction (arrow A) different to the row direction, as viewed from a planar direction.

(Advantages of the Nonvolatile Semiconductor Memory Device in Accordance with the Fifth Embodiment)

The nonvolatile semiconductor memory device in accordance with the fifth embodiment displays similar advantages to the first embodiment. In addition, the nonvolatile semiconductor memory device in accordance with the fifth embodiment includes the second contact plug layers 55Ab-55Ag arranged in a line in a direction at a certain angle to the row direction. Thus, in the nonvolatile semiconductor memory device in accordance with the fifth embodiment, the second contact plug layers 55Ab-55Ag can be disposed with a sufficient spacing therebetween, compared with the first embodiment. Accordingly, it is possible to curb a short circuit that may occur between the second contact plug layers and to improve the lithography resolution in the nonvolatile semiconductor memory device in accordance with the fifth embodiment. The nonvolatile semiconductor memory device in accordance with the fifth embodiment can thus be made more reliable than the first embodiment.

Sixth Embodiment (Configuration of a Nonvolatile Semiconductor Memory Device in Accordance with a Sixth Embodiment)

Figure 42:
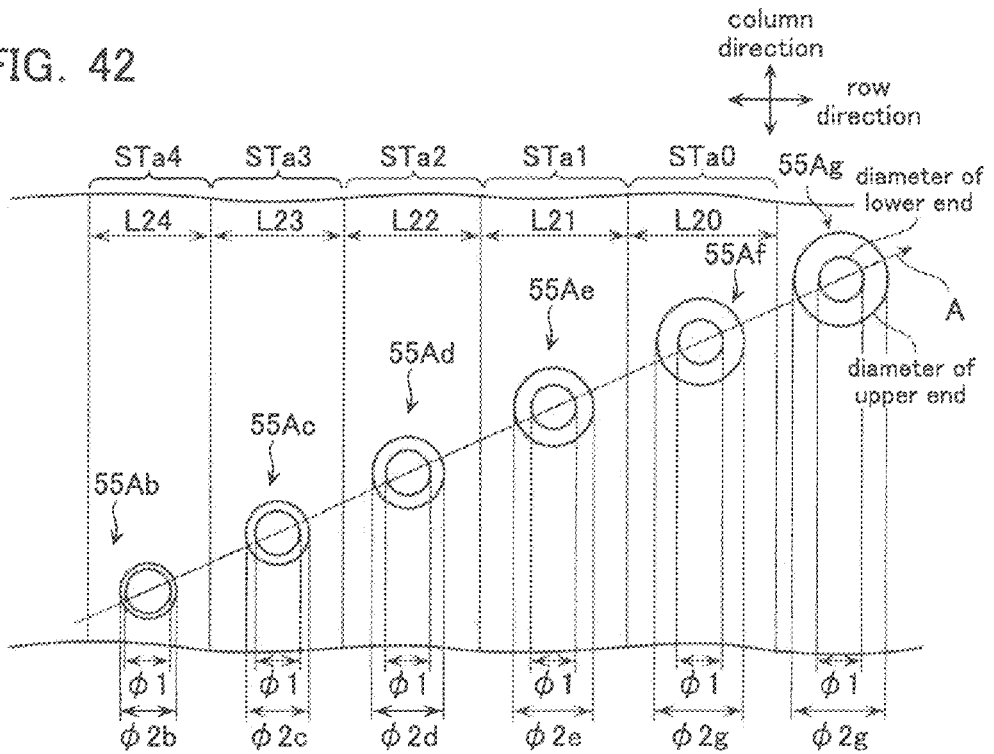
FIG. 42 is a top view showing the second contact plug layers 55Ab-55Ag in a nonvolatile semiconductor memory device in accordance with a sixth embodiment.

Next, a configuration of a nonvolatile semiconductor memory device in accordance with a sixth embodiment is described with reference to FIG. 42. FIG. 42 is a top view showing the second contact plug layers 55Ab-55Ag in the nonvolatile semiconductor memory device in accordance with the sixth embodiment. Note that in the sixth embodiment, identical symbols are assigned to configurations similar to those in the first through fifth embodiments and descriptions thereof are omitted.

The nonvolatile semiconductor memory device in accordance with the sixth embodiment includes the steps STa0-STa4 similar to those of the fourth embodiment, as shown in FIG. 42. The nonvolatile semiconductor memory device in accordance with the sixth embodiment differs from the fifth embodiment in this point. Note that other configurations of the sixth embodiment are similar to the fifth embodiment.

(Advantages of the Nonvolatile Semiconductor Memory Device in Accordance with the Sixth Embodiment)

The nonvolatile semiconductor memory device in accordance with the sixth embodiment includes similar features to the fifth embodiment, and displays similar advantages to the fifth embodiment. In addition, the nonvolatile semiconductor memory device in accordance with the sixth embodiment includes the steps STa0-STa4, whereby an occupied area can be reduced and a contact of the second contact plug layers 55Ab-55Ag can be curbed, similarly to the fourth embodiment.

Seventh Embodiment (Configuration of a Nonvolatile Semiconductor Memory Device in Accordance with a Seventh Embodiment)

Figure 43:
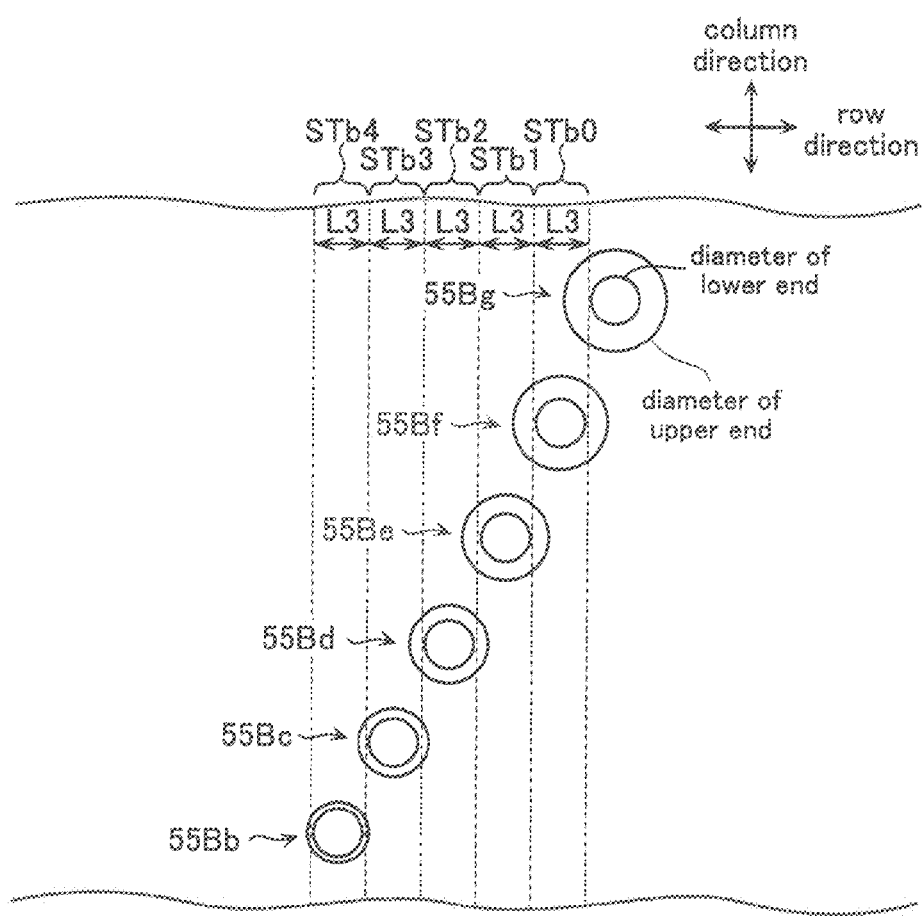
FIG. 43 is a top view showing second contact plug layers 55Bb-55Bg in a nonvolatile semiconductor memory device in accordance with a seventh embodiment.
Figure 44:
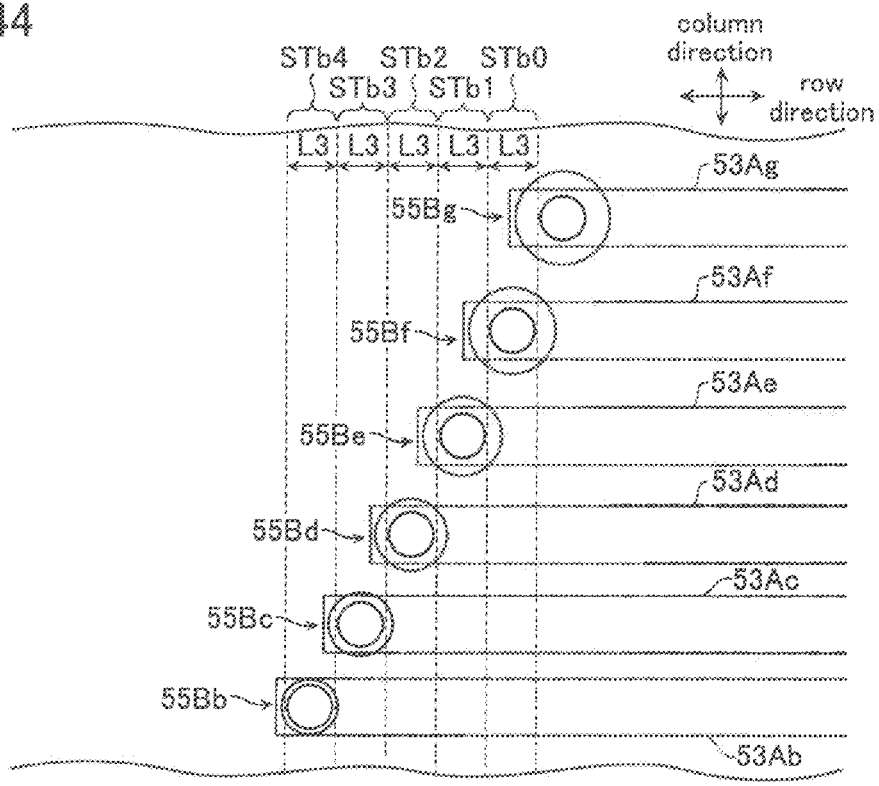
FIG. 44 is a top view showing second wiring layers 53Ab-53Ag in the nonvolatile semiconductor memory device in accordance with the seventh embodiment.

Next, a configuration of a nonvolatile semiconductor memory device in accordance with a seventh embodiment is described with reference to FIGS. 43 and 44. FIG. 43 is a top view showing second contact plug layers 55Bb-55Bg in the nonvolatile semiconductor memory device in accordance with the seventh embodiment. FIG. 44 is a top view showing second wiring layers 53Ab-53Ag in the nonvolatile semiconductor memory device in accordance with the seventh embodiment. Note that in the seventh embodiment, identical symbols are assigned to configurations similar to those in the first through sixth embodiments and descriptions thereof are omitted.

The nonvolatile semiconductor memory device in accordance with the seventh embodiment includes steps STb0-STb4 and the second contact plug layers 55Bb-55Bg which differ from those of the first through fifth embodiments, as shown in FIG. 43. The second contact plug layers 55Bb-55Bg are disposed so as to be arranged in a line in a direction at a certain angle to the row direction, similarly to the fifth and sixth embodiments. A lower end of the second contact plug layers 55Bb-55Bg is provided in the steps STb0-STb4. At the same time, an upper end of the second contact plug layers 55Bb-55Bg is formed so as to protrude in the row direction from a region directly above where the steps STb0-STb4 are provided.

In addition, the nonvolatile semiconductor memory device in accordance with the seventh embodiment includes the second wiring layers 53Ab-53Ag which differ from those of the first through sixth embodiments, as shown in FIG. 44. The second wiring layers 53Ab-53Ag are formed in stripes extending in the row direction and having a certain pitch in the column direction.

(Advantages of the Nonvolatile Semiconductor Memory Device in Accordance with the Seventh Embodiment)

The nonvolatile semiconductor memory device in accordance with the seventh embodiment displays similar advantages to the nonvolatile semiconductor memory device in accordance with the fifth and sixth embodiments. In addition, in the nonvolatile semiconductor memory device in accordance with the seventh embodiment, the upper end of the second contact plug layers 55Bb-55Bg is formed so as to protrude from the region directly above where the steps STb0-STb4 are provided. Thus, in the nonvolatile semiconductor memory device in accordance with the seventh embodiment, the second contact plug layers 55Bb-55Bg can be disposed with a more compacted spacing in the row direction than in the fifth and sixth embodiments, thereby reducing an occupied area.

Eighth Embodiment (Configuration of a Nonvolatile Semiconductor Memory Device in Accordance with an Eighth Embodiment)

Figure 45:
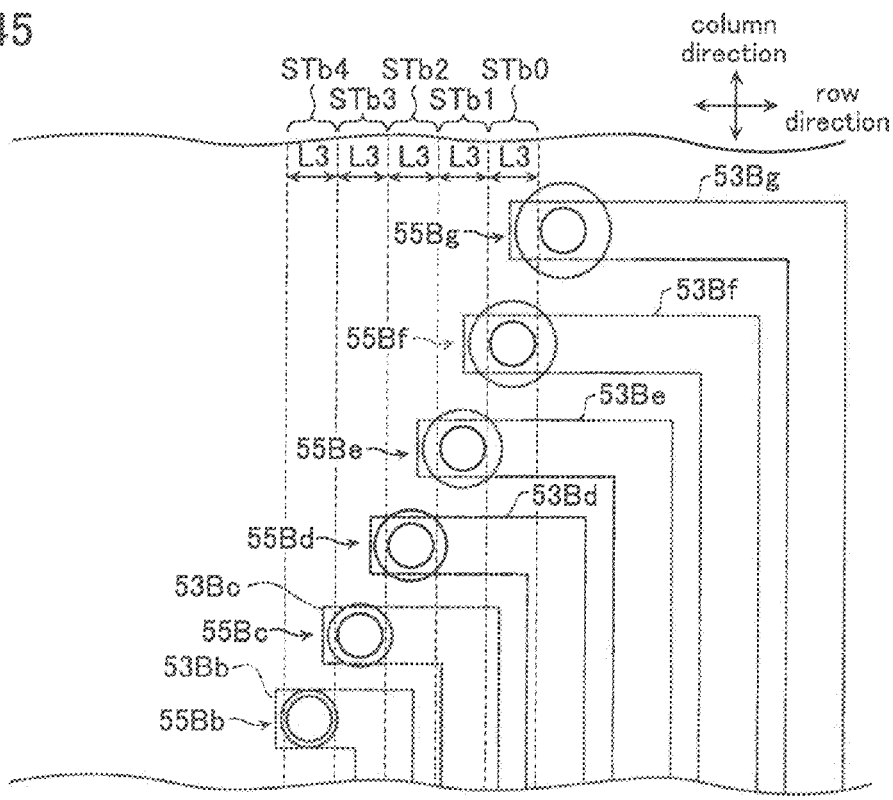
FIG. 45 is a top view showing second wiring layers 53Bb-53Bg in a nonvolatile semiconductor memory device in accordance with an eighth embodiment.

Next, a configuration of a nonvolatile semiconductor memory device in accordance with an eighth embodiment is described with reference to FIG. 45. FIG. 45 is a top view showing second wiring layers 53Bb-53Bg in the nonvolatile semiconductor memory device in accordance with the eighth embodiment. Note that in the eighth embodiment, identical symbols are assigned to configurations similar to those in the first through seventh embodiments and descriptions thereof are omitted.

The nonvolatile semiconductor memory device in accordance with the eighth embodiment includes the second wiring layers 53Bb-53Bg which differ from those of the seventh embodiment. The eighth embodiment differs from the seventh embodiment in this point, but is similar to the seventh embodiment regarding other configurations.

The second wiring layers 53Bb-53Bg are formed in an L-shape as viewed from above, as shown in FIG. 45. That is, the second wiring layers 53Bb-53Bg are formed so as to extend from a leading end in contact with the second wiring layers 53Bb-53Bg to a certain position in the row direction, and so as to extend from the certain position in the column direction.

(Advantages of the Nonvolatile Semiconductor Memory Device in Accordance with the Eighth Embodiment)

The nonvolatile semiconductor memory device in accordance with the eighth embodiment includes similar features to the seventh embodiment, and displays similar advantages to the seventh embodiment.

Ninth Embodiment (Configuration of a Nonvolatile Semiconductor Memory Device in Accordance with a Ninth Embodiment)

Figure 46:
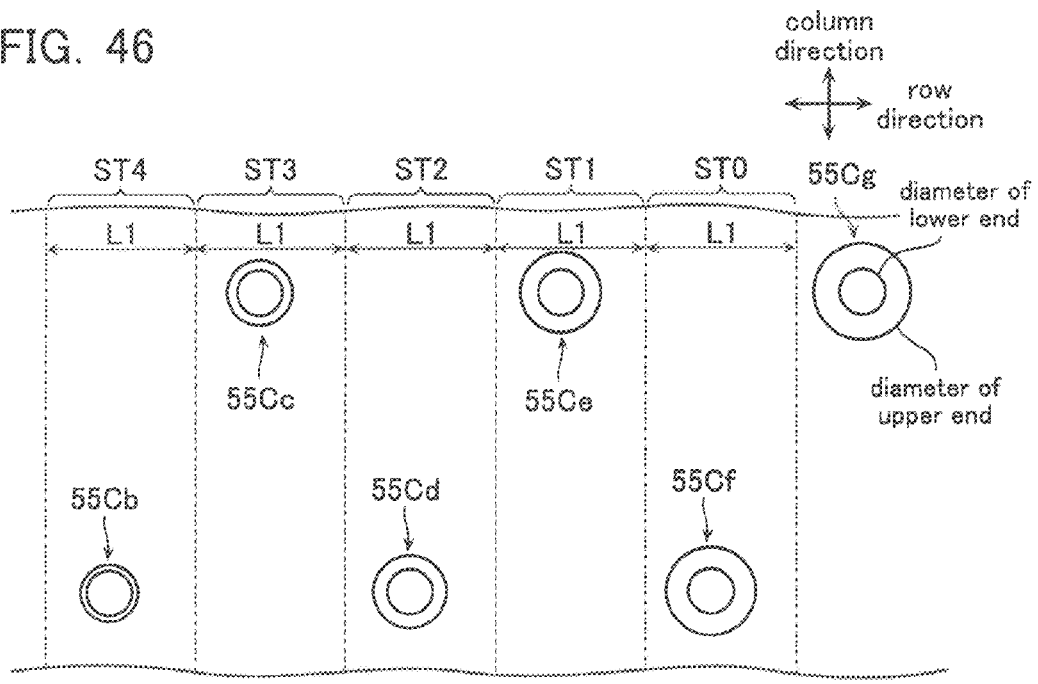
FIG. 46 is a top view showing second contact plug layers 55Cb-55Cg in a nonvolatile semiconductor memory device in accordance with a ninth embodiment.

Next, a configuration of a nonvolatile semiconductor memory device in accordance with a ninth embodiment is described with reference to FIG. 46. FIG. 46 is a top view showing second contact plug layers 55Cb-55Cg in the nonvolatile semiconductor memory device in accordance with the ninth embodiment. Note that in the ninth embodiment, identical symbols are assigned to configurations similar to those in the first through eighth embodiments and descriptions thereof are omitted.

The nonvolatile semiconductor memory device in accordance with the ninth embodiment includes the second contact plug layers 55Cb-55Cg which differ from those of the first through eighth embodiments, as shown in FIG. 46. The second contact plug layers 55Cb-55Cg are disposed in a zigzag shape centered on the row direction.

(Advantages of the Nonvolatile Semiconductor Memory Device in Accordance with the Ninth Embodiment)

The nonvolatile semiconductor memory device in accordance with the ninth embodiment displays similar advantages to the fifth and sixth embodiments.

Tenth Embodiment (Configuration of a Nonvolatile Semiconductor Memory Device in Accordance with a Tenth Embodiment)

Figure 47:
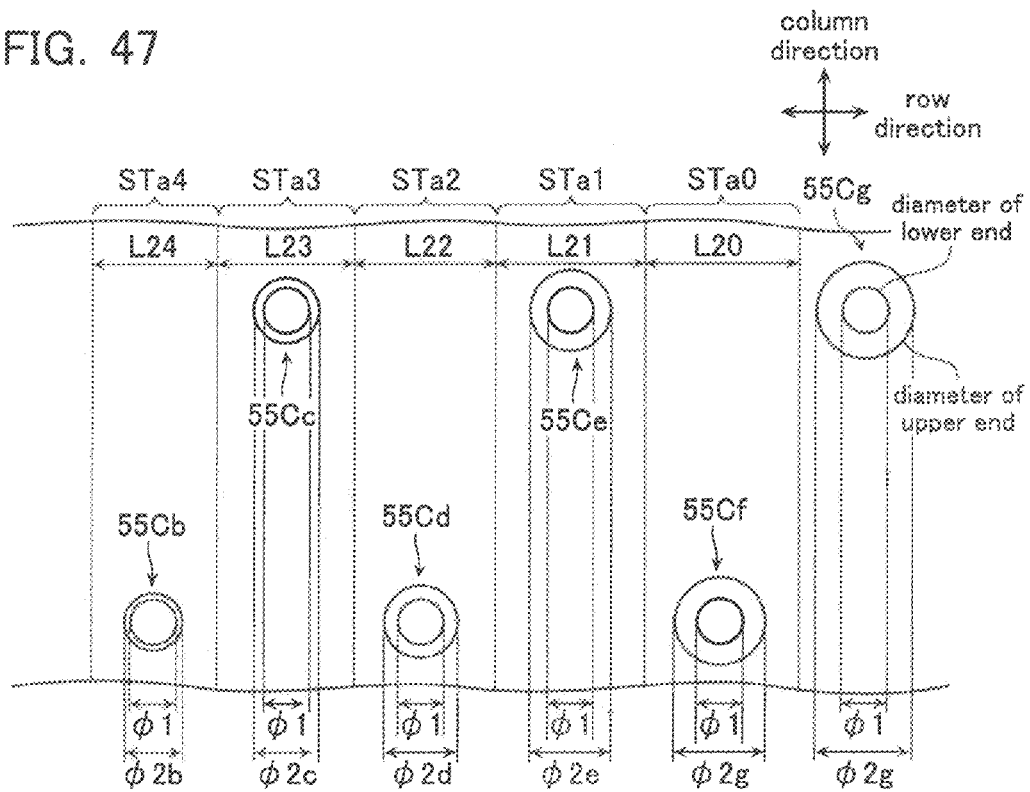
FIG. 47 is a top view showing the second contact plug layers 55Cb-55Cg in a nonvolatile semiconductor memory device in accordance with a tenth embodiment.

Next, a configuration of a nonvolatile semiconductor memory device in accordance with a tenth embodiment is described with reference to FIG. 47. FIG. 47 is a top view showing the second contact plug layers 55Cb-55Cg in the nonvolatile semiconductor memory device in accordance with the tenth embodiment. Note that in the tenth embodiment, identical symbols are assigned to configurations similar to those in the first through ninth embodiments and descriptions thereof are omitted.

The nonvolatile semiconductor memory device in accordance with the tenth embodiment includes the steps STa0-STa4 similar to those of the fourth embodiment, as shown in FIG. 47. The nonvolatile semiconductor memory device in accordance with the tenth embodiment differs from the ninth embodiment in this point. Note that other configurations of the tenth embodiment are similar to the ninth embodiment.

(Advantages of the Nonvolatile Semiconductor Memory Device in Accordance with the Tenth Embodiment)

The nonvolatile semiconductor memory device in accordance with the tenth embodiment includes similar features to the ninth embodiment, and displays similar advantages to the ninth embodiment. In addition, the nonvolatile semiconductor memory device in accordance with the tenth embodiment includes the steps STa0-STa4, whereby an occupied area can be reduced and a contact of the second contact plug layers 55Cb-55Cg can be curbed, similarly to the fourth embodiment.

Other Embodiments

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention. For example, the memory columnar semiconductor layer 37 is not limited to the column shape, and may be U-shaped. A U-shaped memory columnar semiconductor layer 37 includes a pair of columnar portions and a joining portion configured to join a lower end of the columnar portions.

What is claimed is:

1. A method of manufacturing a nonvolatile semiconductor memory device, the nonvolatile semiconductor memory device including a plurality of memory strings each having a plurality of electrically rewritable memory cells connected in series, comprising:
    depositing a plurality of first conductive layers on a substrate;
    penetrating the plurality of first conductive layers to form a penetration hole;
    forming a charge storage layer on a side surface of the penetration hole;
    forming a semiconductor layer so as to fill the penetration hole;
    forming a stepped portion formed in a stepped shape in the plurality of first conductive layers such that positions of ends of the plurality of first conductive layers differ from one another; and
    forming a plurality of second conductive layers extending upwardly from an upper surface of the first conductive layers configuring the stepped portion,
    the plurality of second conductive layers being formed such that upper ends thereof are aligned with a surface parallel to the substrate, and such that a diameter thereof decreases from the upper end thereof to a lower end thereof, and being formed such that the greater a length thereof in the perpendicular direction, the larger a diameter of the upper end thereof.

2. The method of manufacturing a nonvolatile semiconductor memory device according to claim 1,
    wherein steps configuring the stepped portion includes a first step positioned at a first position and a second step positioned at a second position in a higher layer than the first position, the first step having a larger width than that of the second step.

3. The method of manufacturing a nonvolatile semiconductor memory device according to claim 1, wherein sides of steps configuring the stepped portion face a first direction parallel to the substrate, and the plurality of second conductive layers are arranged along a second direction parallel to the substrate.

4. The method of manufacturing a nonvolatile semiconductor memory device according to claim 1,
wherein sides of steps configuring the stepped portion face a first direction parallel to the substrate, and the plurality of second conductive layers are disposed in a zigzag shape centered on the first direction.

5. The method of manufacturing a nonvolatile semiconductor memory device according to claim 1,
wherein a ratio of a height of the second conductive layer and a diameter of a lower end of the second conductive layer is constant among the plurality of second conductive layers.

6. The method of manufacturing a nonvolatile semiconductor memory device according to claim 1,
wherein a lower end of the second conductive layer is formed so as to be in contact with a step included the stepped portion, and
an upper end of the second conductive layer is formed so as to protrude from the step with which the lower end is in contact, with regard to a direction parallel to the substrate.

7. The method of manufacturing a nonvolatile semiconductor memory device according to claim 1, further comprising:
forming a plurality of third conductive layers respectively in contact with the upper end of the plurality of second conductive layers,
wherein the plurality of third conductive layers are formed continuously in an integrated manner with the second conductive layer and extending in a direction parallel to the substrate.

* * * * *